United States Patent [19]
Ema et al.

[11] Patent Number: 5,594,267
[45] Date of Patent: Jan. 14, 1997

[54] SEMICONDUCTOR MEMORY DEVICE HAVING THIN FILM TRANSISTOR AND METHOD OF PRODUCING THE SAME

[75] Inventors: Taiji Ema; Kazuo Itabashi, both of Kawasaki, Japan

[73] Assignee: Fujitsu Limited, Kawasaki, Japan

[21] Appl. No.: 178,355

[22] Filed: Jan. 4, 1994

Related U.S. Application Data

[63] Continuation of Ser. No. 857,643, Mar. 24, 1992, abandoned.

[30] Foreign Application Priority Data

Mar. 27, 1991 [JP] Japan .................................. 3-085916
Jun. 18, 1991 [JP] Japan .................................. 3-145940

[51] Int. Cl.$^6$ .......................... H01L 29/76; H01L 29/94; H01L 31/062; H01L 31/113
[52] U.S. Cl. ............................................. 257/368; 257/377
[58] Field of Search .......................... 357/23.7; 257/303, 257/368, 377

[56] References Cited

U.S. PATENT DOCUMENTS

| | | | |
|---|---|---|---|
| 4,679,171 | 7/1987 | Logwood et al. | 365/154 |
| 4,764,801 | 8/1988 | McLaughlin et al. | 357/59 |
| 4,853,894 | 8/1989 | Yamanaka et al. | 365/154 |
| 4,931,410 | 6/1990 | Tokunaga et al. | 437/189 |

FOREIGN PATENT DOCUMENTS

| | | | |
|---|---|---|---|
| 0365690 | 5/1990 | European Pat. Off. | |
| 60-178646 | 9/1985 | Japan | 257/630 |
| 60-224246 | 11/1985 | Japan | 257/630 |
| 62-169472 | 7/1987 | Japan | |
| 1-144655 | 6/1989 | Japan | 357/23.7 |
| 1-144673 | 6/1989 | Japan | 357/23.7 |

OTHER PUBLICATIONS

Sze et al, *Semiconductor Devices, Physics& Tech.*, pp. 341—362, 1985.
Chen et al, 'A New Device for Interconnect Scheme . . . ', IEPM–84, pp. 118–120.
Yamanaka et al., "A 25 µm$^2$ New Poly–Si PMOS Load (PPL) SRAM Cell Having Excellent Soft Error Immunity", *International Electron Devices Meeting*, Dec. 1988, San Francisco, CA, pp. 48–51.
Ando et al., "A 0.1–µA Standby Current, Ground–Bounce –Immune 1–Mbit CMOS SRAM", *IEEE Journal of Solid –State Circuits*, vol. 24, No. 6, Dec. 1989, New York, NY, pp. 1708–1713.
Ishibashi et al., "An α–Immune, 2–V Supply Voltage SRAM Using a Polysilicon PMOS Load Cell", *IEEE Journal of Solid–State Circuits*, vol. 25, No. 1, Feb. 1990, New York, NY, pp. 55–60.
Adan et al., "A Half–Micron SRAM Cell Using a Double –Gated Self–Aligned Polysilicon PMOS Thin Film Transistor (TFT) Load", *Symposium on VLSI Technology*, Jun. 1990, Honolulu, Japan, pp. 19–20.

*Primary Examiner*—Stephen Meier

[57] ABSTRACT

A semiconductor memory device includes a semiconductor substrate, and a memory cell formed on the semiconductor substrate and including two transfer transistors, two driver transistors and two thin film transistor loads. The thin film transistor load includes a first gate electrode, a first insulator layer formed on the first gate electrode, a semiconductor layer formed on the first insulator layer, a second insulator layer formed on the semiconductor layer, and a shield electrode formed on the second insulator layer. This shield electrode shields the thin film transistor.

10 Claims, 42 Drawing Sheets

BL    /BL tion is a continuation, of application Ser. No. 07/857,643, filed Mar. 24, 1992, now abandoned.

SEMICONDUCTOR MEMORY DEVICE HAVING THIN FILM TRANSISTOR AND METHOD OF PRODUCING THE SAME

This application is a continuation, of application Ser. No. 07/857,643, filed Mar. 24, 1992, now abandoned.

BACKGROUND OF THE INVENTION

The present invention generally relates to semiconductor memory devices and methods of producing the same, and more particularly to a thin film transistor (TFT) load type static random access memory (SRAM) and a method of producing such a TFT load type SRAM.

Up to now, the high resistance load type SRAM was popularly used. However, as the integration density improves and the number of memory cells increases, the current consumption increases and various problems are generated. In order to avoid such problems and the help of the progress in the semiconductor technology, the SRAM having the TFT load has been realized. However, new problems are generated due to the use of the TFT load, and it is necessary to eliminate these new problems.

An example of a conventional method of producing the high resistance load type SRAM will be described with reference to FIGS. 1A through 1J and FIGS. 2A through 2F. FIGS. 1A through 1J are side views in cross section showing essential parts of the high resistance load type SRAM at essential stages of the conventional method of producing the high resistance load type SRAM. FIGS. 2A through 2F are plan views of the high resistance load type SRAM at essential stages of the conventional method of producing the high resistance load type SRAM. FIGS. 1A through 1J respectively are cross sections taken along a line which corresponds to a line Y—Y in the plan view of FIG. 2F.

In FIG. 1A, a silicon dioxide ($SiO_2$) layer is used as a pad layer, for example, and a silicon nitride ($Si_3N_4$) layer which is formed on the $SiO_2$ layer is used as an oxidation resistant mask layer when carrying out a selective thermal oxidation (for example, a local oxidation of silicon (LOCOS)) so as to form a field insulator layer 2 on a silicon (Si) semiconductor substrate 1. This field insulator layer 2 is made of $SiO_2$ and has a thickness of 4000 Å, for example.

Then, the $Si_3N_4$ layer and the $SiO_2$ layer which are used when carrying out the selective thermal oxidation are removed to expose an active region of the Si semiconductor substrate 1.

In FIG. 1B, a thermal oxidation is carried out to form a gate insulator layer 3 which is made of $SiO_2$ and has a thickness of 100 Å, for example.

By carrying out a resist process of the photolithography technique and a wet etching using hydrofluoric acid as the etchant, the gate insulator layer 3 is selectively etched to form a contact hole 3A.

In FIGS. 1C and 2A, a chemical vapor deposition (CVD) is carried out to form a first polysilicon layer having a thickness of 1500 Å, for example.

Then, a vapor phase diffusion is carried out to introduce phosphorus (P) of $1\times10^{20}$ $cm^{-3}$, for example, so as to form an $n^+$-type impurity region 5'.

In FIG. 2A, the illustration of the first polysilicon layer is omitted for the sake of convenience.

In FIG. 1D, a resist process of the photolithography technique and a reactive ion etching (RIE) using $CCl_4/O_2$ as the etching gas are carried out to pattern the first polysilicon layer and form a gate electrode 4. The gate electrode 4 becomes the gate electrode of a word line and a driver transistor.

An ion implantation is carried out to inject As ions with a dosage of $3\times10^{15}$ $cm^{-2}$ and an acceleration energy of 40 keV, so as to form a source region 5 and a drain region 6.

In FIGS. 1E and 2B, a CVD is carried out to form an insulator layer 7 which is made of $SiO_2$ and has a thickness of 1000 Å, for example.

By carrying out a resist process of the photolithography technique and a RIE using $CHF_3$/He as the etching gas, a ground line contact hole 7A is formed. This ground line contact hole 7A cannot be seen in FIG. 1E.

In FIG. 1F, a CVD is carried out to form a second polysilicon layer having a thickness of 1500 Å, for example.

Then, an ion implantation is carried out to inject P ions into the second polysilicon layer with a dosage of $4\times10^{15}$ $cm^{-2}$ and an acceleration energy of 30 keV, and an annealing is carried out to reduce the resistance.

A resist process of the photolithography technique and a RIE using $CCl_4/O_2$ as the etching gas are carried out to pattern the second polysilicon layer and form a ground line 8.

In FIGS. 1G and 2C, a CVD is carried out to form an insulator layer 9 which is made of $SiO_2$ and has a thickness of 1000 Å, for example.

A resist process of the photolithography technique and a RIE using $CHF_3$/He as the etching gas are carried out to selectively etch the insulator layers 9 and 7 and form a load resistor contact hole 9A.

In FIG. 1H, a CVD is carried out to form a third polysilicon layer having a thickness of 1500 Å, for example.

A resist process of the photolithography technique and an ion implantation with a dosage of $1\times10^{15}$ $cm^{-2}$ and an acceleration energy of 30 keV are carried out to inject As ions into a part where a supply line of a positive power source voltage Vcc is formed and a part where the high resistance load makes contact with the gate electrode 4.

By carrying out a resist process of the photolithography technique and a RIE using $CCl_4/O_2$ as the etching gas, the third polysilicon layer is patterned to form a contact part 10, a high resistance load 11 and a Vcc supply line 12.

In FIGS. 1I and 2D, a CVD is carried out to form an insulator layer which is made of $SiO_2$ and has a thickness of 1000 Å, for example, and an insulator layer which is made of phosphosilicate glass (PSG) and has a thickness of 5000 Å, for example. In FIG. 1I, these insulator layers are referred to as an insulator layer 13.

A thermal process is thereafter carried out to reflow and planarize the insulator layer 13.

Next, a resist process of the photolithography technique and a RIE using $CHF_3$/He as the etching gas are carried out to selectively etch the insulator layer 13 and the like and to form a bit line contact hole 13A.

In FIGS. 1J and 2E, a sputtering is carried out to form an aluminum (Al) layer having a thickness of 1 μm, for example. This Al layer is patterned using the normal photolithography technique so as to form a bit line 14. Those elements which are shown in FIGS. 1J and 2E but not yet described such as "BL" will be readily understood from the description given later in conjunction with FIG. 3.

FIG. 2F shows the plan view of the essential part of the high resistance load type SRAM which is completed by the above described processes. In FIG. 2F, those parts which are the same as those corresponding parts in FIGS. 1A through 1J and FIGS. 2A through 2E are designated by the same reference numerals. However, for the sake of convenience, the illustration of the Al bit line 14 shown in FIGS. 1J and 2E is omitted in FIG. 2F.

FIG. 3 shows an equivalent circuit diagram of the essential part of the high resistance load type SRAM described above in conjunction with FIGS. 1A through 1J and 2A through 2F.

FIG. 3 shows driver transistors Q1 and Q2, transfer gate transistors Q3 and Q4, high resistance loads R1 and R2, a word line WL, bit lines BL and/BL, nodes S1 and S2, the positive power source voltage Vcc, and a negative power source voltage Vss.

The operation of this high resistance load type SRAM, the storage operation in particular, is carried out as follows.

If it is assumed that the positive power source voltage Vcc is 5 V, the negative power source voltage Vss is 0 V, the node S1 is 5 V and the node S2 is 0 V, the transistor Q2 is ON and the transistor Q1 is OFF. The potential at the node S1 is maintained to 5 V if the transistor Q1 is OFF and the resistance is sufficiently high compared to the high resistance load R1. The potential at the node S2 is maintained to 0 V if the transistor Q2 is ON and the resistance is sufficiently low compared to the high resistance load R2.

However, under the above described condition, a D.C. current flows from the positive power source voltage Vcc supply line to the negative power source voltage Vss supply line via the node S2, and the current value is inversely proportional to the value of the high resistance load R2.

When the integration density of the above described high resistance load type SRAM increases, the number of memory cells per chip increases and the current consumption of the entire chip would become very large if the current consumption per memory is not reduced. Hence, the D.C. current described above must be reduced, but in order to reduce this D.C. current, the values of the high resistance loads R1 and R2 must be set large. However, when the values of the high resistance loads R1 and R2 are set large, it becomes difficult to stably maintain the potential at the node having the driver transistor which is OFF, that is, the potential at the node S1 in FIG. 3.

Because of the above described background, the TFT load type SRAM which uses the TFT as the load in place of the high resistance load has been developed.

Next, a description will be given of the TFT load type SRAM. Similarly to the description given above in respect of the high resistance load type SRAM, a description will first be given of the method of producing the TFT load type SRAM.

An example of a conventional method of producing the TFT load type SRAM will be described with reference to FIGS. 4A through 4D and FIGS. 5A through 5D. FIGS. 4A through 4D are side views in cross section showing essential parts of the TFT load type SRAM at essential stages of the conventional method of producing the high resistance load type SRAM. FIGS. 5A through 5D are plan views of the TFT load type SRAM at essential stages of the conventional method of producing the TFT load type SRAM. FIGS. 4A through 4D respectively are cross sections taken along a line which corresponds to a line Y—Y in the plan view of FIG. 5D.

The processes of producing the TFT load type SRAM at the beginning are basically the same as the processes described in conjunction with FIGS. 1A through 1G up to the process of forming the load resistor contact hole 9A of the high resistance load type SRAM, and a description thereof will be omitted. The only difference is that a contact hole 8A shown in FIG. 5A is formed with respect to the ground line 8 which is made of the second polysilicon layer, so that a gate electrode of a TFT which is formed by a third polysilicon layer can make contact with an active region and the gate electrode 4 which is formed by the first polysilicon layer. Hence, a description will only be given from the processes thereafter. In FIGS. 4A through 4D and 5A through 5D, those parts which are the same as those corresponding parts in FIGS. 1A through 1J and 2A through 2F are designated by the same reference numerals.

In FIGS. 4A and 5A, a CVD is carried out to form a third polysilicon layer having a thickness of 1500 Å, for example.

Then, an ion implantation is carried out to inject P ions with a dosage of $4 \times 10^{15}$ cm$^{-2}$ and an acceleration energy of 30 keV.

Further, a resist process of the photolithography technique and a RIE using $CCl_4/O_2$ as the etching gas are carried out to pattern the third polysilicon layer and form a gate electrode 15 of the TFT.

In FIG. 4B, a CVD is carried out to form a gate insulator layer 16 of the TFT, which is made of $SiO_2$ and has a thickness of 300 Å, for example.

A resist process of the photolithography technique and a wet etching using hydrofluoric acid as the etchant are carried out to selectively etch the gate insulator layer 16 and form a drain contact hole 16A.

In FIGS. 4C and 5B, a CVD is carried out to form a fourth polysilicon layer having a thickness of 500 Å, for example. In addition, a resist process of the photolithography technique and an ion implantation are carried out to inject impurities into the fourth polysilicon layer to form a source and a drain of the TFT.

A resist process of the photolithography technique and a RIE using $CCl_4/O_2$ as the etching gas are carried out to pattern the fourth polysilicon layer and form a source region 17, a drain region 18 and a channel region 19 of the TFT and also form a Vcc supply line 20.

In FIGS. 4D and 5C, a CVD is carried out to form an insulator layer made of $SiO_2$ and having a thickness of 1000 Å, for example, and an insulator layer made of PSG and having a thickness of 5000 Å, for example. In FIG. 4D, these two insulator layers are shown as one insulator layer 21, similarly as in the case of FIGS. 1I and 1J.

Then, a thermal process is carried out to reflow and planarize the insulator layer 21.

Next, a resist process of the photolithography technique and a RIE using $CHF_3/He$ as the etching gas are carried out to selectively etch the insulator layer 21 and the like and to form a bit line contact hole.

A sputtering is carried out thereafter to form an Al layer having a thickness of 1 μm, for example, and this Al layer is patterned by the normal photolithography technique to form a bit line 22. Those elements which are shown in FIGS. 4D and 5C but not yet described, such as "BL" will be readily understood from the description given later in conjunction with FIG. 6.

FIG. 5D shows the plan view of the essential part of the TFT load type SRAM which is completed by the above described processes. In FIG. 5D, those parts which are the same as those corresponding parts in FIGS. 4A through 4D and FIGS. 5A through 5D are designated by the same reference numerals. However, for the sake of convenience, the illustration of the Al bit line 22 shown in FIGS. 4D and 5C is omitted in FIG. 5D.

FIG. 6 shows an equivalent circuit diagram of an essential part of the TFT load type SRAM described in conjunction with FIGS. 4A through 4D and 5A through 5D. In FIG. 6, those parts which are the same as those corresponding parts in FIGS. 4A through 4D and 5A through 5D are designated by the same reference numerals.

FIG. 6 shows transistors Q5 and Q6 which are load TFTs used in place of the high resistance loads R1 and R2 shown in FIG. 3.

Next, a description will be given of the operation of the TFT load type SRAM, and the storing operation in particular.

If it is assumed that the positive power source voltage Vcc is 5 V, the negative power source voltage Vss is 0 V, the node S1 is 5 V and the node S2 is 0 V, the transistor Q6 is OFF when the transistor Q2 is ON and the transistor Q5 is ON when the transistor Q1 is OFF. The potential at the node S1 is maintained to 5 V if the transistor Q1 is OFF and the resistance is sufficiently high compared to the transistor Q5 which is ON. The potential at the node S2 is maintained to 0 V if the transistor Q2 is ON and the resistance is sufficiently small compared to the transistor Q6 which is OFF.

Under the above described condition, the resistance of the load transistor Q5 or Q6 changes depending on the stored information, and thus, the problems of the high resistance load type SRAM is eliminated. That is, it is possible to carry out a stable information storage operation. The channels of the transistors Q5 and Q6, that is, the channels of the load TFTs, are made of polysilicon. The crystal state of the polysilicon which forms the channels is considerably poor compared to the single crystal, and a current easily leaks even when the transistor is OFF. Such a leak current increases the current consumption of the chip, and it is desirable to make the channel as small as possible.

On the other hand, as may be readily seen from FIG. 4D, the bit line 22 which is made of the Al layer is provided at the top layer of the TFT load type SRAM. In addition, the channel of the load TFT exists immediately under the bit line 22 via the insulator layer 21 which is made of PSG or the like.

But according to this construction, the bit line 22 which is made of the Al layer can be regarded as a gate electrode of a transistor, and the underlying insulator layer 21 can be regarded as a gate insulator layer of this transistor. In addition, the potential of the bit line 22 which is regarded as the gate electrode varies between 0 v (Vss) and 5 V (Vcc). As a result, the TFT which should be OFF, that is, the transistor Q6 becomes nearly ON, and the leak current increases and the parasitic effect becomes notable.

Accordingly, a double gate structure TFT load type SRAM was developed in order to eliminate the above described problems of the TFT load type SRAM.

According to the double gate structure TFT load type SRAM, the above described problems of the TFT load type SRAM are eliminated by interposing the third polysilicon layer of the TFT load type SRAM described in conjunction with FIGS. 4 through 6 between the fourth polysilicon layer and the bit line 22 which is made of Al. Particularly, a fifth polysilicon layer forming a second gate electrode which has the same pattern as the gate electrode 15 of the TFT is interposed between the Al bit line 22 and the fourth polysilicon layer which forms the source region 17, the drain region 18, the channel region 19, the Vcc supply line 20 and the like.

FIGS. 7A through 7C are side views in cross section showing essential parts of the double gate structure TFT load type SRAM at essential stages of the conventional method of producing the double gate structure TFT load type SRAM. The processes of producing the double gate structure TFT load type SRAM at the beginning are basically the same as the processes described in conjunction with FIGS. 4A through 4C up to the process of forming the source region 17, the drain region 18, the channel region 19 and the Vcc supply line 20 of the TFT load type SRAM, and a description thereof will be omitted. Hence, a description will only be given from the processes thereafter. In FIGS. 7A through 7C, those parts which are the same as those corresponding parts in FIGS. 1 through 6 are designated by the same reference numerals.

In FIG. 7A, a CVD is carried out to form an insulator layer 23 which is made of $SiO_2$ and has a thickness of 500 Å, for example.

A resist process of the photolithography technique and a RIE using $CHF_3$+He as the etching gas are carried out to selectively etch the insulator layer 23 and to form a contact hole 23A with respect to the drain electrode 18 of the TFT.

In FIG. 7B, a CVD is carried out to form a fifth polysilicon layer having a thickness of 1000 Å, for example.

Then, an ion implantation is carried out to inject P ions into the fifth polysilicon layer with a dosage of $4\times10^{15}$ $cm^{-2}$ for example A resist process of the photolithography technique and a RIE using $CCl_4/O_2$ as the etching gas are carried out to pattern the fifth polysilicon layer and to form a second gate electrode 24 of the TFT.

In FIG. 7C, a CVD is carried out to form an insulator layer which is made of $SiO_2$ and has a thickness of 1000 Å, for example, and an insulator layer which is made of PSG and has a thickness of 5000 Å, for example. As in the case shown in FIG. 4D, these two insulator layers are shown as one insulator layer 25 in FIG. 7C.

Thereafter, a thermal process is carried out to reflow and planarize the insulator layer 25.

Next, a resist process of the photolithography technique and a RIE using $CHF_3$/He as the etching gas are carried out to selectively etch the insulator layer 25 and the like, and to form a bit line contact hole.

In addition, a sputtering is carried out to form an Al layer having a thickness of 1 µm, for example, and this Al layer is patterned by the normal photolithography technique so as to form a bit line 26.

As described heretofore, the SRAM started from the high resistance load type, evolved to the TFT load type, and further evolved to the double gate structure TFT load type. However, as may be seen by comparing FIGS. 1A through 1J with FIGS. 7A through 7C, and FIGS. 1J and 7C in particular, the number of polysilicon layers has increased by two from the high resistance load type SRAM to the double gate structure TFT load type SRAM, and the number of mask processes have increased by four.

Therefore, the parasitic effect is generated in the case of the TFT load type SRAM, and there are problems in that the bit line voltage or the like causes the TFT load which should be OFF to assume a state near the ON state and the leak current increases, as described above. But although the double gate structure TFT load type SRAM was developed to suppress the problems of the TFT load type SRAM, problems are introduced from the production point of view in that the number of mask processes increases, as described above.

SUMMARY OF THE INVENTION

Accordingly, it is a general object of the present invention to provide a novel and useful thin film transistor (TFT) load type static random access memory (SRAM) in which the problems described above are eliminated.

Another and more specific object of the present invention is to provide a semiconductor memory device comprising a semiconductor substrate, and a memory cell formed on the semiconductor substrate and including two transfer transistors, two driver transistors and two thin film transistor loads, where the thin film transistor load includes a first gate electrode, a first insulator layer formed on the first gate electrode, a semiconductor layer formed on the first insulator layer, a second insulator layer formed on the semiconductor layer, and a shield electrode formed on the second insulator layer, and the shield electrode shields the thin film transistor. According to the semiconductor memory device of the present invention, the thin film transistor load is covered by the shield electrode, and it is possible to prevent unstable operation caused by the potential at a conductive part within the memory cell.

Still another object of the present invention is to provide a method of producing a semiconductor memory device which includes a memory cell having two transfer transistors, two driver transistors and two thin film transistor loads, comprising the steps of (a) forming a gate insulator layer after forming a field insulator layer on a surface of a semiconductor substrate, (b) forming a first conductor layer on the semiconductor substrate and patterning the first conductor layer to form a gate electrode of the driver transistor, (c) forming a first insulator layer after forming impurity regions in the semiconductor substrate by introducing impurities into the semiconductor substrate using the field insulator layer and the gate electrode of the driver transistor as masks, (d) forming a second conductor layer and patterning the second conductor layer to form a gate electrode of the thin film transistor load, (e) forming a second insulator layer which forms a gate insulator layer, (f) forming a third conductor layer which is made of a semiconductor and forming source, drain and channel regions of the thin film transistor load in the third conductor layer by selectively introducing impurities into the third conductor layer and patterning the third conductor layer, (g) forming a third insulator layer which covers the third conductor layer, and (h) forming a fourth conductor layer on the third insulator layer and patterning the fourth conductor layer to form a shield electrode of the thin film transistor load. According to the method of the present invention, it is possible to produce the semiconductor memory device using a small number of mask processes.

Other objects and further features of the present invention will be apparent from the following detailed description when read in conjunction with the accompanying drawings.

DESCRIPTION OF THE PREFERRED EMBODIMENTS

Figure 8A:
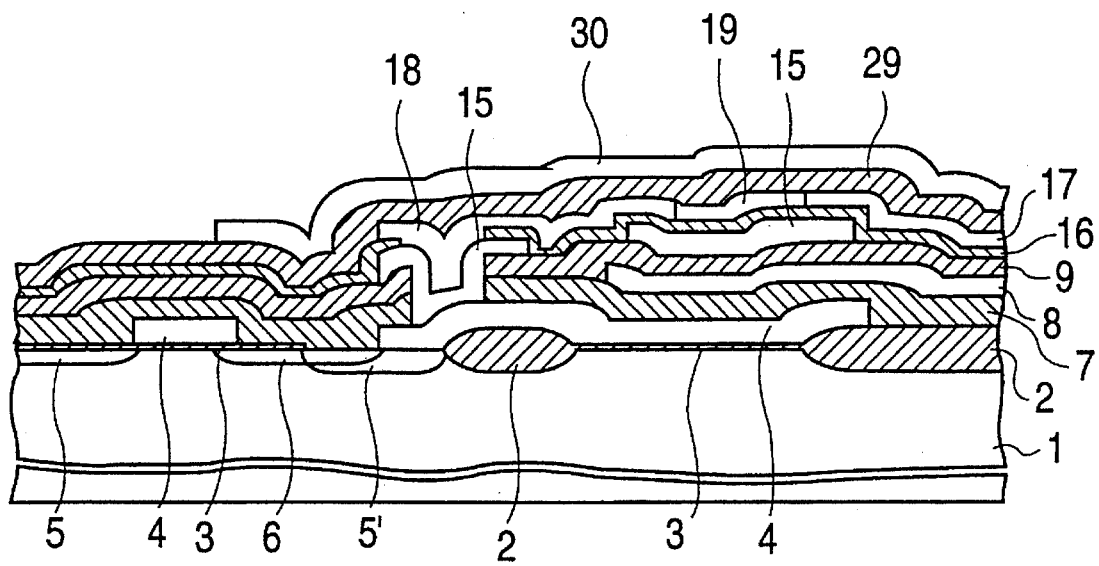
FIGS. 8A and 8B are side views in cross section showing an essential part of a first embodiment of a semiconductor memory device according to the present invention at essential stages of a first embodiment of a method of producing the semiconductor memory device according to the present invention.
Figure 8B:
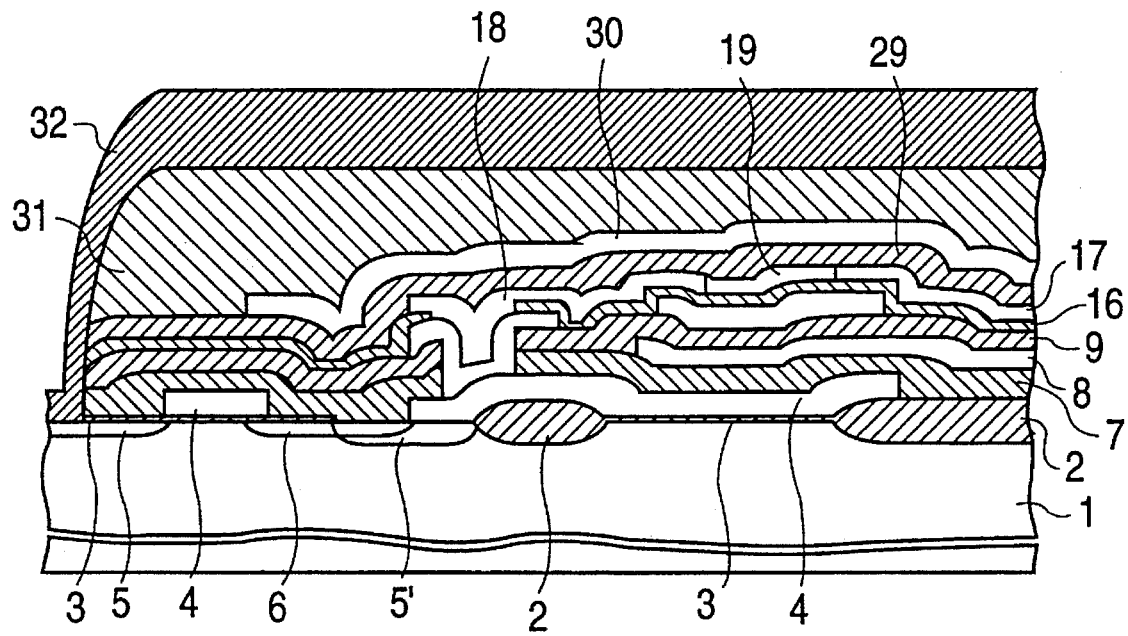

First, a description will be given of a first embodiment of a semiconductor memory device according to the present invention which is produced by a first embodiment of a method of producing the semiconductor memory device according to the present invention. FIGS. 8A and 8B are side views in cross section showing an essential part of the first embodiment of the semiconductor memory device according to the present invention at essential stages of the first embodiment of the method of producing the semiconductor memory device according to the present invention. In FIGS. 8A and 8B, those parts which are the same as those corresponding parts in FIGS. 4A through 4D are designated by the same reference numerals.

Figure 5A:
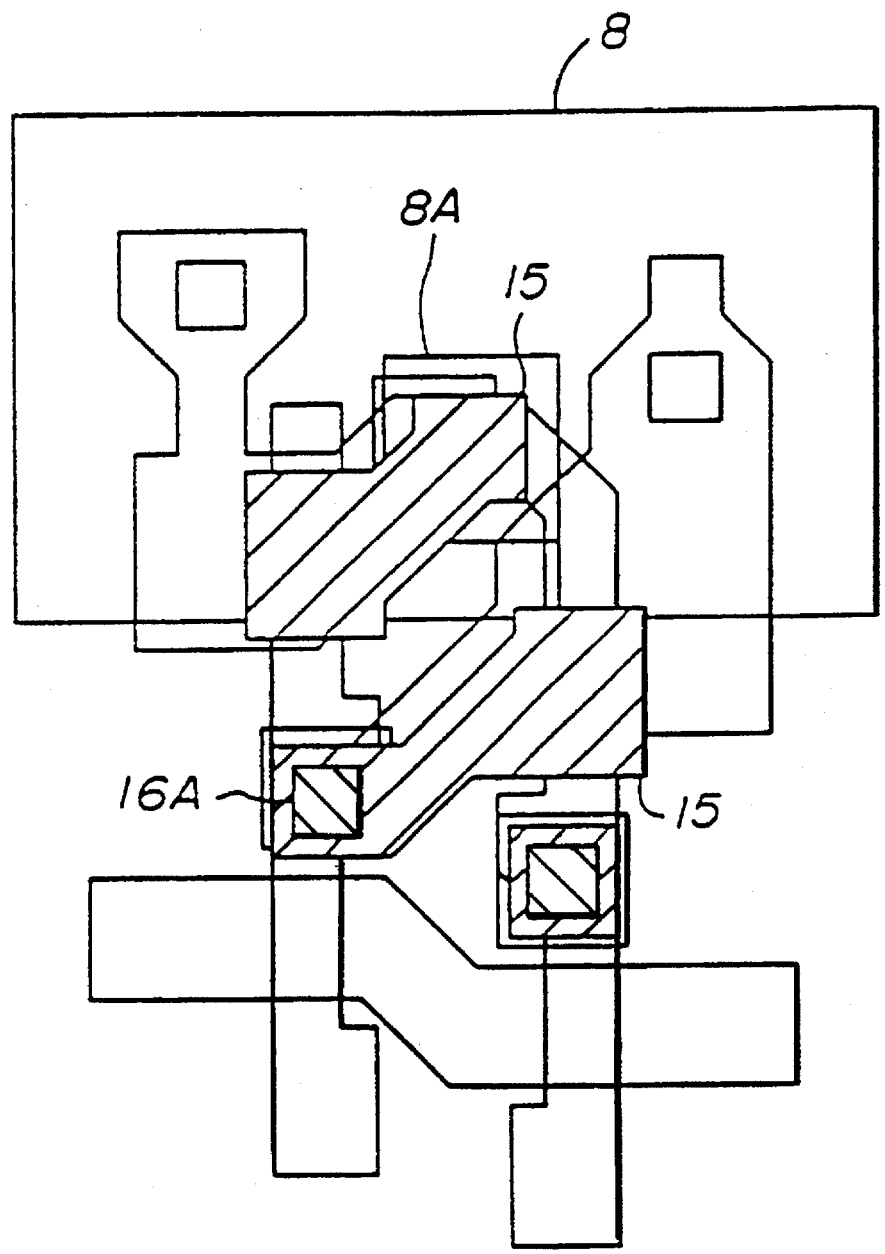
FIGS. 5A through 5D are plan views of the TFT load type SRAM at essential stages of the conventional method of producing the TFT load type SRAM.
Figure 5B:
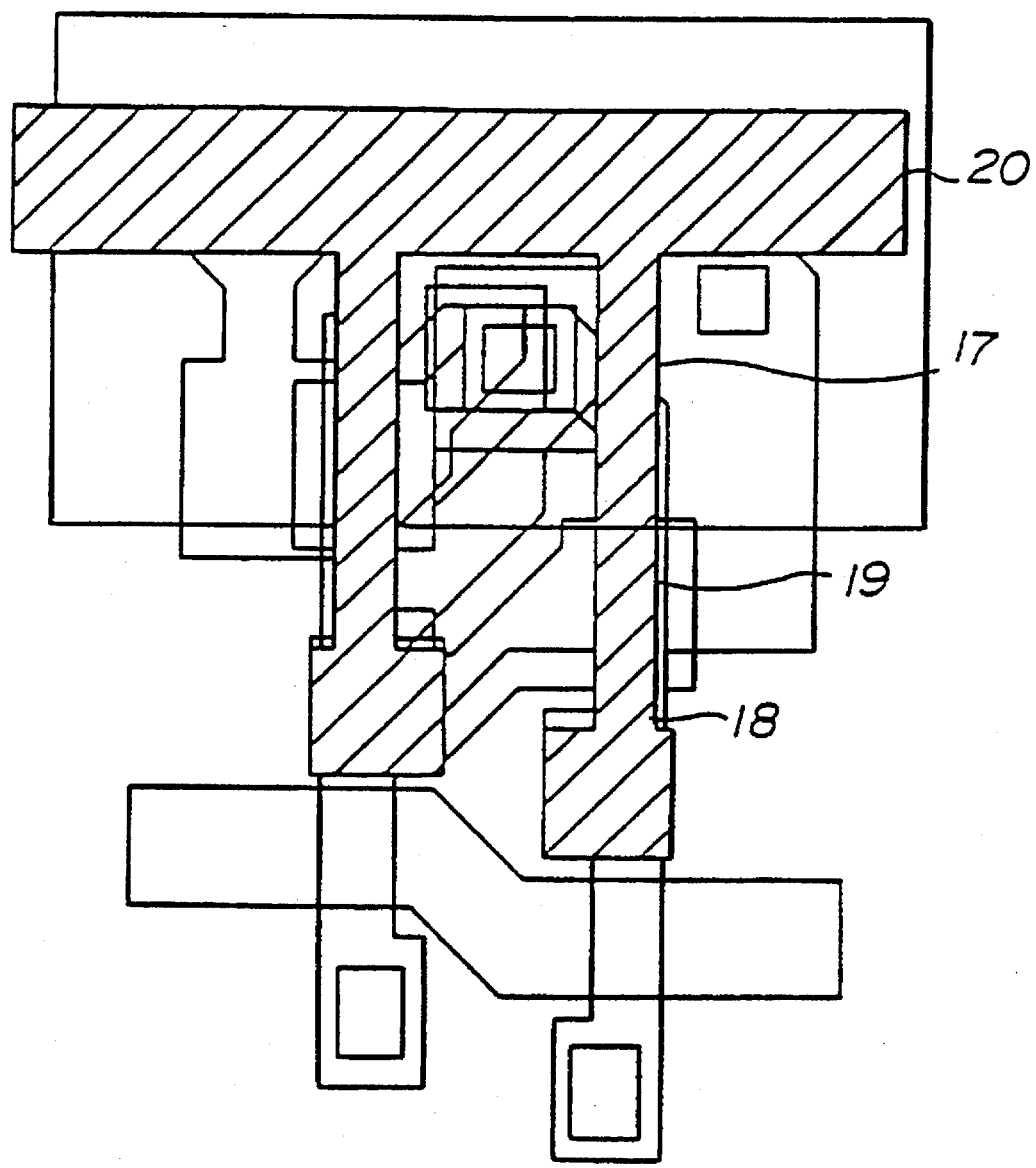
Figure 5C:
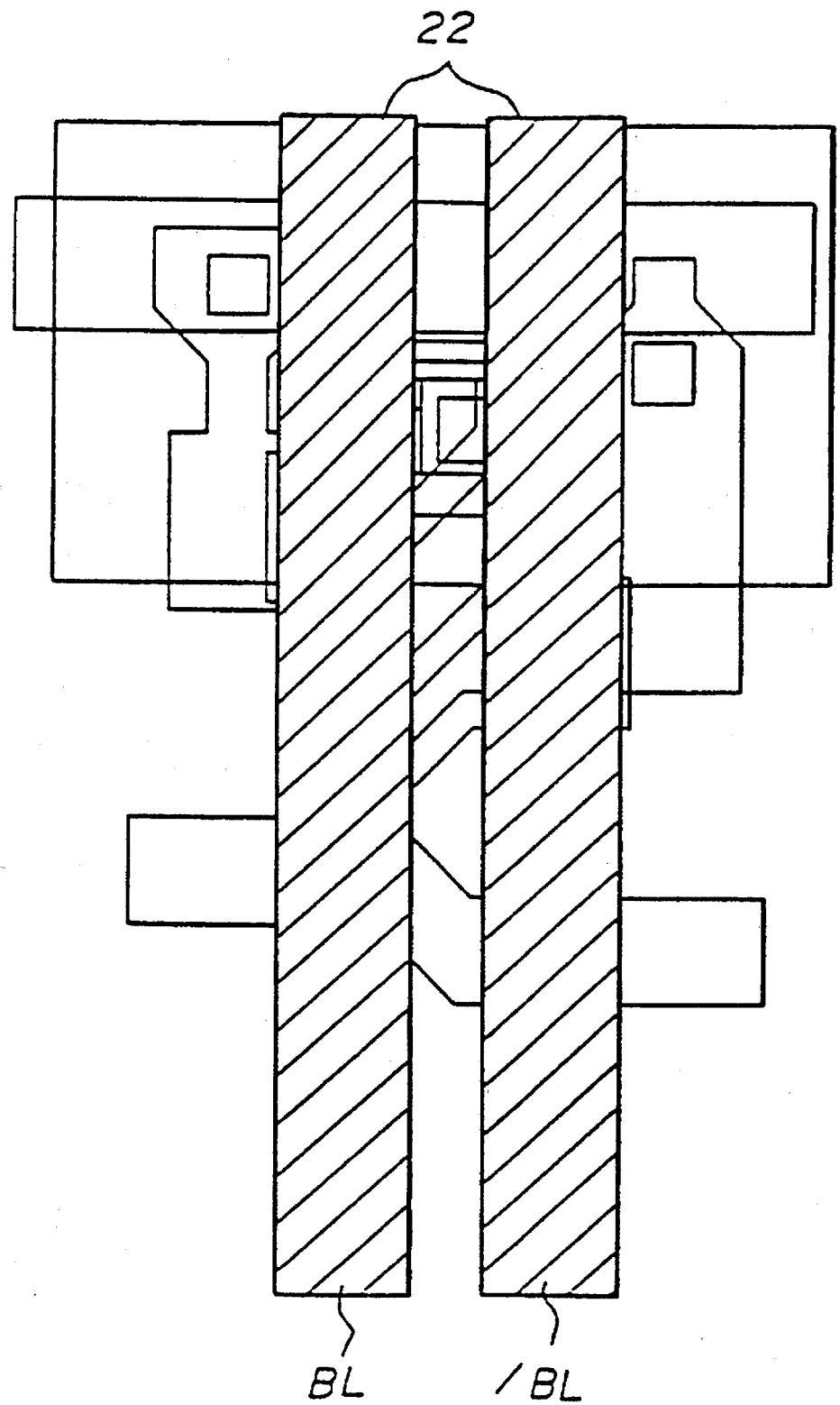
Figure 5D:
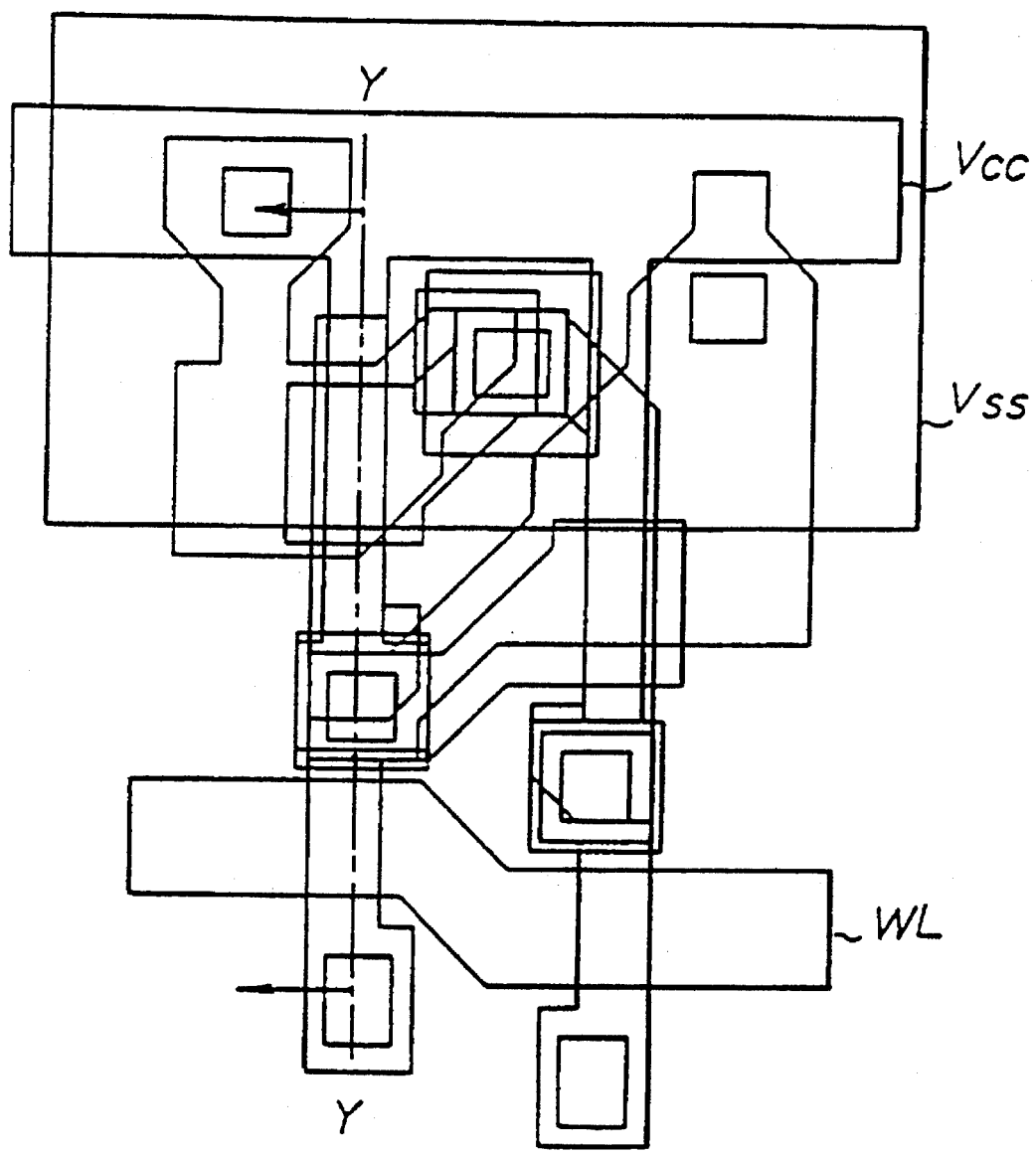
Figure 6:
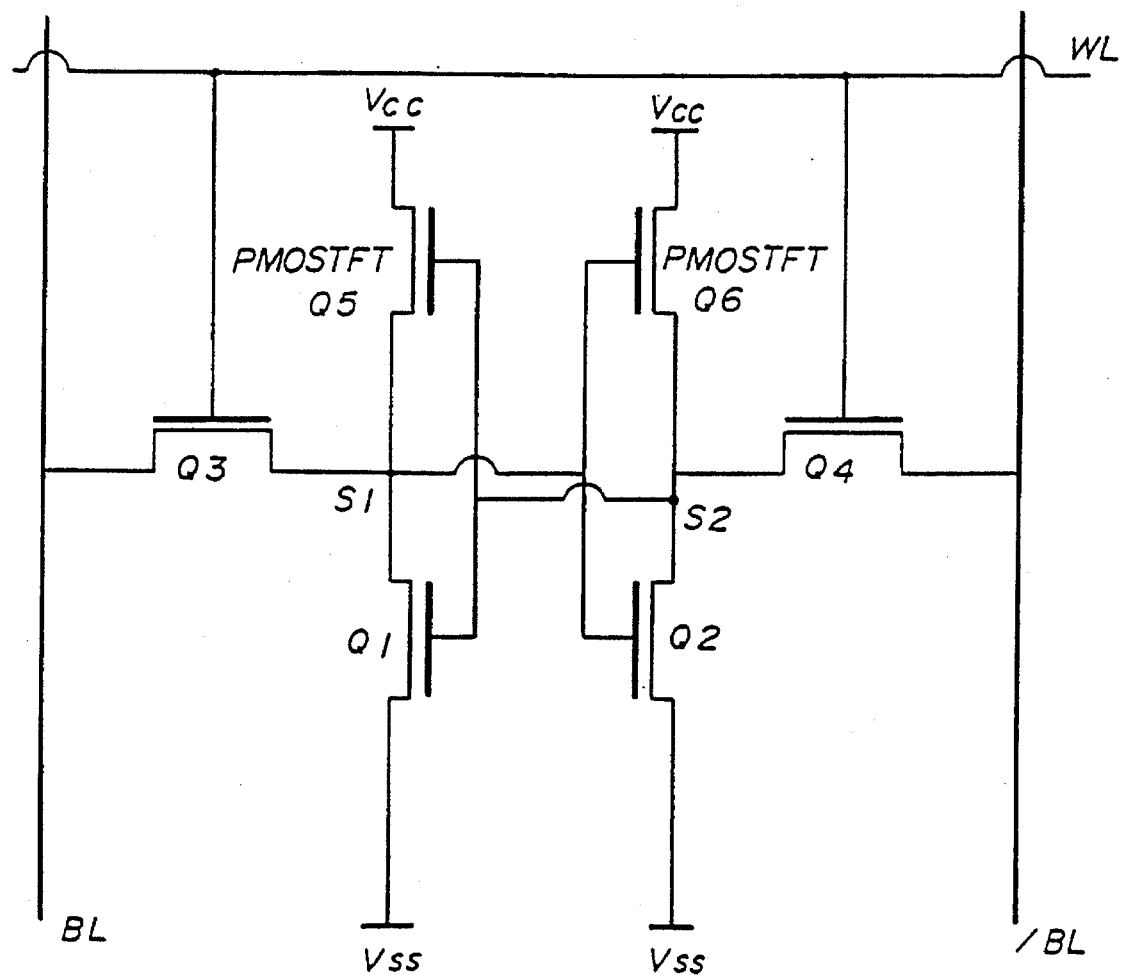
FIG. 6 shows an equivalent circuit diagram of an essential part of the TFT load type SRAM described in conjunction with FIGS. 4A through 4D and 5A through 5D.
Figure 9:
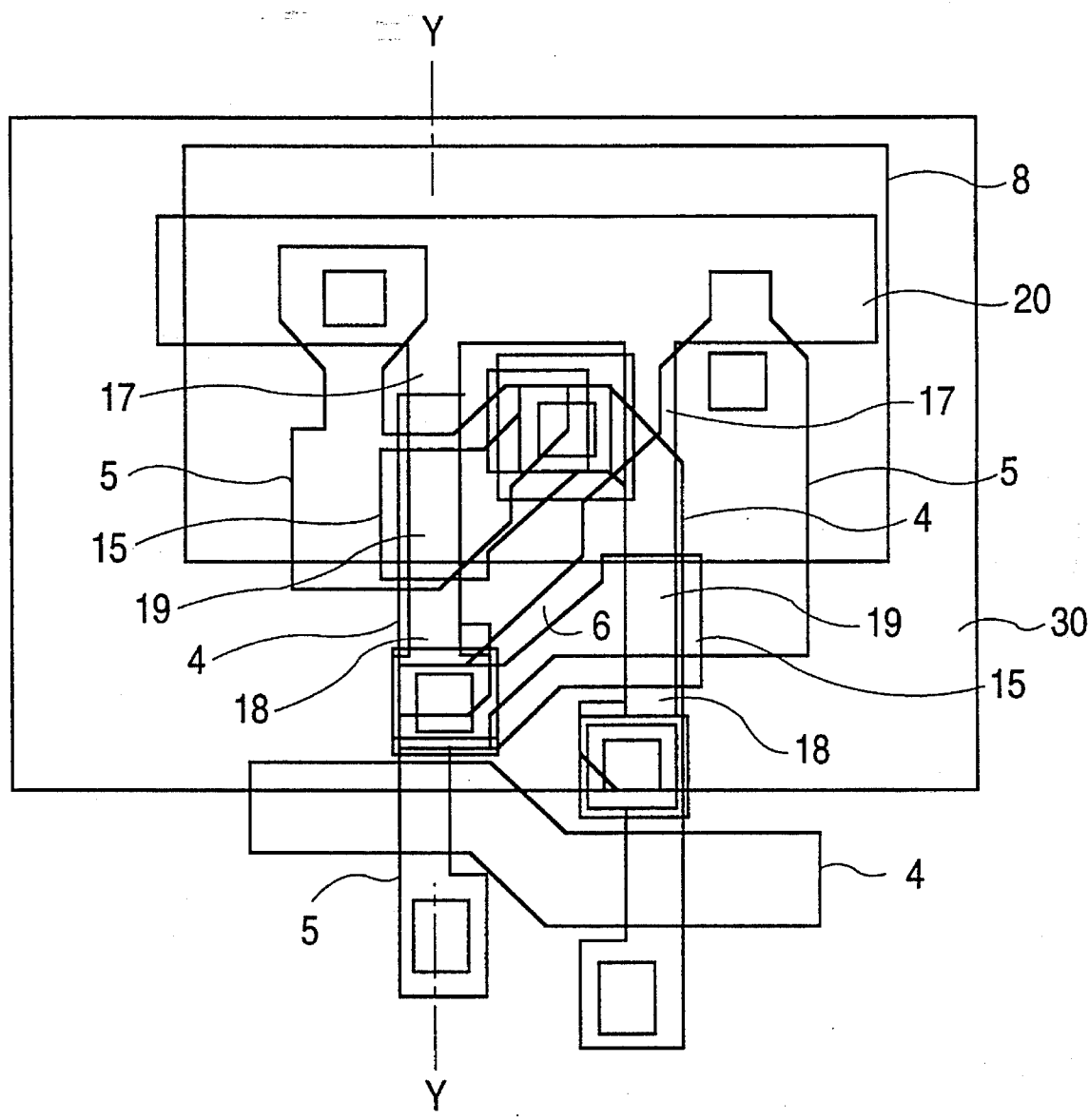
FIG. 9 is a plan view showing an essential part of the first embodiment of the semiconductor memory device at an essential stage of the first embodiment of the method of producing the semiconductor memory device according to the present invention.

FIG. 9 shows an essential part of the first embodiment in a plan view. FIG. 9 differs from the prior art FIG. 5D in that a shield electrode 30 is additionally provided. FIGS. 8A and 8B respectively are cross sections taken along a line which corresponds to a line Y—Y in the plan view of FIG. 9.

Figure 4A:
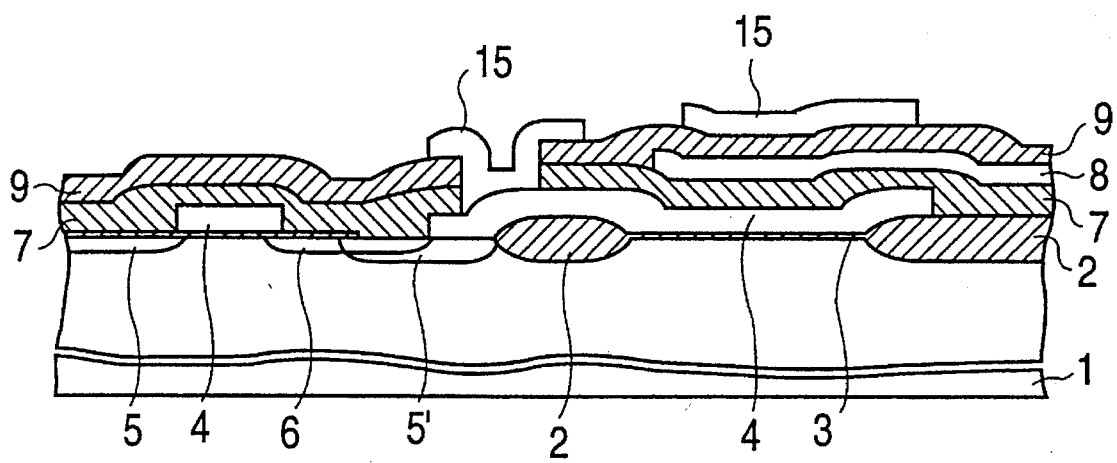
FIGS. 4A through 4D are side views in cross section showing essential parts of a TFT load type SRAM at essential stages of a conventional method of producing the high resistance load type SRAM.
Figure 4B:
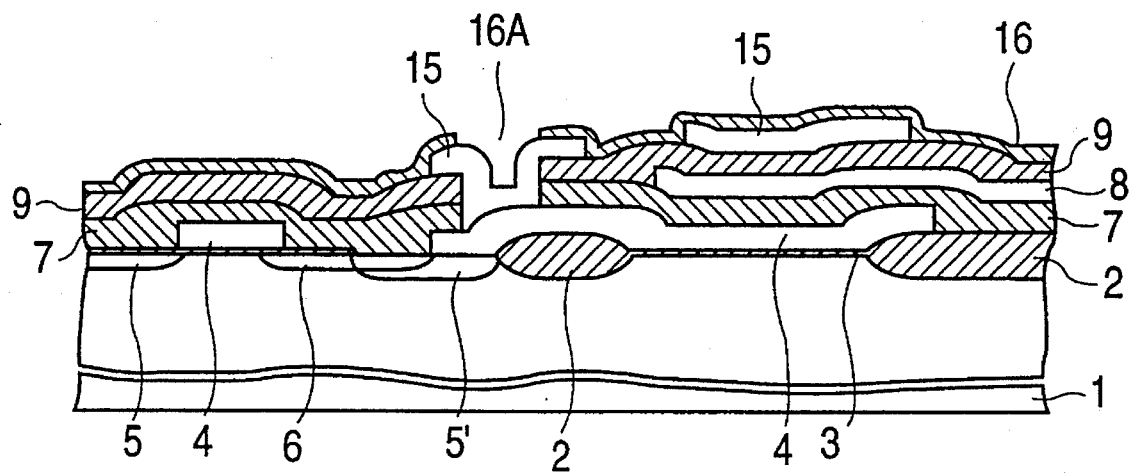
Figure 4C:
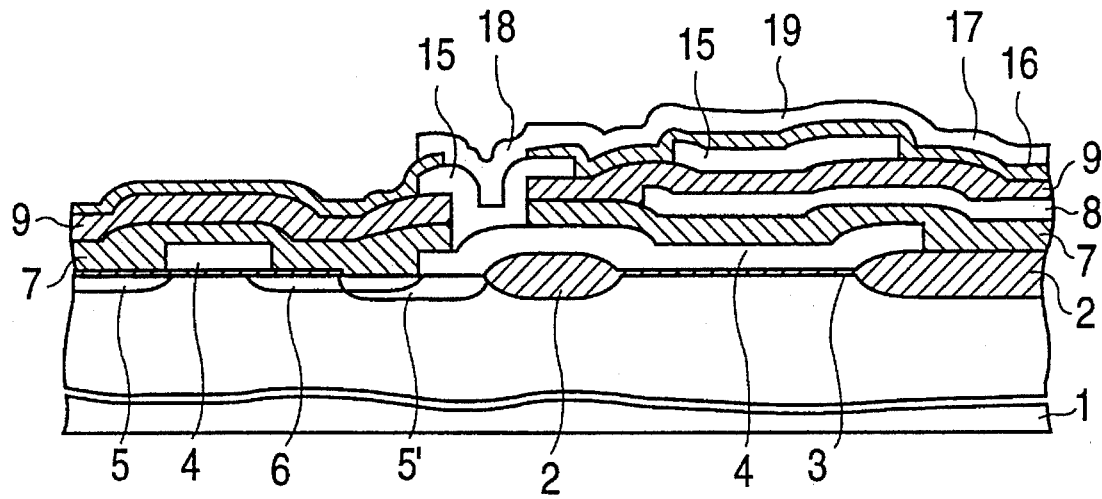
Figure 4D:
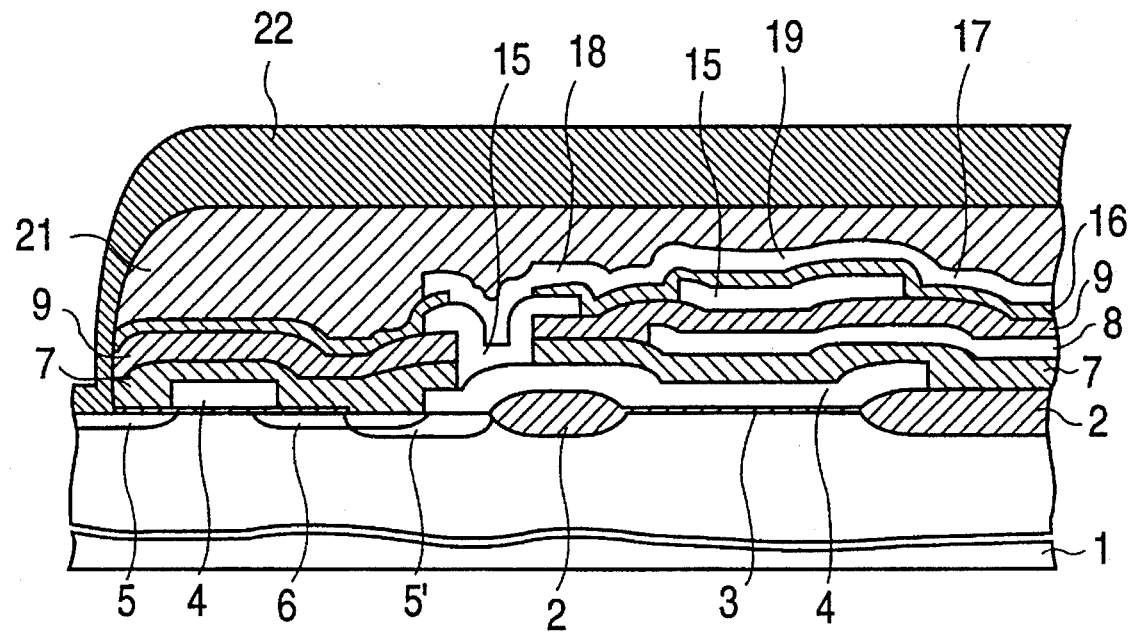

In this embodiment of the method, the processes are the same as those of the prior art up to the processes shown in FIGS. 4A through 4C, that is, until a fourth polysilicon layer is used to form a source region 17, a drain region 18 and a channel region 19 of the TFT load and a Vcc supply line 20. Hence, a description will only be given of the processes carried out thereafter.

In FIGS. 8A and 9, the TFT load type SRAM already has provided on a Si semiconductor substrate 1 a field insulator layer 2, a gate insulator layer 3, a gate electrode of the transfer transistor or a gate electrode 4 of the driver transistor formed from a first polysilicon layer, an $n^+$-type impurity region 5', an $n^+$-type source region 5, an $n^+$-type drain region 6, a $SiO_2$ insulator layer 7, a ground line 8 formed from a second polysilicon layer, a $SiO_2$ insulator layer 9, a gate electrode 15 of the TFT load formed from a third polysilicon layer, a gate insulator layer 16 of the TFT load made of $SiO_2$, and the source region 17, the drain region 18 and the channel region of the TFT load and the Vcc supply line (not shown) which are formed from the fourth polysilicon layer.

A CVD is carried out to form on the entire surface an insulator layer 29 which is made of $SiO_2$ and has a thickness of 500 Å, for example.

Then, a CVD is carried out to form on the entire surface a fifth polysilicon layer having a thickness of 1000 Å, for example.

A thermal diffusion process is carried out to diffuse P in the fifth polysilicon layer with an impurity concentration of $1 \times 10^{21}$ $cm^{-3}$, for example.

A resist process of the photolithography technique and a RIE using $CCl_4/O_2$ as the etching gas are carried out to pattern the fifth polysilicon layer and to form the shield electrode 30.

In FIGS. 8B and 9, a CVD is carried out to form an insulator layer which is made of $SiO_2$ and has a thickness of 1000 Å, for example, and an insulator layer which is made of PSG and has a thickness of 5000 Å, for example. In FIG. 8B, these two insulator layers are shown as an insulator layer 31, similarly as in the case of FIG. 4D.

Thereafter, a thermal process is carried out to reflow and planarize the insulator layer 31.

A resist process of the photolithography technique and a RIE using $CHF_3/He$ as the etching gas are carried out to selectively etch the insulator layer 31 and the like and to form a bit line contact hole.

Then, a sputtering is carried out to form an Al layer having a thickness of 1 μm, for example, and this Al layer is patterned into a bit line 32 using the normal photolithography technique.

According to this embodiment, the TFT load is shielded by the shield electrode 30. For this reason, it is possible to prevent undesirable and erroneous operation which may be caused by the voltage of the bit line 32 or other conductive parts. In addition, the number of mask processes is reduced by one compared to that of the double gate structure TFT load type SRAM, and the production process can thus be simplified.

Figure 10A:
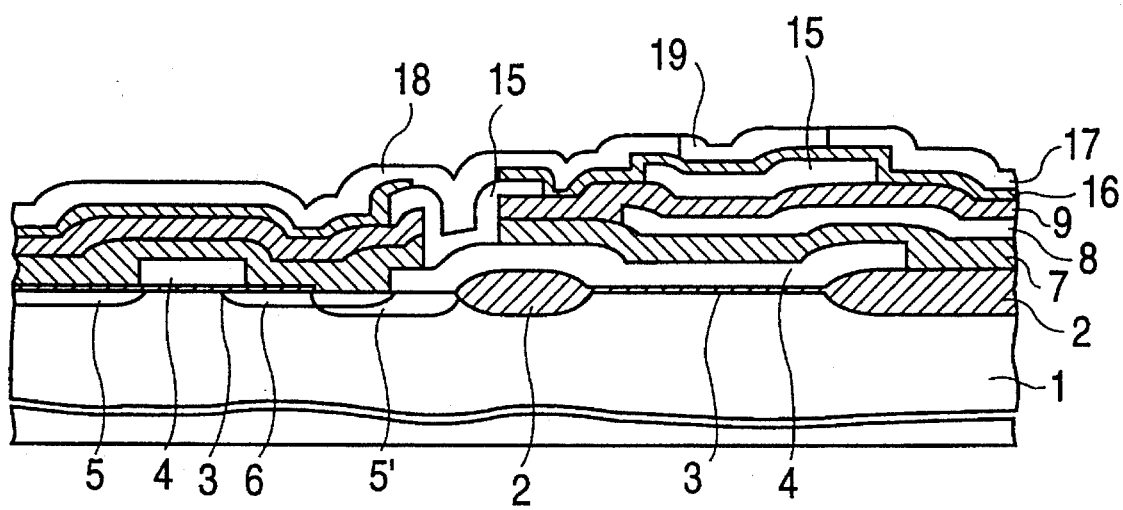
FIGS. 10A through 10C are side views in cross section showing an essential part of a second embodiment of a semiconductor memory device according to the present invention at essential stages of a second embodiment of a method of producing the semiconductor memory device according to the present invention.
Figure 10B:
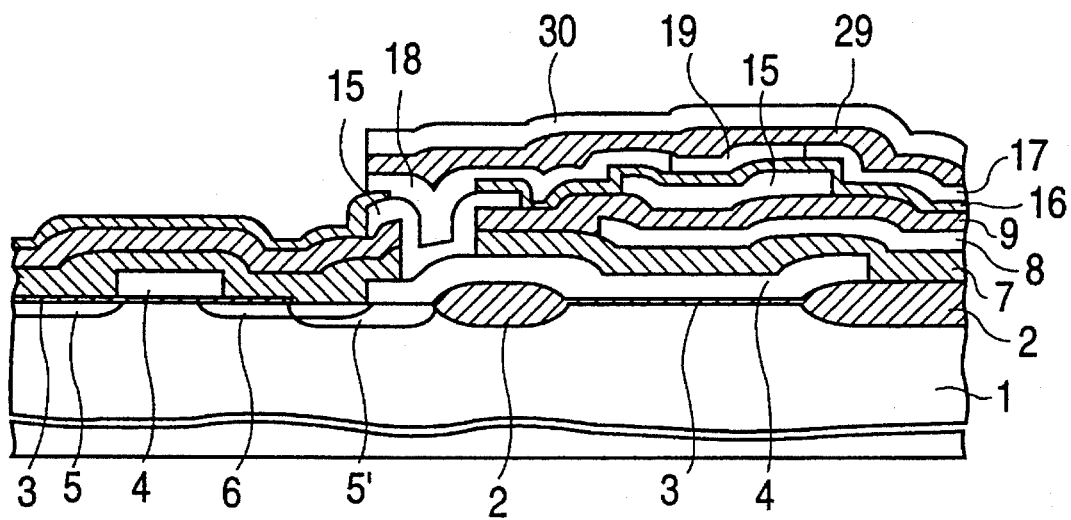
Figure 10C:
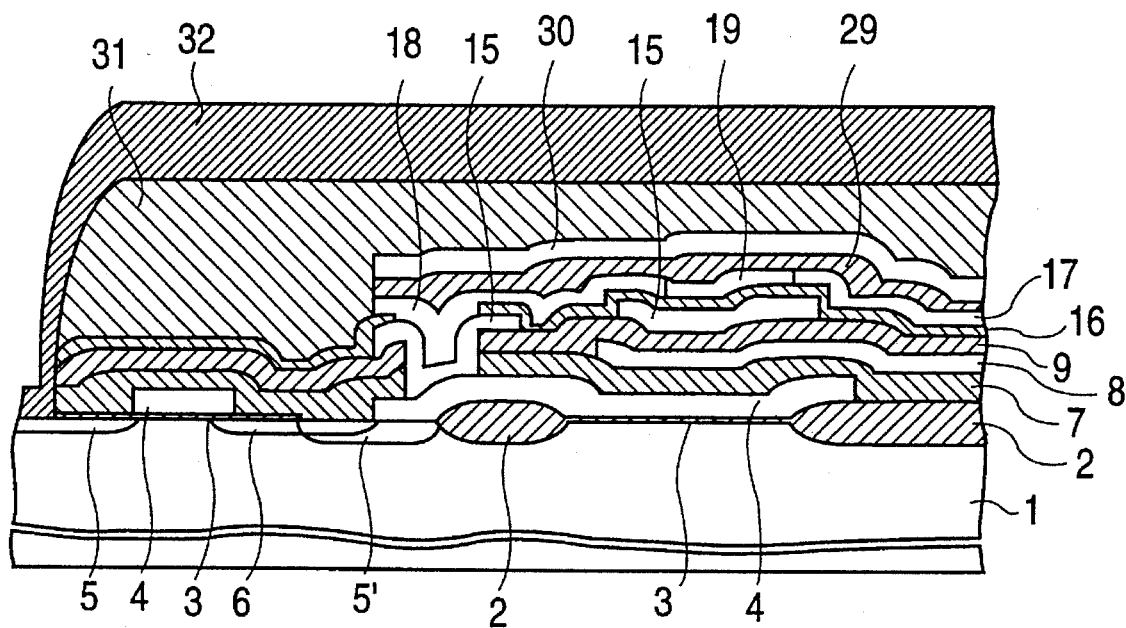

Next, a description will be given of a second embodiment of the semiconductor memory device according to the present invention which is produced by a second embodiment of the method of producing the semiconductor memory device according to the present invention. FIGS. 10A through 10C are side views in cross section showing an essential part of the second embodiment of the semiconductor memory device according to the present invention at essential stages of the second embodiment of the method of producing the semiconductor memory device according to the present invention. In FIGS. 10A through 10C, those parts which are the same as those corresponding parts in FIGS. 4A through 4D are designated by the same reference numerals. FIGS. 10A through 10C respectively are cross sections taken along a line which is similar to the line Y—Y in the plan view of FIG. 9.

In this embodiment of the method, the processes are the same as those of the prior art up to the processes shown in FIGS. 4A and 4B, that is, until a gate insulator layer 16 is selectively etched to form a drain contact hole 16A. Hence, a description will only be given of the processes carried out thereafter.

In FIG. 10A, the TFT load type SRAM already has provided on a Si semiconductor substrate 1 a field insulator layer 2, a gate insulator layer 3, a gate electrode 4 of the driver transistor formed from a first polysilicon layer, an $n^+$-type impurity region 5', an $n^+$-type source region 5, an $n^+$-type drain region 6, a $SiO_2$ insulator layer 7, a ground line 8 formed from a second polysilicon layer, a $SiO_2$ insulator layer 9, a gate electrode 15 of the TFT load formed from a third polysilicon layer, the gate insulator layer 16 of the TFT load made of $SiO_2$, and the drain contact hole 16A. The drain contact hole 16A is shown in FIG. 4B.

A CVD is carried out to form a fourth polysilicon layer having a thickness of 200 Å, for example.

Then, a resist process of the photolithography technique and an ion implantation are carried out to inject B ions with a dosage of $1 \times 10^{14}$ $cm^{-2}$ and an acceleration energy of 5 keV, for example, into parts of the fourth polysilicon layer where source and drain regions of the TFT load are formed.

In FIG. 10B, a CVD is carried out to form on the entire surface an insulator layer 29 which is made of $SiO_2$ and has a thickness of 500 Å, for example.

A CVD is carried out to form on the entire surface a fifth polysilicon layer having a thickness of 1000 Å, for example.

Next, a thermal diffusion process is carried out to diffuse P in the fifth polysilicon layer with an impurity concentration of $1 \times 10^{21}$ $cm^{-3}$, for example.

A resist process of the photolithography technique and RIEs using $CCl_4/O_2$ and $CHF_3/He$ as the etching gases are carried out to pattern the fifth polysilicon layer, the insulator layer 29 and the fourth polysilicon layer and to form a shield electrode 30, a source region 17, a drain region 18 and a channel region 19 of the TFT load, and a Vcc supply line. The Vcc supply line cannot be seen in FIG. 10B. The $CCl_4/O_2$ etching gas is used to etch the polysilicon, and the $CHF_3/He$ is used to etch the $SiO_2$.

In FIG. 10C, a CVD is carried out to form an insulator layer which is made of $SiO_2$ and has a thickness of 1000 Å, for example, and an insulator layer which is made of PSG and has a thickness of 5000 Å, for example. These two insulator layers are shown as an insulator layer 31 in FIG. 10C, similarly as in the case of FIG. 4D.

Then, a thermal process is carried out to reflow and planarize the insulator layer 31.

A resist process of the photolithography technique and a RIE using $CHF_3/He$ as the etching gas are carried out to selectively etch the insulator layer 31 and the like and to form a bit line contact hole.

A sputtering is carried out to form an Al layer having a thickness of 1 μm, for example, and this Al layer is patterned into a bit line 32 by the normal photolithography technique.

Figure 7A:
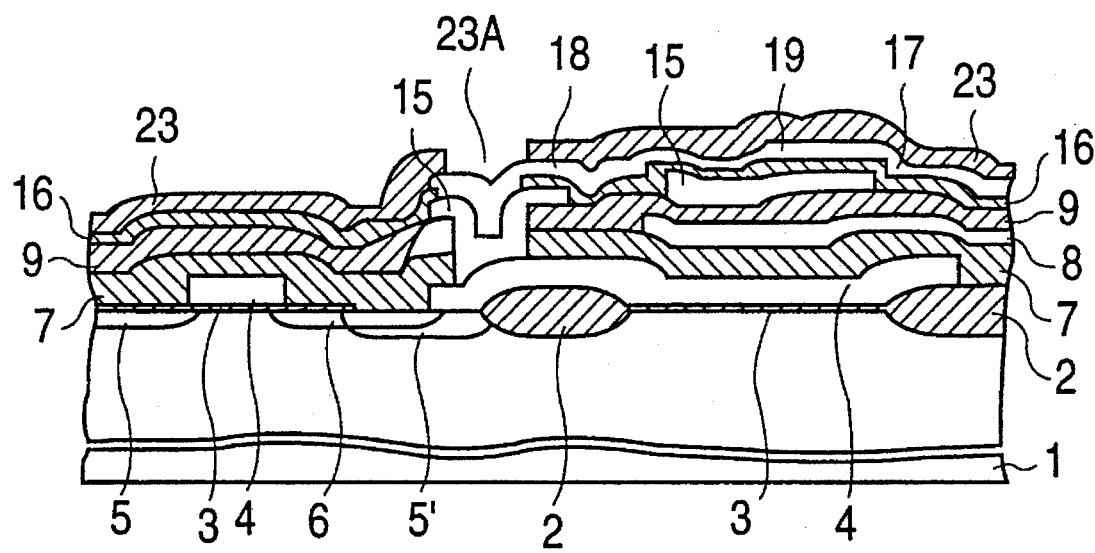
FIGS. 7A through 7C are side views in cross section showing essential parts of a double gate structure TFT load type SRAM at essential stages of a conventional method of producing the double gate structure TFT load type SRAM.
Figure 7B:
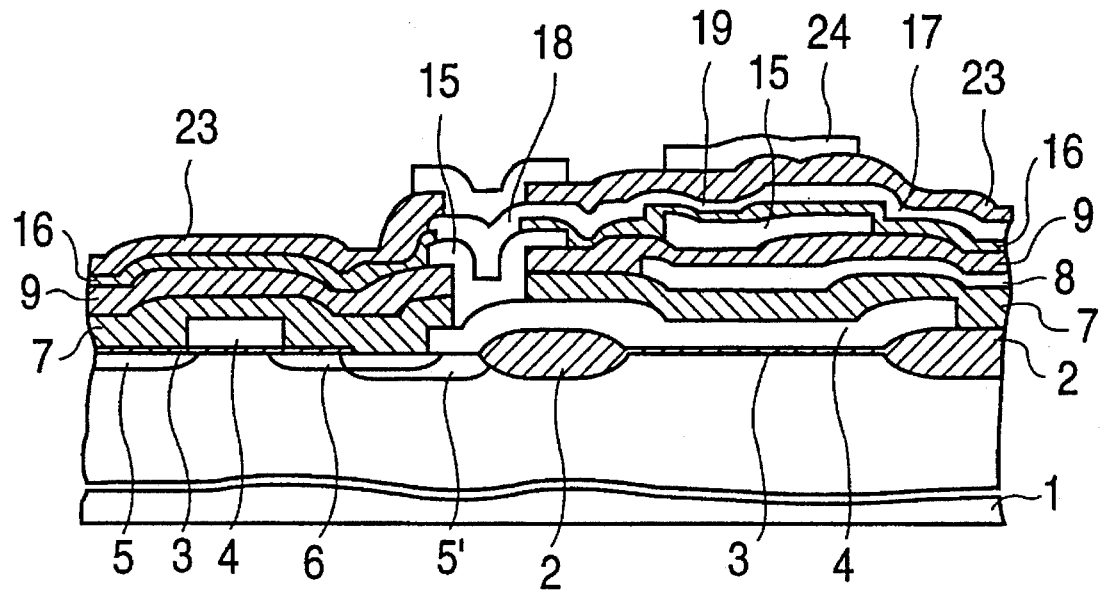
Figure 7C:
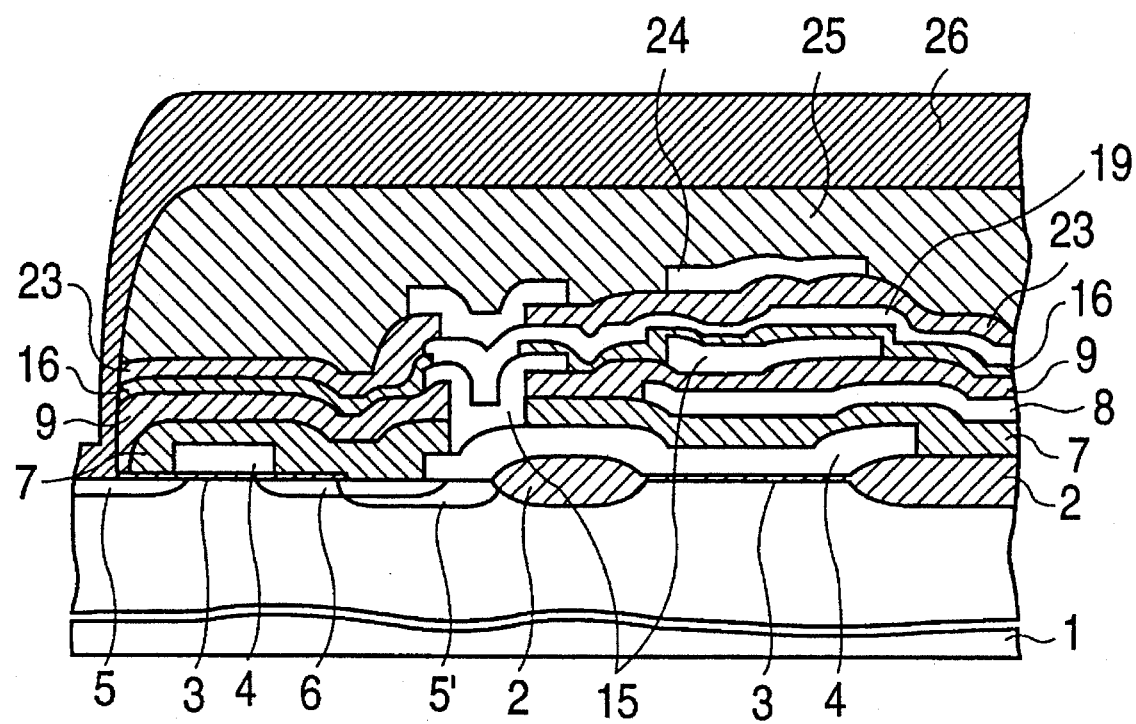

According to this embodiment, the shield electrode 30 which shields the TFT load, the source region 17, the drain region 18 and the channel region 19 of the TFT load and the like can be formed by one mask process. For example, the channel of the TFT load and the shield electrode 30 have the same pattern (or shape) in the plan view. As a result, although the shield electrode 30 is additionally provided, the number of processes will not increase when compared to the prior art described with reference to FIG. 5D, for example, and the parasitic effect of the TFT load can be prevented. In addition, when compared to the conventional double gate structure TFT load type SRAM described with reference to FIG. 7C, for example, the number of mask processes is reduced by two.

Figure 11:
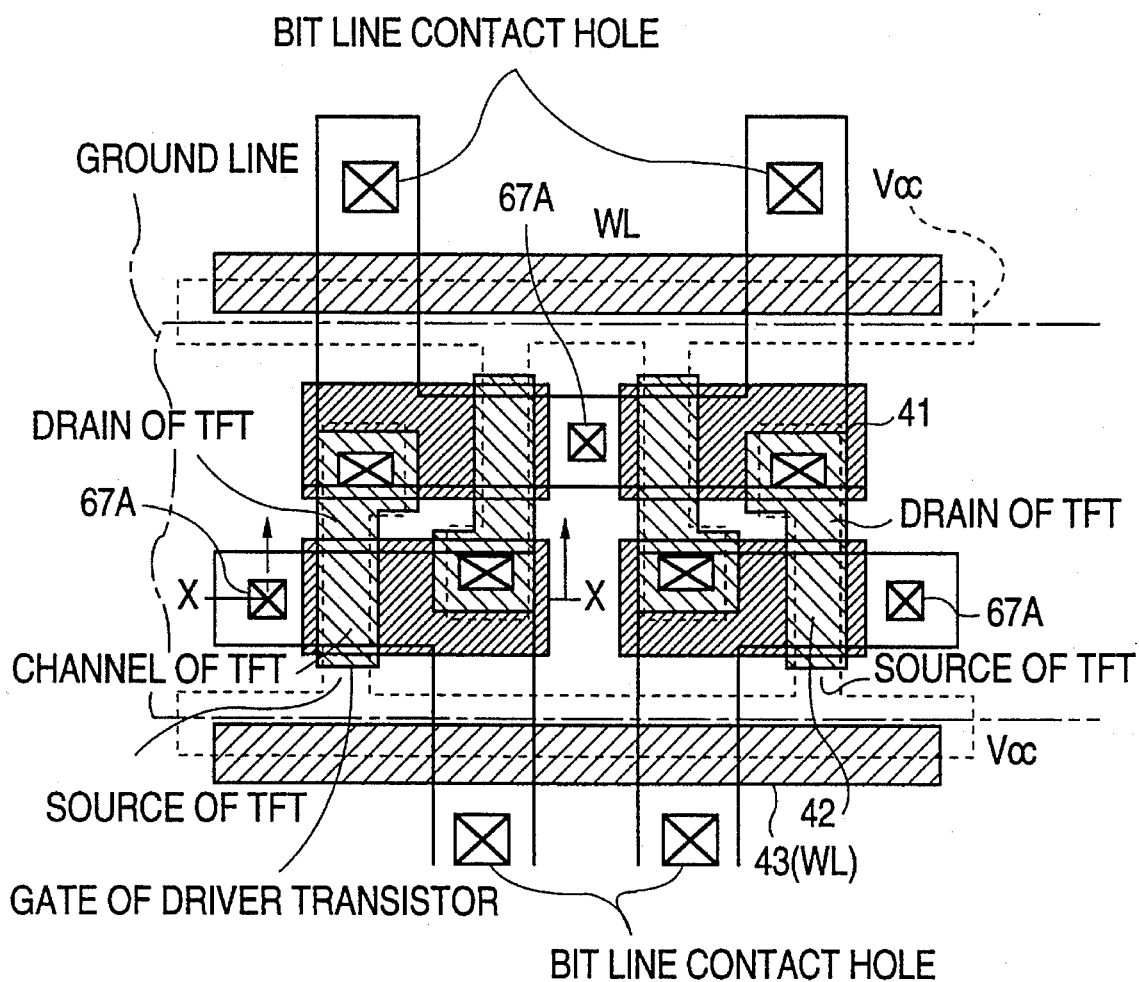
FIG. 11 is a plan view showing an essential part of a TFT load type SRAM to which the present invention may be applied.

FIG. 11 shows a plan view of an essential part of a TFT load type SRAM having split word lines, to which the present invention may be applied. The TFT load type SRAM shown in FIG. 11 includes a gate 41 of the TFT load, a channel 42 of the TFT load, a word line 43 (WL), and a Vcc supply line for supplying a positive power source voltage Vcc.

This TFT load type SRAM shown in FIG. 11 has the driver transistors and the TFT loads arranged with a symmetrical layout. Accordingly, there is an advantage in that the layout design is easy to make.

A description will now be given of an embodiment in which the present invention is applied to the TFT load type SRAM shown in FIG. 11.

FIGS. 12A through 12I are side views in cross section showing an essential part of a third embodiment of the semiconductor memory device according to the present invention at essential stages of a third embodiment of the method of producing the semiconductor memory device according to the present invention. FIGS. 12A through 12I respectively are cross sections taken along a line which corresponds to a line X—X in the plan view of FIG. 11.

Figure 12A:
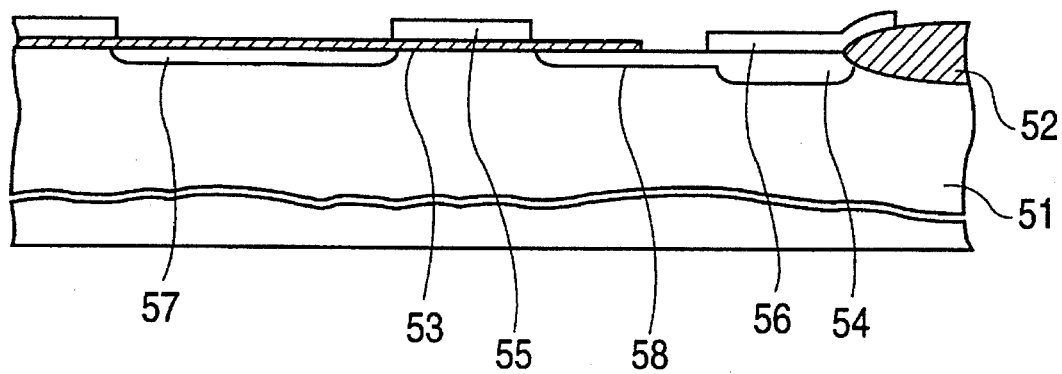
FIGS. 12A through 12I are side views in cross section showing an essential part of a third embodiment of a semiconductor memory device according to the present invention at essential stages of a third embodiment of a method of producing the semiconductor memory device according to the present invention.

In FIG. 12A, a pad layer made of $SiO_2$ covers an active region of a Si semiconductor substrate 51, and an oxidation resistant mask layer made of $Si_3N_4$ is formed on the pad layer. The pad layer and the oxidation resistant mask layer are used to selectively oxidize the Si semiconductor substrate 51 by a selective thermal oxidation and to form a field insulator layer 52. This field insulator layer 52 is made of $SiO_2$ and has a thickness of 4000 Å, for example.

Then, the active region is exposed by removing the oxidation resistant mask layer and the pad layer, and a thermal oxidation is carried out to form a gate insulator layer 53 which is made of $SiO_2$ and has a thickness of 100 Å, for example.

A resist process of the photolithography technique and a wet etching using hydrofluoric acid as the etchant are carried out to selectively etch the gate insulator layer 53 and to form a contact hole which is also used for diffusing impurities.

A CVD is carried out to form a first polysilicon layer having a thickness of 1000 Å, for example.

Next, a vapor phase diffusion is carried out to introduce P into the first polysilicon layer with an impurity concentration of $1\times10^{20}$ cm$^{-3}$, for example, and to form an n$^+$-type impurity region 54.

A resist process of the photolithography technique and a RIE using $CCl_4/O_2$ as the etching gas are carried out to pattern the first polysilicon layer and to form gate electrodes 55 and 56.

An ion implantation is carried out to inject As ions into the Si semiconductor substrate 51 with a dosage of $1\times10^{15}$ cm$^{-2}$ and an acceleration energy of 30 keV, for example, so as to form an n$^+$-type source region 57 and an n$^+$-type drain region 58.

Figure 12B:
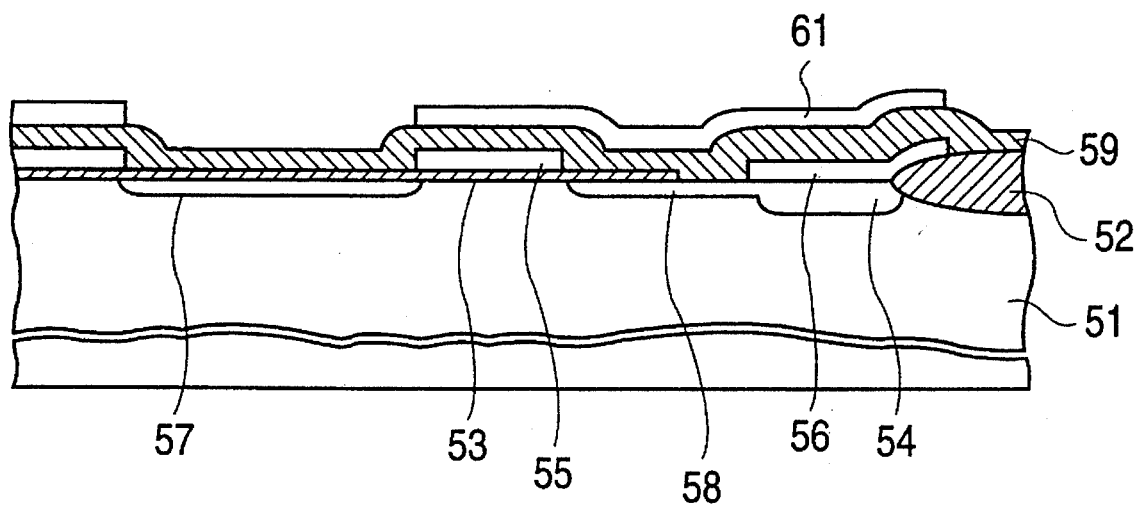

In FIG. 12B, a CVD is carried out to form an insulator layer 59 which is made of $SiO_2$ and has a thickness of 1000 Å, for example.

Then, a CVD is carried out to form a second polysilicon layer having a thickness of 1000 Å, for example.

A vapor phase diffusion is carried out to introduce P into the second polysilicon layer with an impurity concentration of $1\times10^{20}$ cm$^{-3}$, for example.

A resist process of the photolithography technique and a RIE using $CCl_4/O_2$ as the etching gas are carried out to pattern the second polysilicon layer and to form a gate electrode 61 of the TFT load and the like.

Figure 12C:
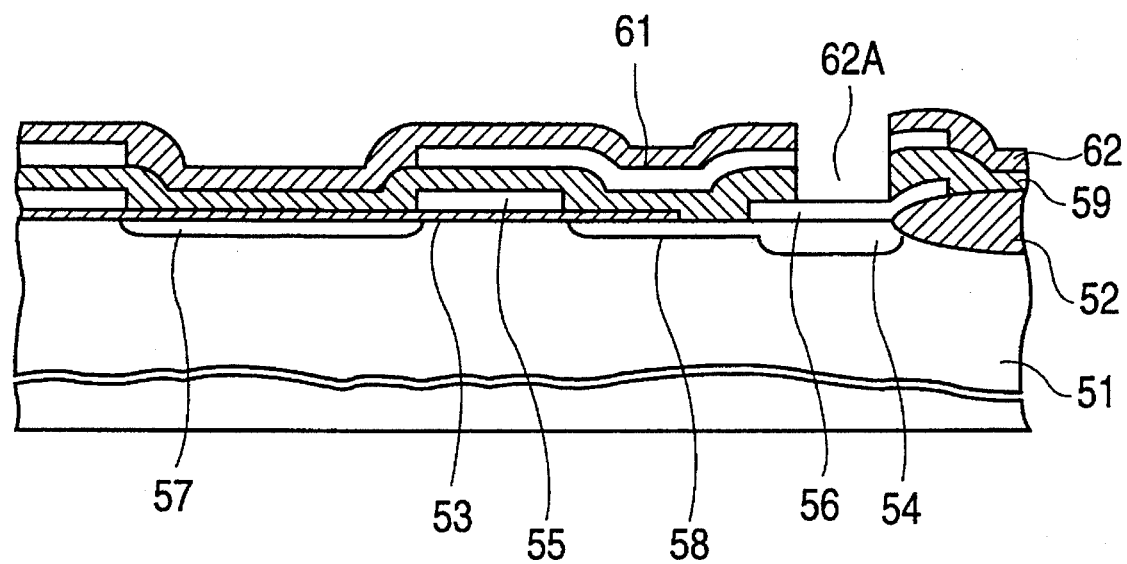

In FIG. 12C, a CVD is carried out to form a gate insulator layer 62 of the TFT load, which is made of $SiO_2$ and has a thickness of 200 Å, for example.

A resist process of the photolithography technique and RIEs using $CHF_3/He$ and $CCl_4/O_2$ as the etching gases are carried out to selectively etch the insulator layer 62, the gate electrode 61 of the TFT load formed from the second polysilicon layer, and the insulator layer 59, and to form a contact hole 62A. This contact hole 62A extends from a top surface of the insulator layer 62 and reaches a top surface of the gate electrode 56 or 55 of the driver transistor formed from the first polysilicon layer. The $CHF_3/He$ etching gas is used to etch the $SiO_2$, and the $CCl_4/O_2$ etching gas is used to etch the polysilicon.

Figure 12D:
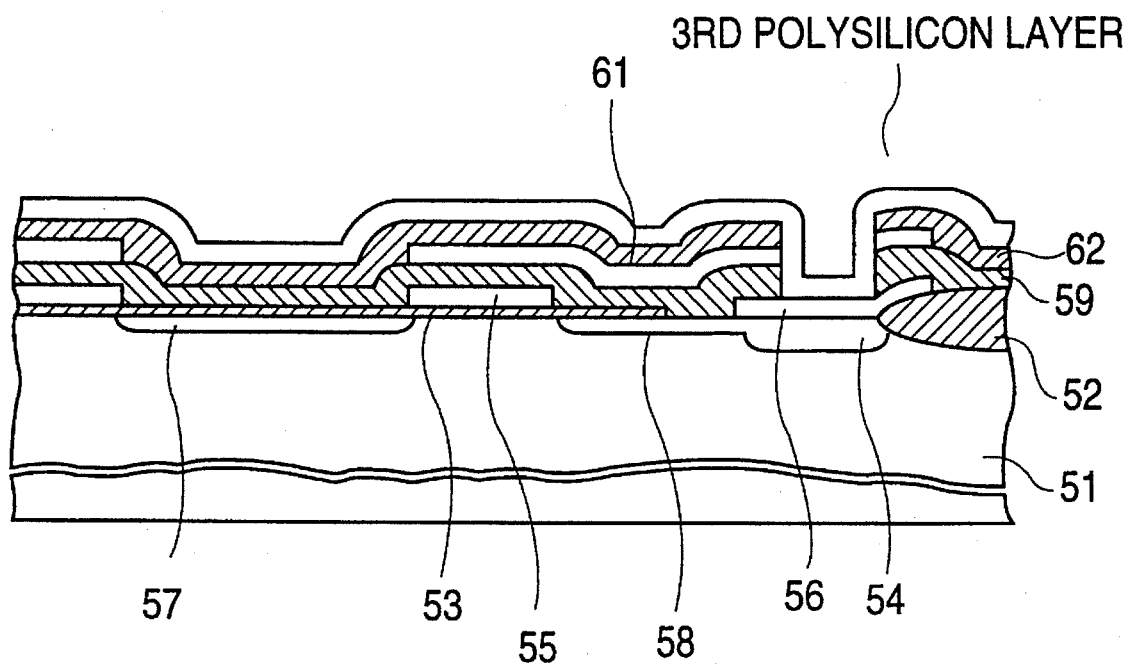

In FIG. 12D, a CVD is carried out to form a third polysilicon layer having a thickness of 500 Å, for example.

Then, a resist process of the photolithography technique and an ion implantation are carried out to inject B ions with a dosage of $1\times10^{14}$ cm$^{-2}$ and an acceleration energy of 5 keV, for example, into parts of the third polysilicon layer where source and drain regions of the TFT load and a Vcc supply line are formed.

Figure 12E:
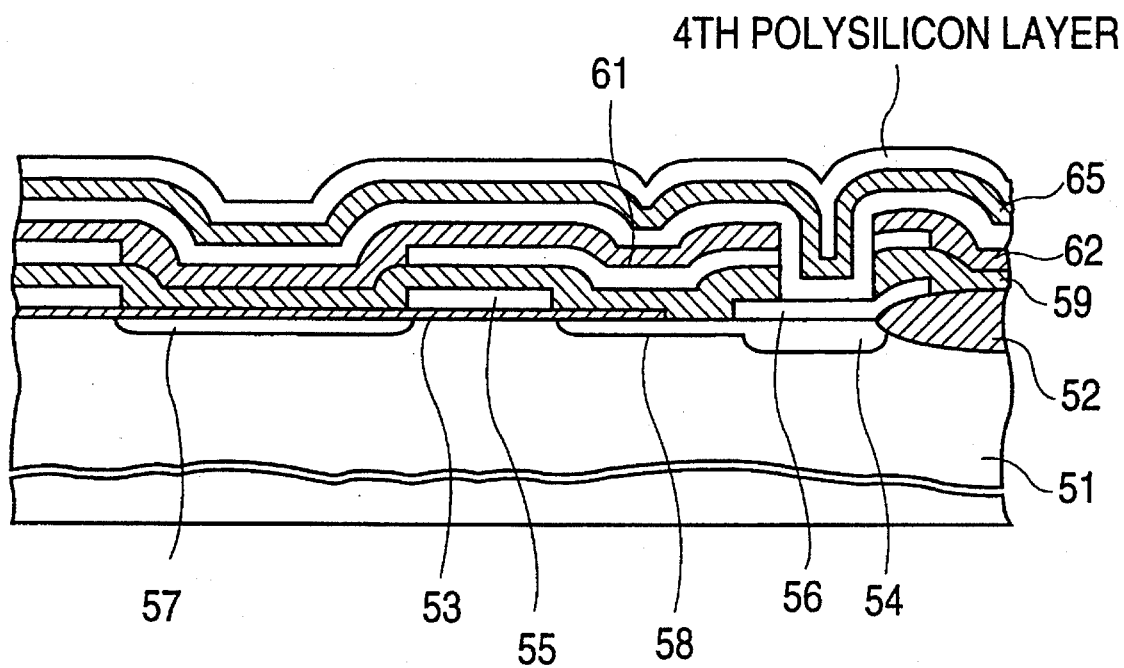

In FIG. 12E, a CVD is carried out to form an insulator layer 65 which is made of $SiO_2$ and has a thickness of 500 Å, for example.

Then, a CVD is carried out to form a fourth polysilicon layer having a thickness of 1000 Å, for example.

A thermal diffusion process is carried out to diffuse P in the fourth polysilicon layer with an impurity concentration of $1\times10^{20}$ cm$^{-3}$, for example.

Figure 12F:
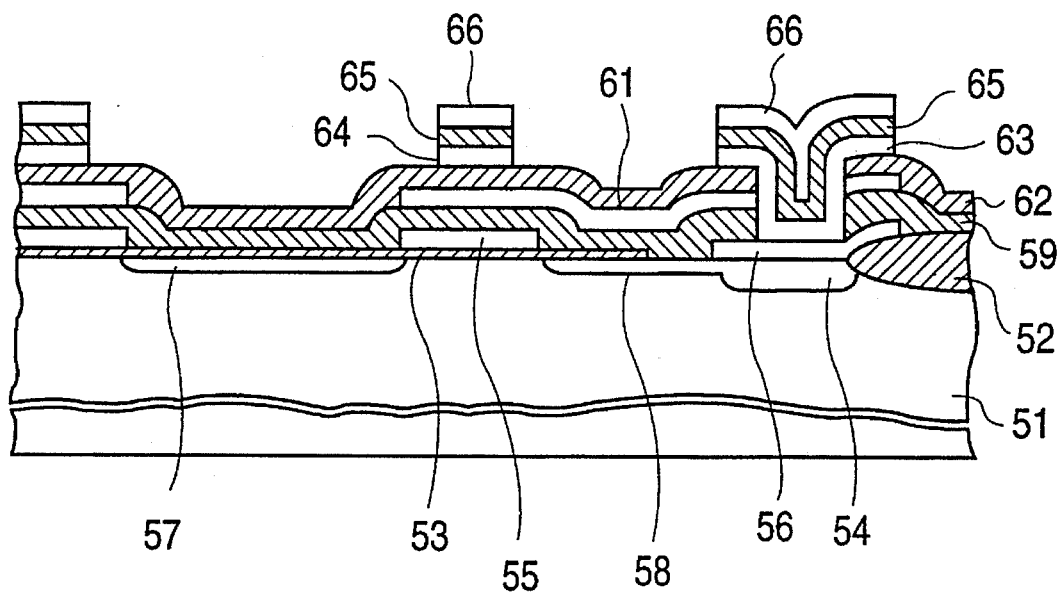

In FIG. 12F, a resist process of the photolithography technique and RIEs using $CCl_4/O_2$ and $CHF_3/He$ as the etching gases are carried out to pattern the fourth polysilicon layer, the insulator layer 65 and the third polysilicon layer, and to form a shield electrode 66 of the TFT load, a contact part, drain, source and channel regions of each TFT load, a Vcc supply line and the like. The $CCl_4/O_2$ etching gas is used to etch the polysilicon, and the $CHF_3/He$ etching gas is used to etch the $SiO_2$.

Not all of the parts described above, and the TFT load formed from the third polysilicon layer in particular, cannot be seen in FIG. 12F because these parts extend in a direction perpendicular to the paper in FIG. 12F. For this reason, only a contact part 63 which connects to a tip end of a drain region of a certain TFT load and a channel region 64 of a TFT load which is adjacent to this certain TFT load are shown in FIG. 12F. The contact part 63 which is formed from the third polysilicon layer makes contact with the top surface of the gate electrode 56 of the driver transistor and with the side surface of the gate electrode 61 of the TFT load, within the contact hole 62A. In addition, the shield of the TFT load sufficiently functions as the shield if the shield electrode 66 mainly covers the channel surface region of the TFT load.

Figure 12G:
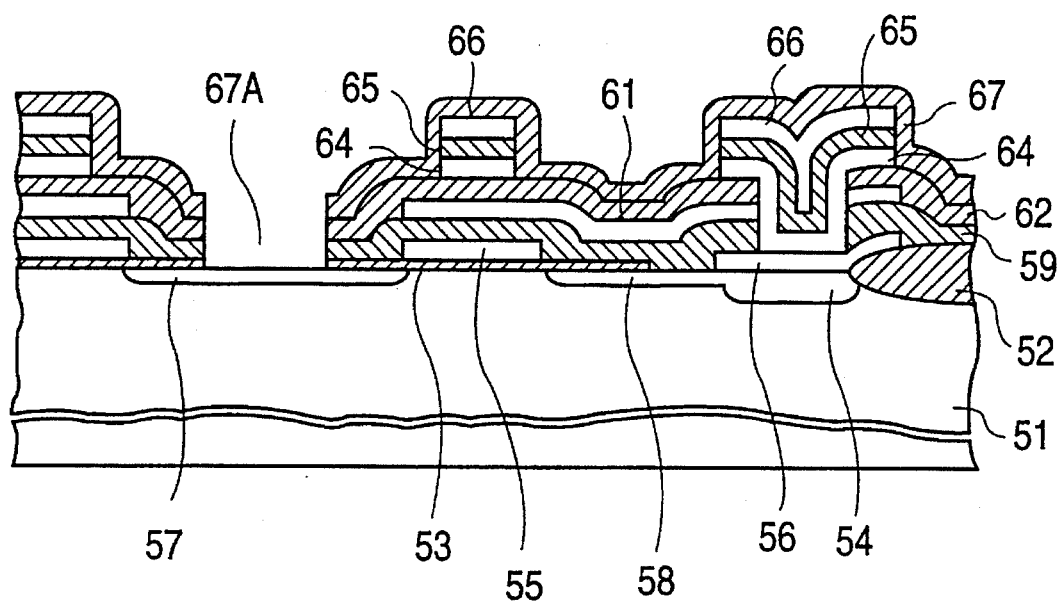

In FIG. 12G, a CVD is carried out to form an insulator layer 67 which is made of $SiO_2$ and has a thickness of 1000 Å, for example.

Then, a resist process of the photolithography technique and a RIE using $CHF_3/He$ as the etching gas are carried out to selectively etch the insulator layer 67 and the like and to form a contact hole 67A for the Vss supply (ground) line.

Figure 12H:
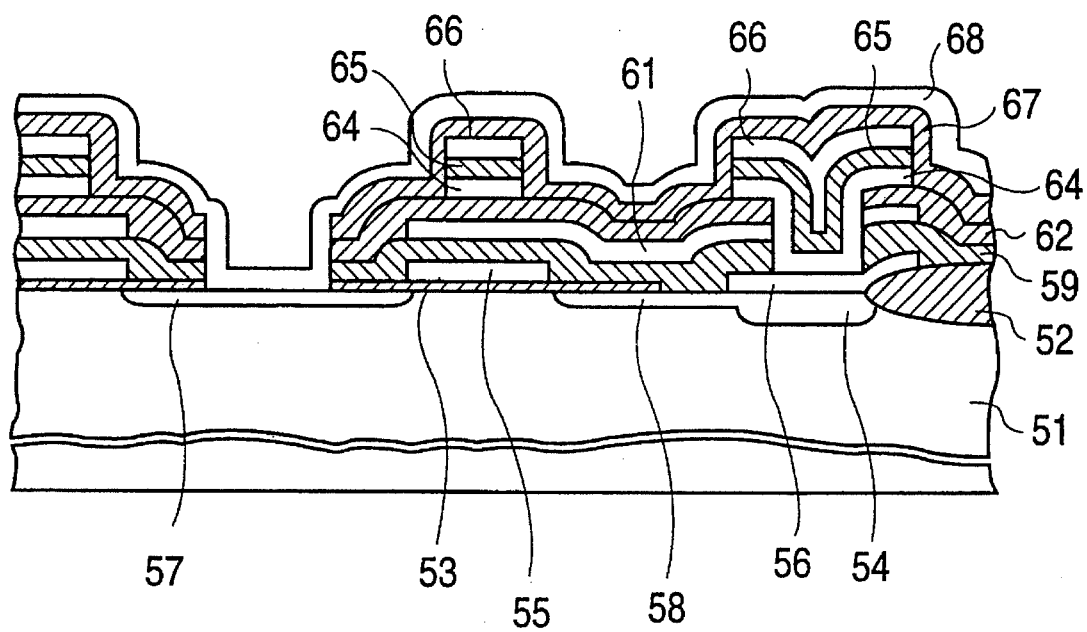

In FIG. 12H, a CVD is carried out to form a fifth polysilicon layer having a thickness of 1000 Å, for example.

Thereafter, a thermal diffusion process is carried out to diffuse P in the fifth polysilicon layer with an impurity concentration of $1 \times 10^{21}$ $cm^{-3}$, for example.

A resist process of the photolithography technique and a RIE using $CCl_4/O_2$ as the etching gas are carried out to pattern the fifth polysilicon layer and to form a Vss supply (ground) line 68 for supplying a power source voltage Vss.

Figure 12I:
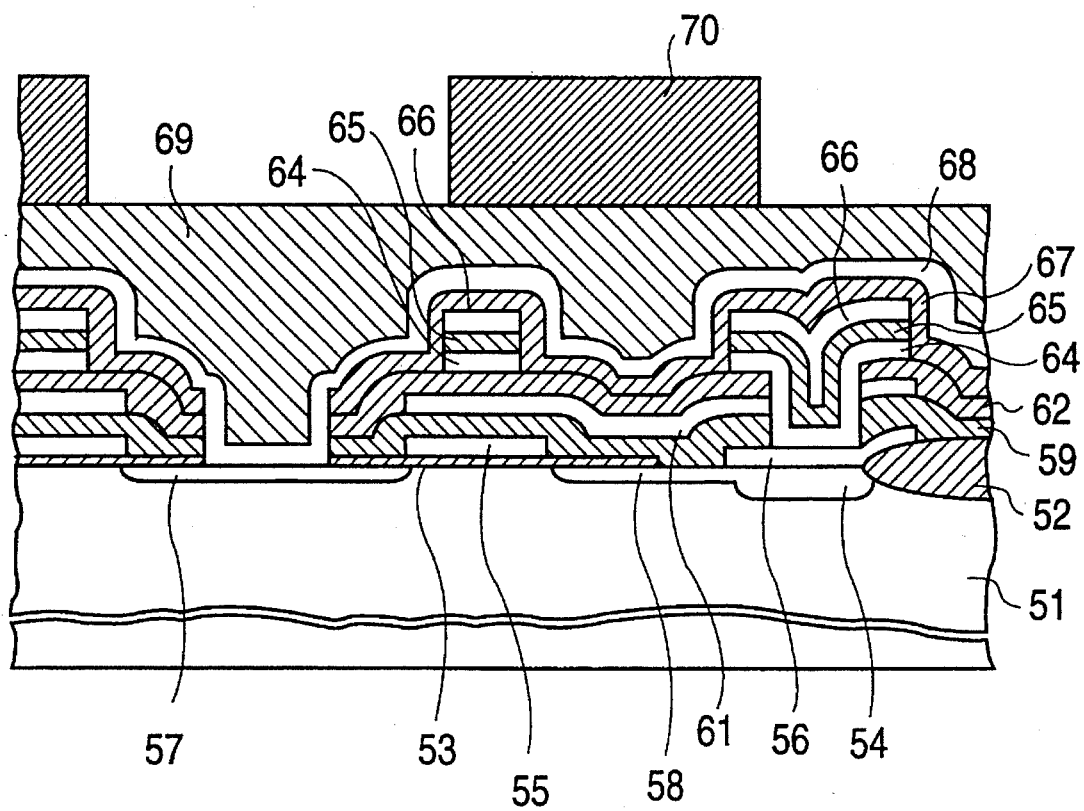

In FIG. 12I, a CVD is carried out to form an insulator layer 69 which is made of PSG and has a thickness of 5000 Å, for example.

Next, a thermal process is carried out to reflow and planarize the insulator layer 69.

A resist process of the photolithography technique and a RIE using $CCl_4$ as the etching gas are carried out to selectively etch the insulator layer 69 and the like and to form a bit line contact hole. This bit line contact hole cannot be seen in FIG. 12I, but may be seen in FIG. 11, for example.

A sputtering is carried out to form an Al layer having a thickness of 1 μm, for example, and this Al layer is patterned into a bit line 70 by the normal photolithography technique.

According to this embodiment, the TFT load is shielded by the shield electrode 66 and the TFT load type SRAM having the split word lines is unaffected by noise. In the case of the TFT load type SRAM having the split word lines, the ground line is provided above the TFT load, and the elimination of noise is very important because the potential at the ground line turns the TFT load ON and the interlayer insulator is relatively thin. Therefore, this noise elimination feature of this embodiment is extremely useful.

In addition, the advantageous features of the TFT load type SRAM shown in FIG. 11 is inherited in this embodiment. Furthermore, since the drain region and the gate electrode of the TFT load and the gate electrode or the drain region of the driver transistor can be connected by a single mask process, the number of mask processes is reduced by one compared to that of the second embodiment. When compared to the conventional double gate structure TFT load type SRAM, the number of mask processes is reduced by three, and the production process is considerably simplified.

Figure 1A:
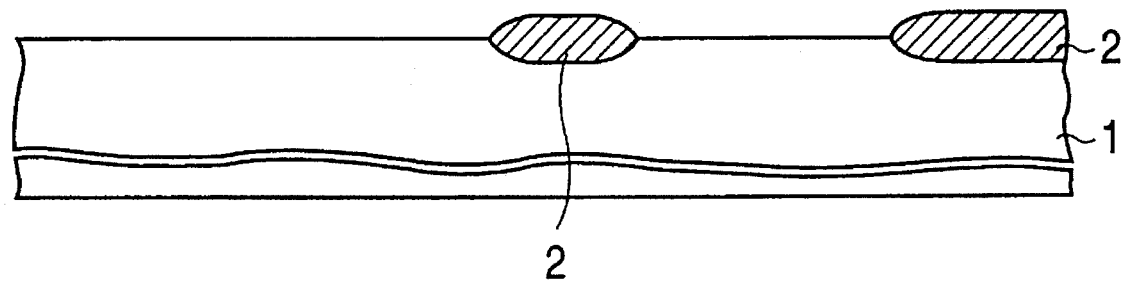
FIGS. 1A through 1J are side views in cross section showing essential parts of a high resistance load type SRAM at essential stages of a conventional method of producing the high resistance load type SRAM.
Figure 1B:
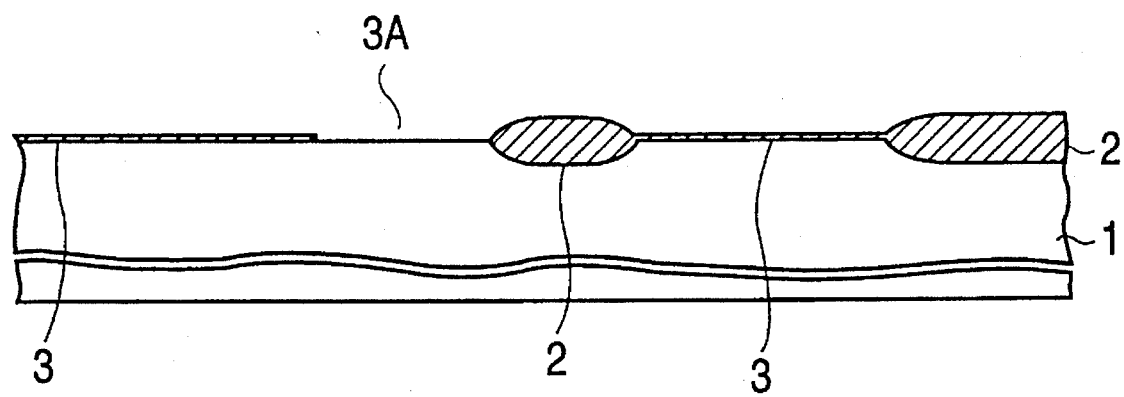
Figure 1C:
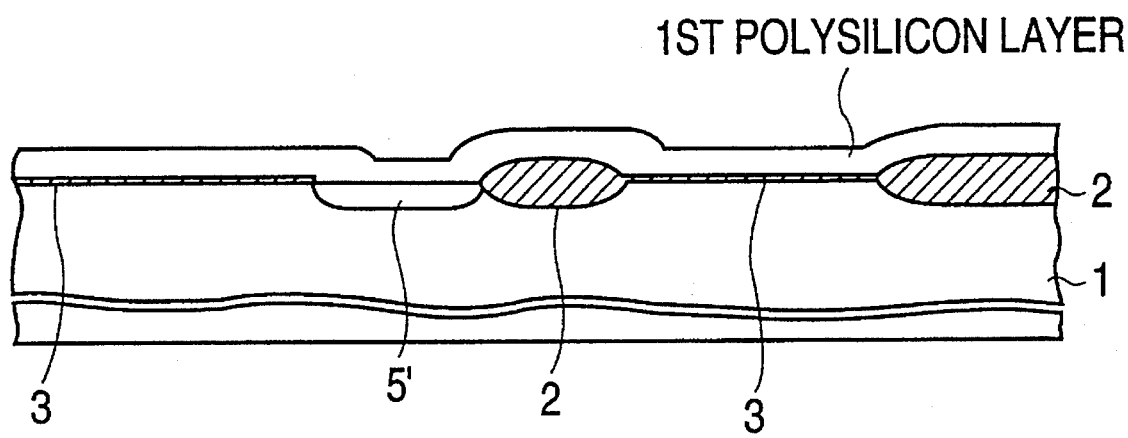
Figure 1D:
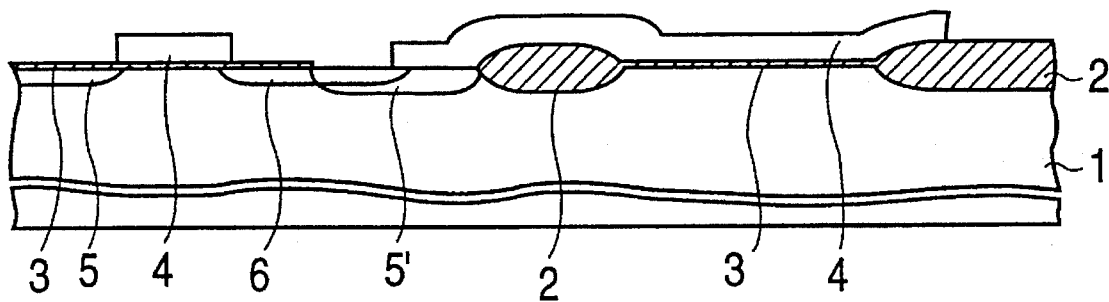
Figure 1E:
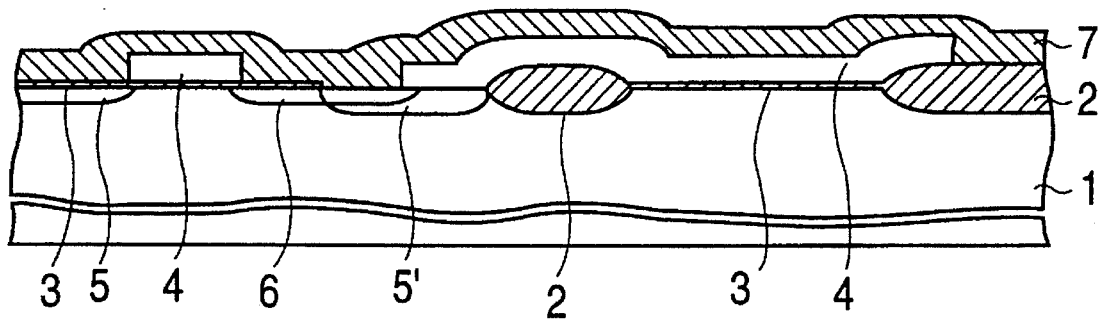
Figure 1F:
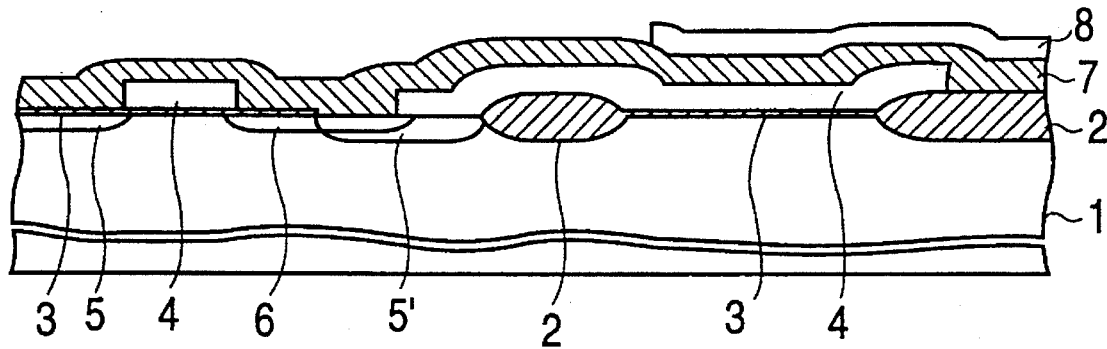
Figure 1G:
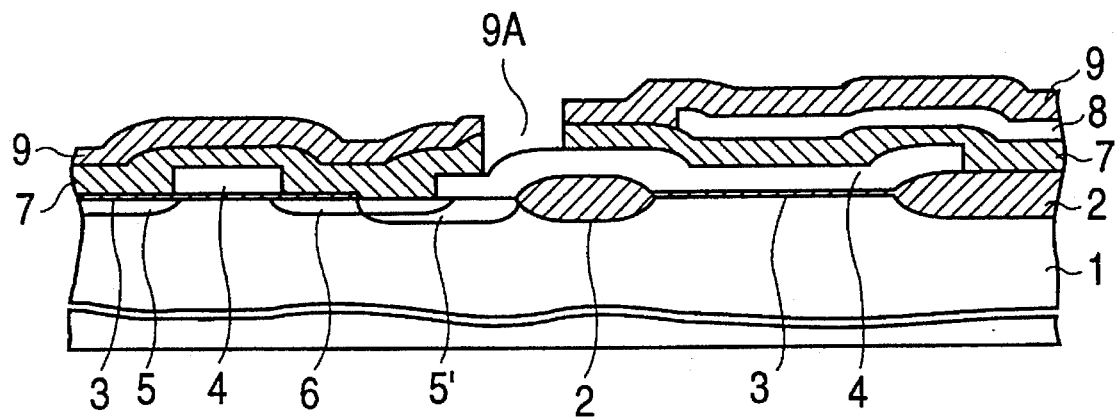
Figure 1H:
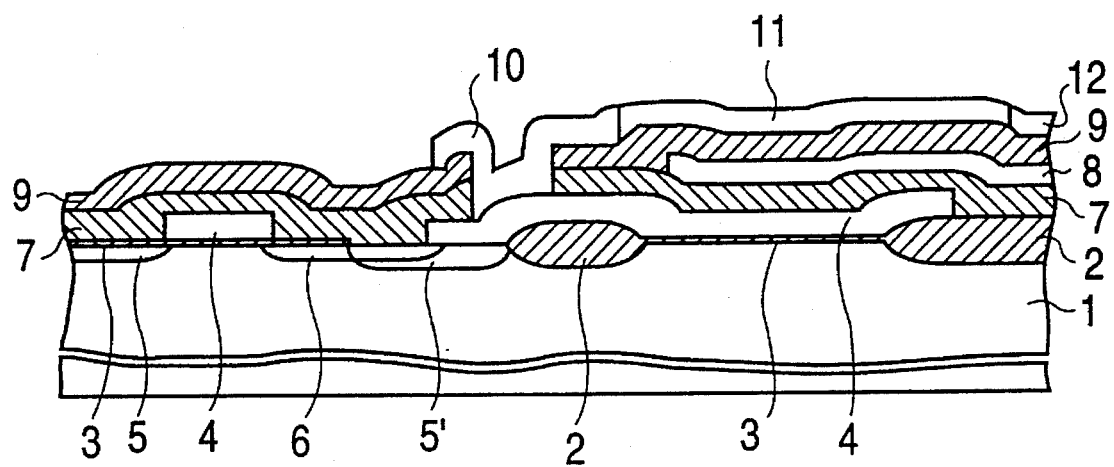
Figure 1I:
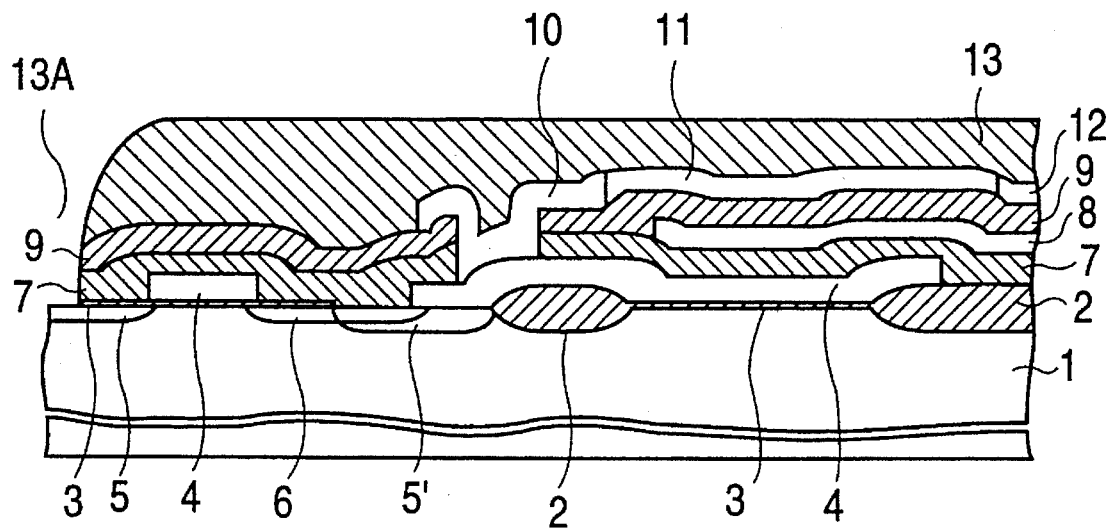
Figure 1J:
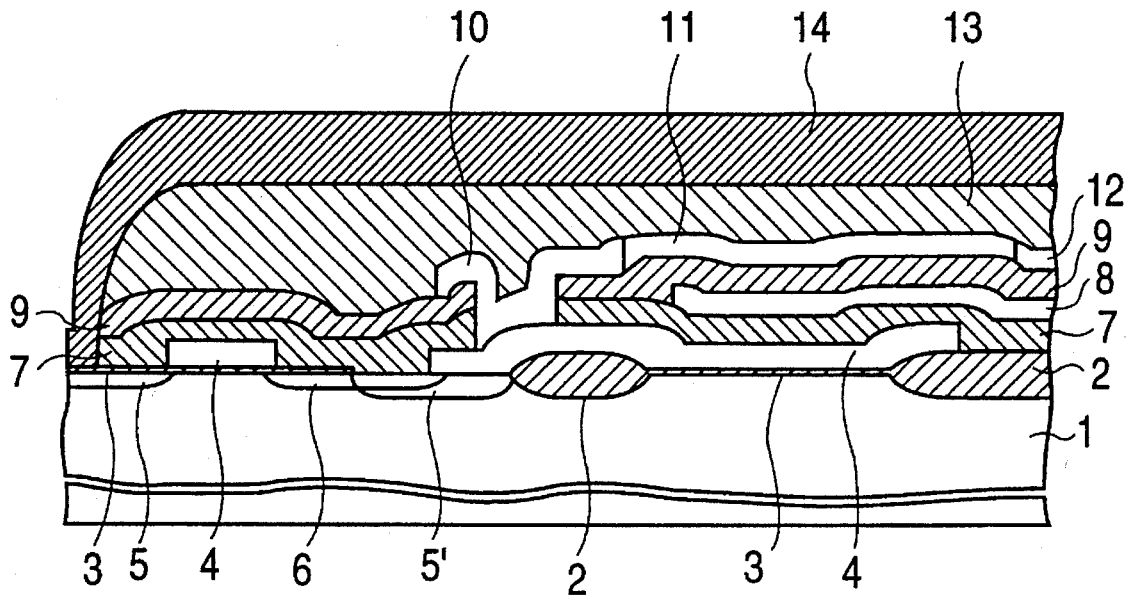

In the embodiments described above, the insulator layers made of $SiO_2$ and the polysilicon layers are etched during the process of forming the contact holes, such as the contact hole 9A (not shown in FIG. 8A but shown in FIG. 1G) and the contact hole 62A shown in FIG. 12C. However, the following problems may occur when penetrating the stacked structure which is made up of the insulator layers and polysilicon layers.

FIGS. 13A through 13F are side views in cross section showing essential parts of a semiconductor memory device at essential stages of the production, for explaining the process of forming a contact hole which penetrates a stacked structure. In each of FIGS. 13A through 13F, the left hand side shows the result of an expected process while the right hand side shows the result of an actual process, and the description will be given mainly with reference to the right hand side of FIGS. 13A through 13F which shows the actual process.

Figure 13A:
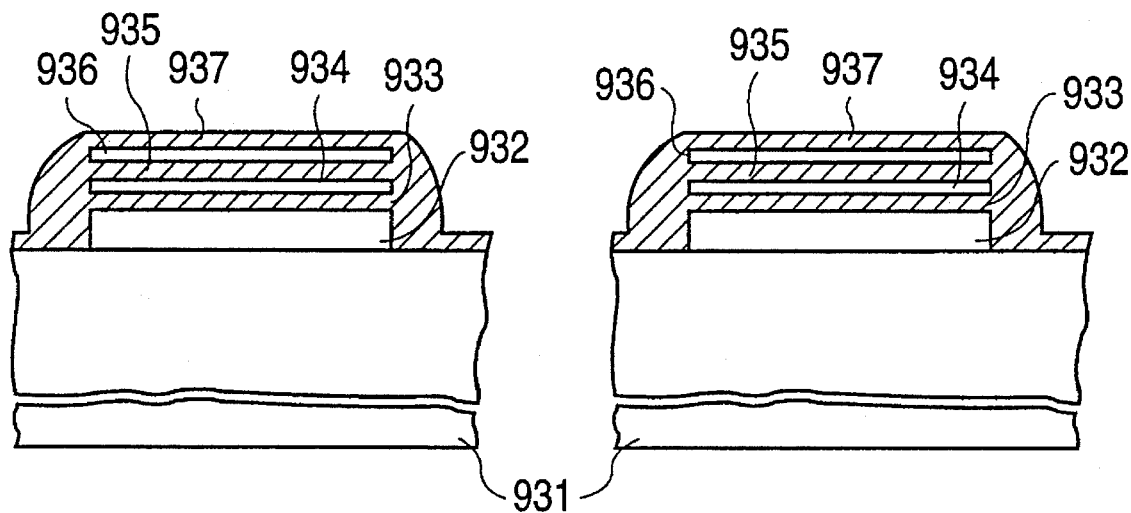
FIGS. 13A through 13F are side views in cross section showing essential parts of a semiconductor memory device at essential stages of the production, for explaining the process of forming a contact hole which penetrates a stacked structure.

In FIG. 13A, a first conductor layer 932 made of polysilicon, a first insulator layer 933 made of $SiO_2$, a second conductor layer 934 made of polysilicon, a second insulator layer 935 made of $SiO_2$, a third conductor layer 936 made of polysilicon and a third insulator layer 937 made of $SiO_2$ are successively formed and stacked on a Si semiconductor substrate 931.

Figure 13B:
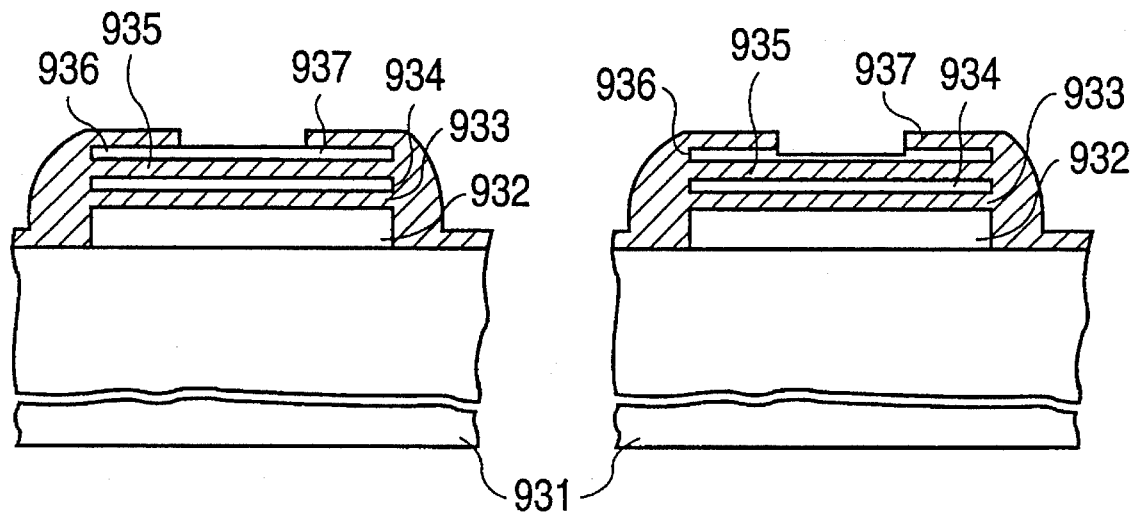

In FIG. 13B, a resist process of the normal photolithography technique and a RIE using $CHF_3/He$ as the etching gas are carried out to etch the third insulator layer 937 and to form a part of a contact hole. In FIG. 13B, the illustration of a photoresist layer is omitted for the sake of convenience. The illustration of the photoresist layer will be omitted similarly in FIGS. 13C through 13F which follow.

When etching the third insulator layer 937, a part of the underlying third conductor layer 936 is also etched. As a result, the remaining third conductor layer 936 becomes extremely thin when the third conductor layer 936 is thin to start with.

Figure 13C:
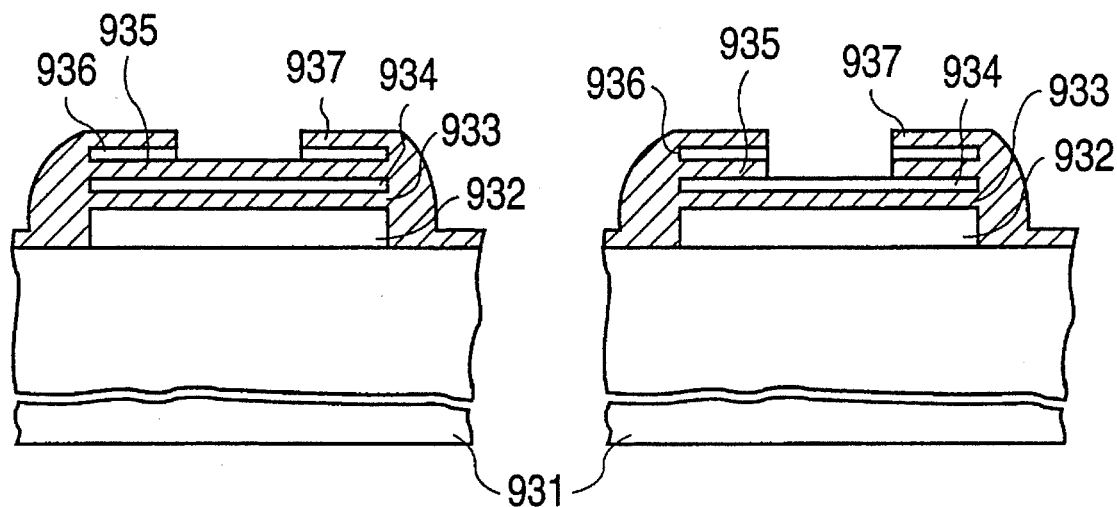

In FIG. 13C, a RIE using $CCl_4/O_2$ as the etching gas is carried out to etch the third conductor layer 936.

Although dependent on the thickness of the underlying second insulator layer 935, the thickness of the second insulator layer 935 becomes extremely thin when the third conductor layer 936 is etched. In an extreme case, not only the second insulator layer 935 but also a part of the second conductor layer 934 may be etched when etching the third conductor layer 936.

Figure 13D:
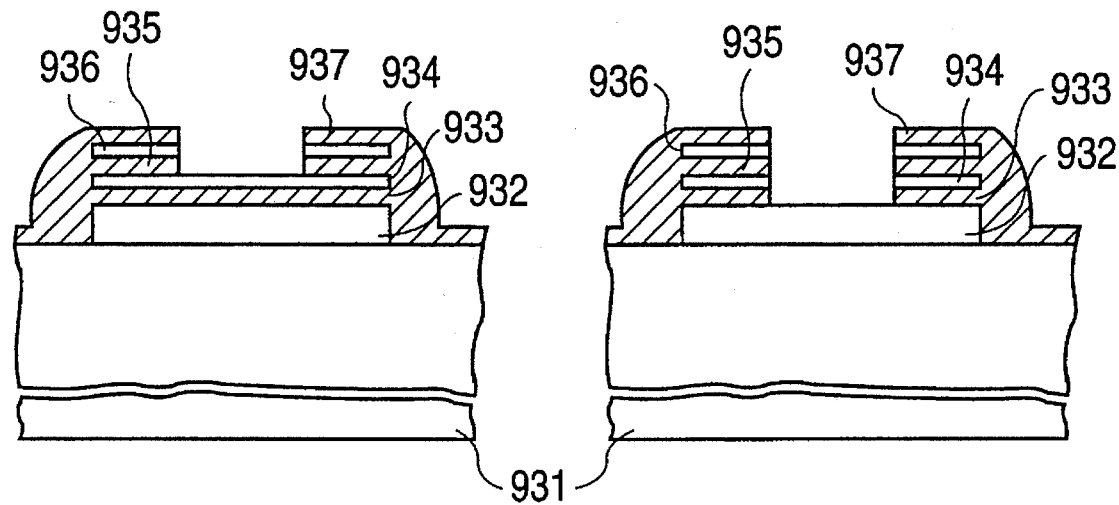

In FIG. 13D, a RIE using $CHF_3/He$ as the etching gas is carried out to etch the second insulator layer 935. However, although this etching is originally intended to etch the second insulator layer 935, the second insulator layer 935 may not exist from the start of this etching, for the reasons described above.

If the second insulator layer 935 is extremely thin or does not even exist at the start of this etching, the second conductor layer 934 and the first insulator layer 933 are etched although this etching is originally intended to etch the second insulator layer 935. When the second conductor layer 934 and the first insulator layer 933 are etched, the surface of the first conductor layer 932 may become exposed by this etching which is originally intended to etch the second insulator layer 935.

Figure 13E:
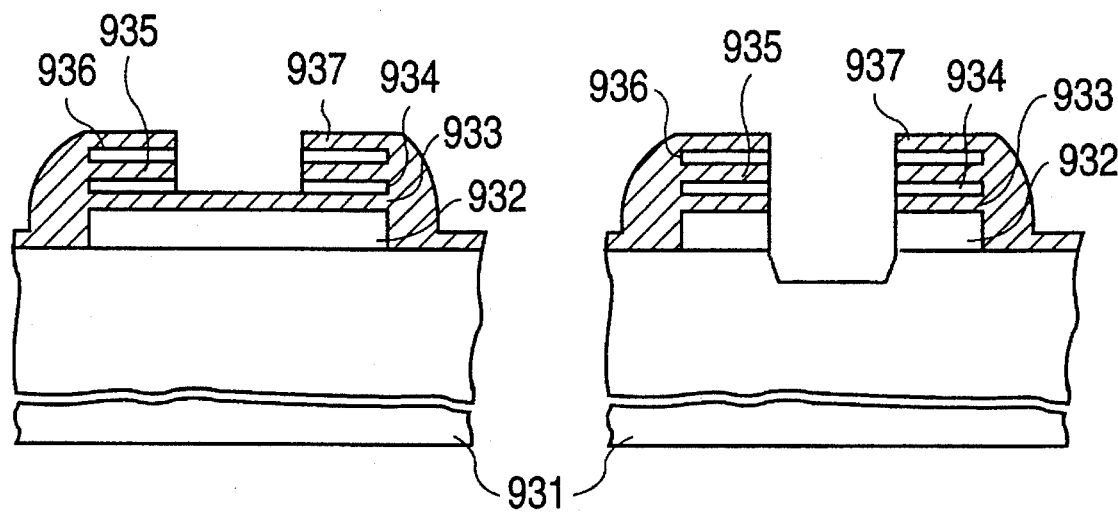

In FIG. 13E, a RIE using $CCl_4/O_2$ as the etching gas is carried out to etch the second conductor layer 934.

However, although this etching is originally intended to etch the second conductor layer 934, the surface of the first conductor layer 932 may already be exposed as described above. In this case, even a part of the Si semiconductor substrate 931 may be etched by this etching which is originally intended to etch the second conductor layer 934.

Figure 13F:
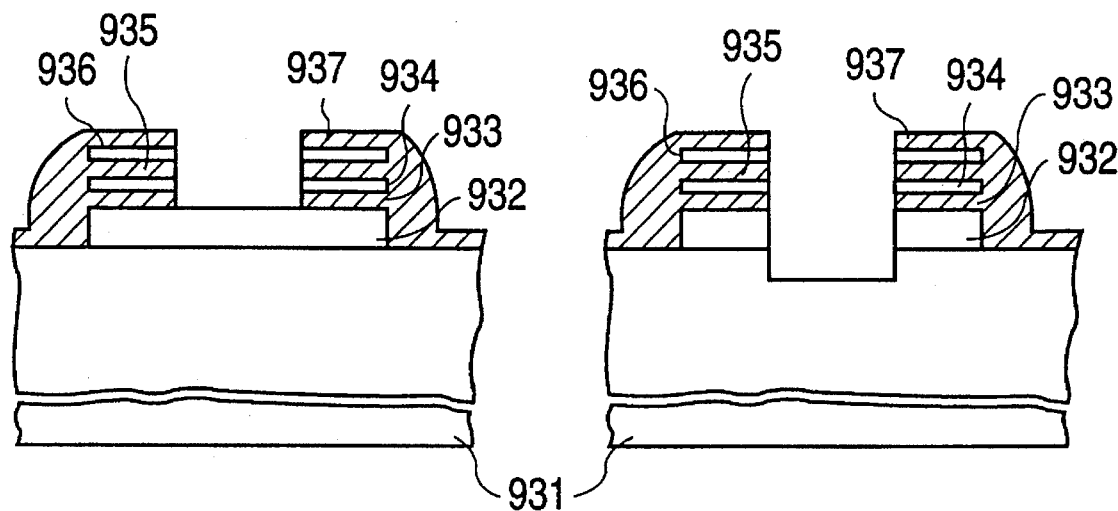

In FIG. 13F, a RIE using $CHF_3/He$ as the etching gas is carried out to etch the first insulator layer 933.

But although this etching is originally intended to etch the first insulator layer 933, a part of the Si semiconductor substrate 931 may already be etched as described above. In this case, the contact hole completely extends into the Si semiconductor substrate 931 as shown in FIG. 13F and the Si semiconductor substrate 931 is extremely damaged.

If the contact hole extends into the Si semiconductor substrate 931 as shown in FIG. 13F, a leak is introduced at a node part between the driver transistor and the load transistor of the memory cell, and the operation of the memory cell becomes unstable. Hence, it is conceivable to carry out a moderate etching so as to etch only the originally intended layer, but such a moderate etching is difficult to control.

The etching of each layer cannot be controlled to etch only the originally intended layer by the moderate etching, because the contact hole is seldom formed at a flat part shown in FIGS. 13A through 13F. In actual practice, the contact hole is usually formed at a stepped part, and an etching residue tends to remain at the stepped part within the contact hole. However, a sufficient over-etching becomes necessary in order to remove such an etching residue.

Next, a description will be given of a fourth embodiment of the semiconductor memory device according to the present invention which is produced by a fourth embodiment of the method of producing the semiconductor memory device according to the present invention. FIGS. 14A through 14F are side views in cross section showing an essential part of the fourth embodiment of the semiconductor memory device according to the present invention at essential stages of the fourth embodiment of the method of producing the semiconductor memory device according to the present invention, for explaining the operating principle of the third embodiment. In each of FIGS. 14A through 14F, the left hand side shows the result of an expected process while the right hand side shows the result of an actual process, and the description will be given mainly with reference to the right hand side of FIGS. 14A through 14F which shows the actual process.

In this embodiment, measures are taken so that the contact hole will not extend into the substrate even when an over-etching is carried out to remove the etching residue within the contact hole.

Figure 14A:
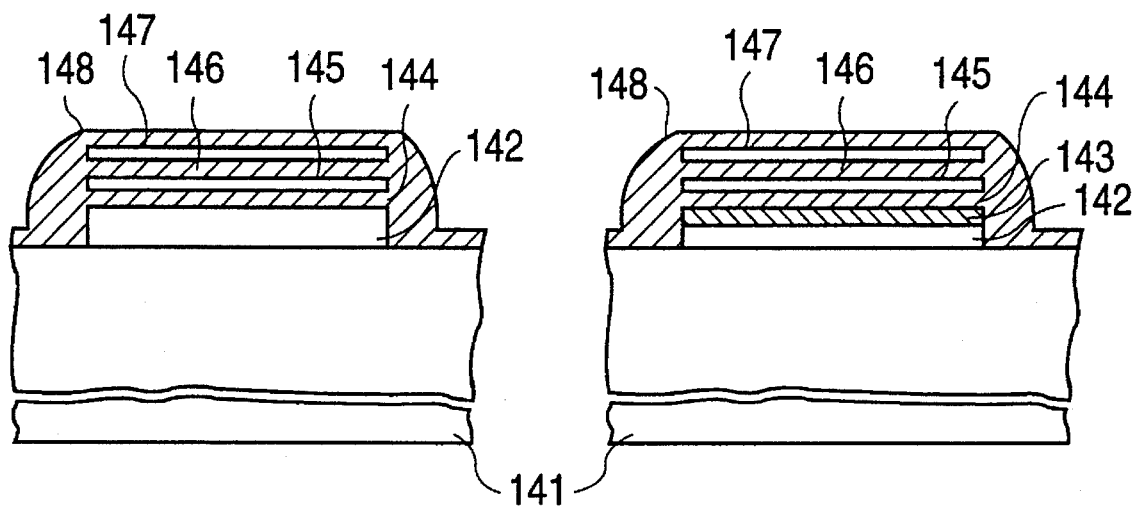
FIGS. 14A through 14F are side views in cross section showing an essential part of a fourth embodiment of the semiconductor memory device according to the present invention at essential stages of a fourth embodiment of the method of producing the semiconductor memory device according to the present invention, for explaining the operating principle of the fourth embodiment.

In FIG. 14A, a first conductor layer 142 made of polysilicon, a second conductor layer 143 made of a refractory metal such as W and Mo or a silicide thereof, a first insulator layer 144 made of $SiO_2$, a third conductor layer 145 made of polysilicon, a second insulator layer 146 made of $SiO_2$, a fourth conductor layer 147 made of polysilicon and a third insulator layer 148 made of $SiO_2$ are successively formed and stacked on a Si semiconductor substrate 141.

Figure 14B:
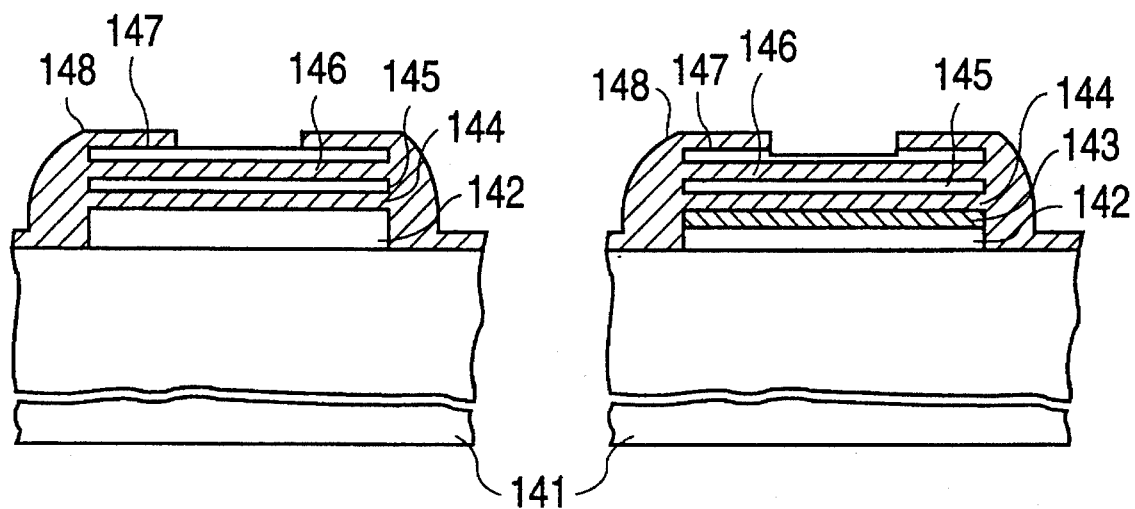

In FIG. 14B, a resist process of the normal photolithography technique and a RIE using $CHF_3/He$ as the etching gas are carried out to etch the third insulator layer 148 and to form a part of a contact hole. In FIG. 14B, the illustration of a photoresist layer is omitted for the sake of convenience. The illustration of the photoresist layer will be omitted similarly in FIGS. 14C through 14F which follow.

During this process, a part of the fourth conductor layer 147 underlying the third insulator layer 148 is also etched. Accordingly, the thickness of the fourth conductor layer 147 remaining after this etching is also extremely small, similarly as in the case described above with reference to FIGS. 13A through 13F.

Figure 14C:
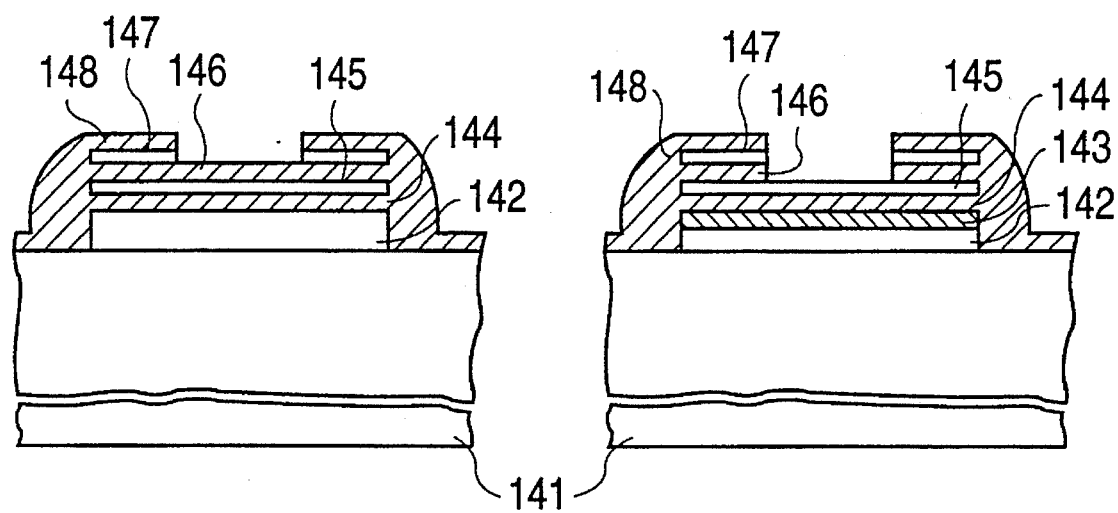

In FIG. 14C, a RIE using HBr/Ar as the etching gas is carried out to etch the fourth conductor layer 147.

In this case, although dependent on the thickness of the second insulator layer 146 underlying the fourth conductor layer 147, the thickness of the second insulator layer 146 would be reduced by this etching. In an extreme case, not only the second insulator layer 146 but also a part of the third conductor layer 145 becomes etched by this etching which is originally intended to etch the fourth conductor layer 147.

Figure 14D:
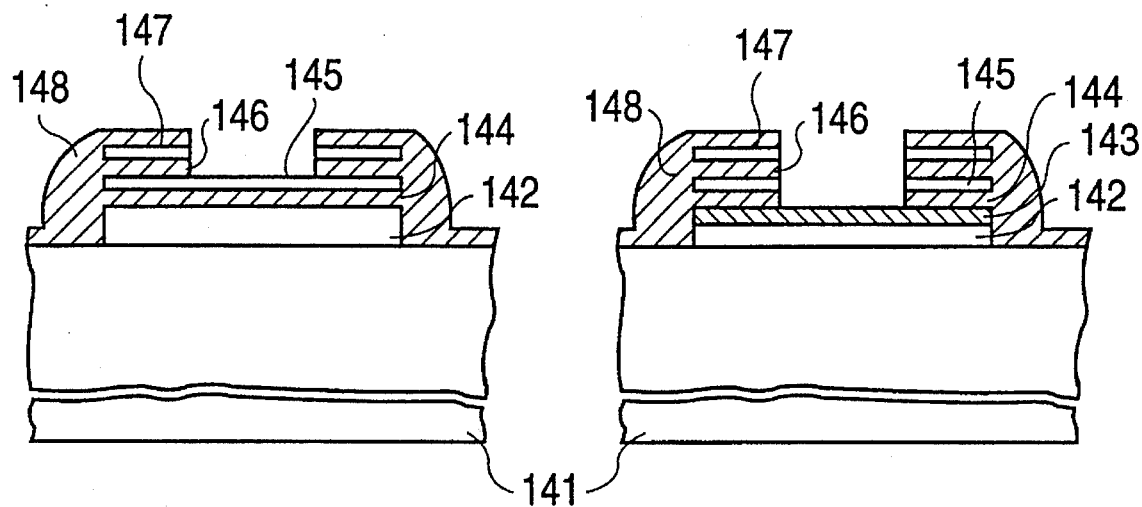

In FIG. 14D, a RIE using $CHF_3/He$ as the etching gas is carried out to etch the second insulator layer 146.

However, the thickness of the second insulator layer 146 is already reduced to start with and may not even exist in an extreme case, as described above. Hence, although this etching is originally intended to etch the second insulator layer 146, the third conductor layer 145 and the first insulator layer 144 may be etched to expose the surface of the second conductor layer 143.

Figure 14E:
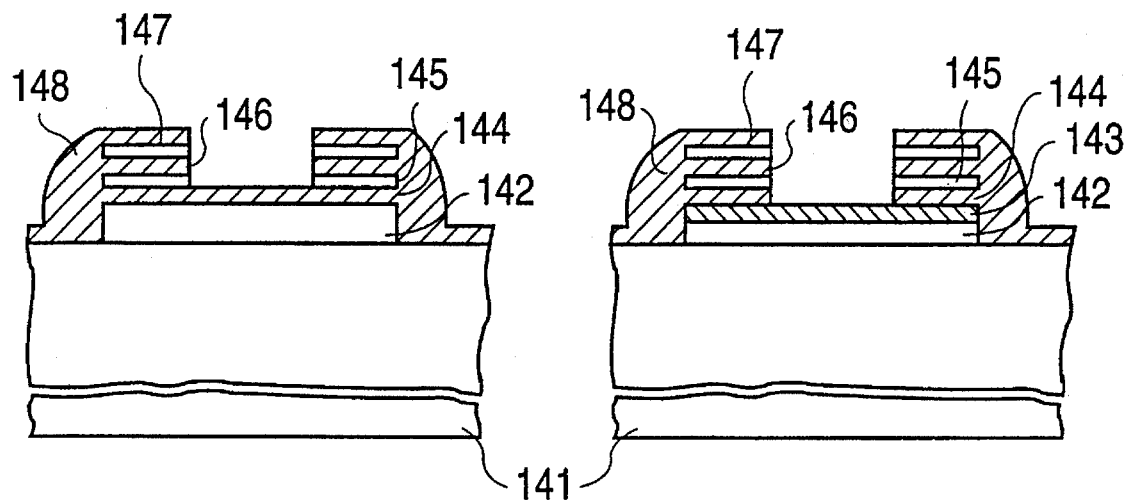

In FIG. 14E, a RIE using HBr/Ar as the etching gas is carried out to etch the third conductor layer 145.

Even though the surface of the second conductor layer 143 may already be exposed as described above when this etching is carried out, the second conductor layer 143 is made of the refractory metal or refractory metal silicide. For this reason, the second conductor layer 143 is hardly etched by this RIE which uses HBr, and no problems will be introduced by this RIE.

Figure 14F:
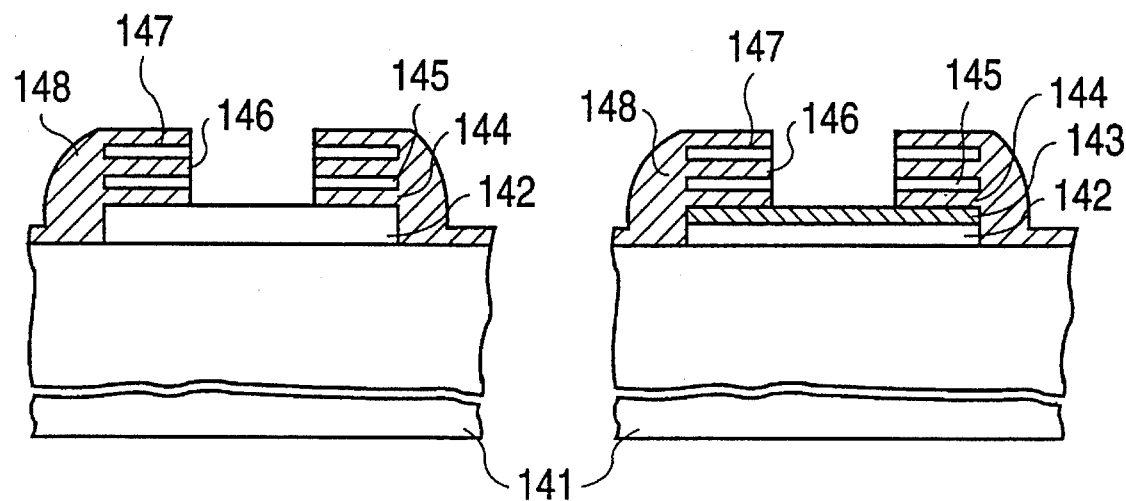

In FIG. 14F, a RIE using $CHF_3/He$ as the etching gas is carried out to etch the first insulator layer 144.

The first insulator layer 144 may already be etched when this etching is started, but no adverse effects are introduced because the second conductor layer 143 is made of the refractory metal or refractory metal silicide and is hardly etched by the $CHF_3/He$ etching gas.

Therefore, the contact hole is formed to an ideal shape. The only difference of the resulting contact hole shown in FIG. 14F with that shown in FIG. 13F is that the lowermost conductor layer in FIG. 14F is made up of the first conductor layer 142 and the second conductor layer 143.

Next, a more detailed description will be given of the fourth embodiment of the semiconductor memory device according to the present invention and the fourth embodiment of the method of producing the semiconductor memory device according to the present invention, by referring to FIGS. 15A through 15H. FIGS. 15A through 15H are side views in cross section showing an essential part of the fourth embodiment of the semiconductor memory device according to the present invention at essential stages of the fourth embodiment of the method of producing the semiconductor memory device according to the present invention. In this embodiment, the present invention is applied to the TFT load type SRAM.

In FIGS. 15A through 15H, those parts which are the same as those corresponding parts in FIGS. 1A through 1F and FIGS. 4A through 4D are designated by the same reference numerals, and a description thereof will be omitted. In this embodiment of the method, the processes are the same as those of the prior art method up to the processes shown in FIGS. 1A through 1F, that is, until the gate insulator layer 3 is selectively etched to form the contact hole 3A. Hence, a description will only be given of the processes carried out thereafter. In the following description, the prior art processes descried with reference to FIGS. 4A through 4D will help the understanding of this embodiment.

Figure 15A:
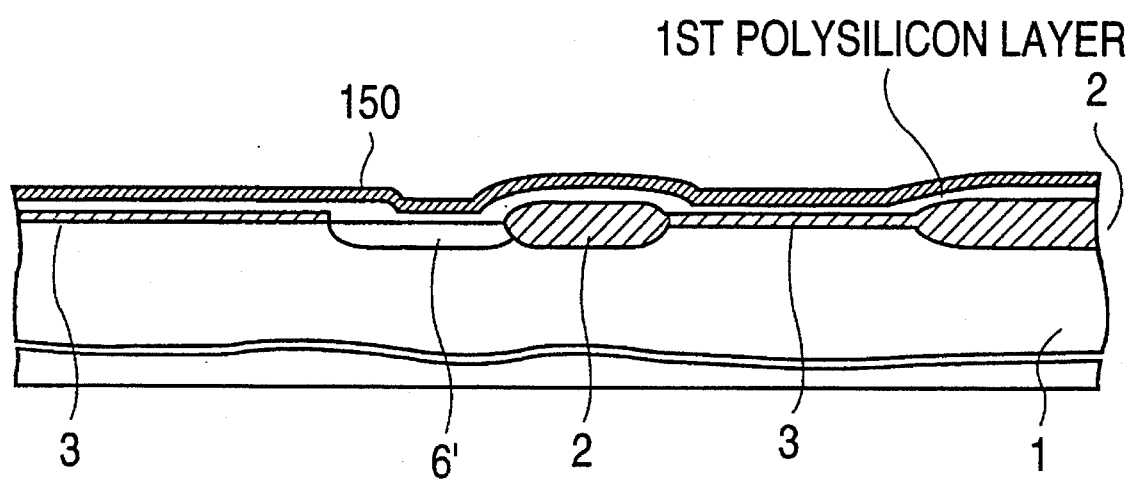
FIGS. 15A through 15H are side views in cross section showing an essential part of the fourth embodiment of the semiconductor memory device according to the present invention at essential stages of the fourth embodiment of the method of producing the semiconductor memory device according to the present invention.

In FIG. 15A, it is assumed that the field insulator layer 2, the gate insulator layer 3 and the contact hole 3A are already formed on the Si semiconductor substrate 1.

A CVD is carried out to form a first polysilicon layer having a thickness of 1000 Å, for example. This first polysilicon layer corresponds to the first conductor layer.

By carrying out a vapor phase diffusion, P is introduced with an impurity concentration of $1\times10^{21}$ cm$^{-3}$ to form an n$^+$-type impurity region 5'.

A CVD is carried out to form a WSi layer 150 having a thickness of 1000 Å, for example. This WSi layer 150 corresponds to the second conductor layer. The material used for the layer 150 is not limited to WSi, but other refractory metals such as W or refractory metal silicides may be used in place of WSi.

Figure 15B:
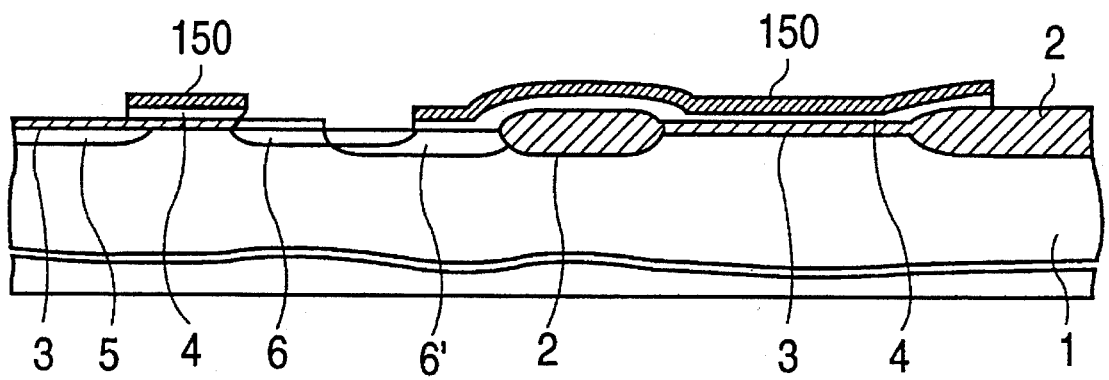

In FIG. 15B, a resist process of the photolithography technique and a RIE using CCl$_4$/O$_2$ as the etching gas for etching WSi and polysilicon are carried out to pattern the WSi layer 150 and the first polysilicon layer and to form a gate electrode 4. This gate electrode 4 is the gate electrode of the driver transistor and the word line.

An ion implantation is carried out to inject As ions with a dosage of $3\times10^{15}$ cm$^{-2}$ and an acceleration energy of 40 keV, so as to form a source region 5 and a drain region 6.

Figure 15C:
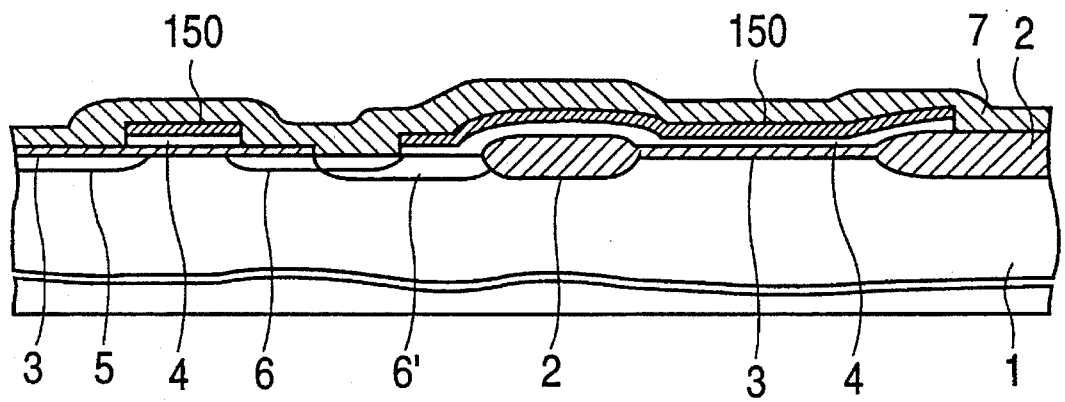

In FIG. 15C, a CVD is carried out to form an insulator layer 7 which is made of SiO$_2$ and has a thickness of 1000 Å, for example.

Figure 2A:
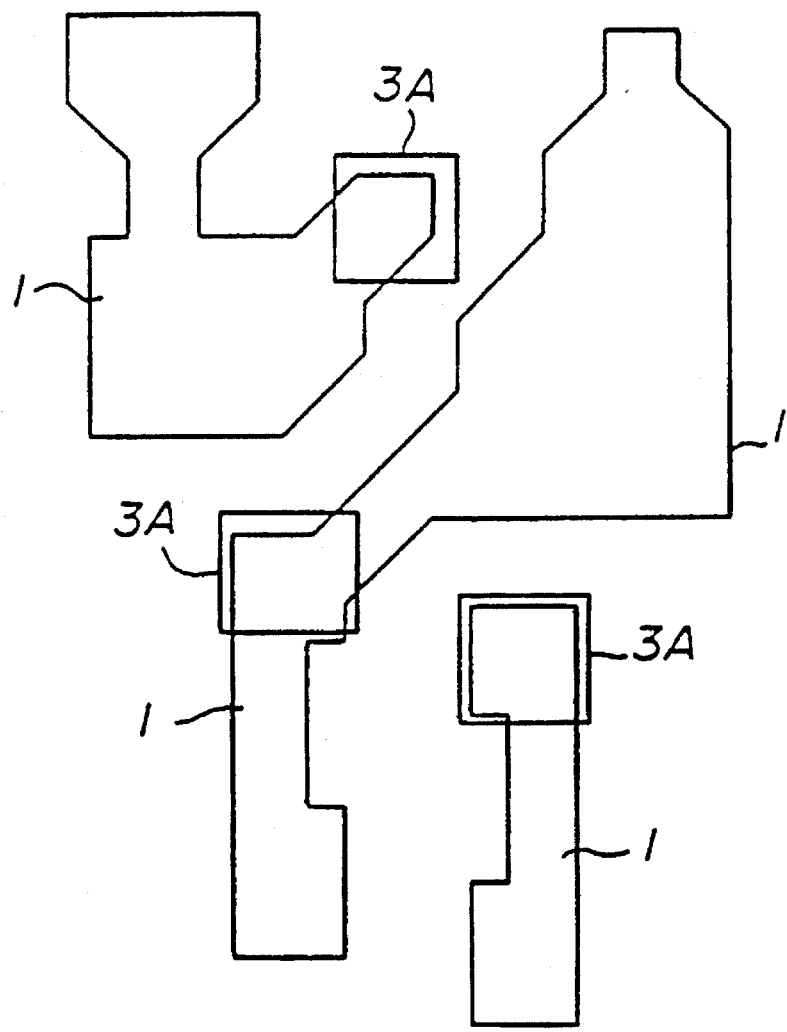
FIGS. 2A through 2F are plan views of the high resistance load type SRAM at essential stages of the conventional method of producing the high resistance load type SRAM.
Figure 2B:
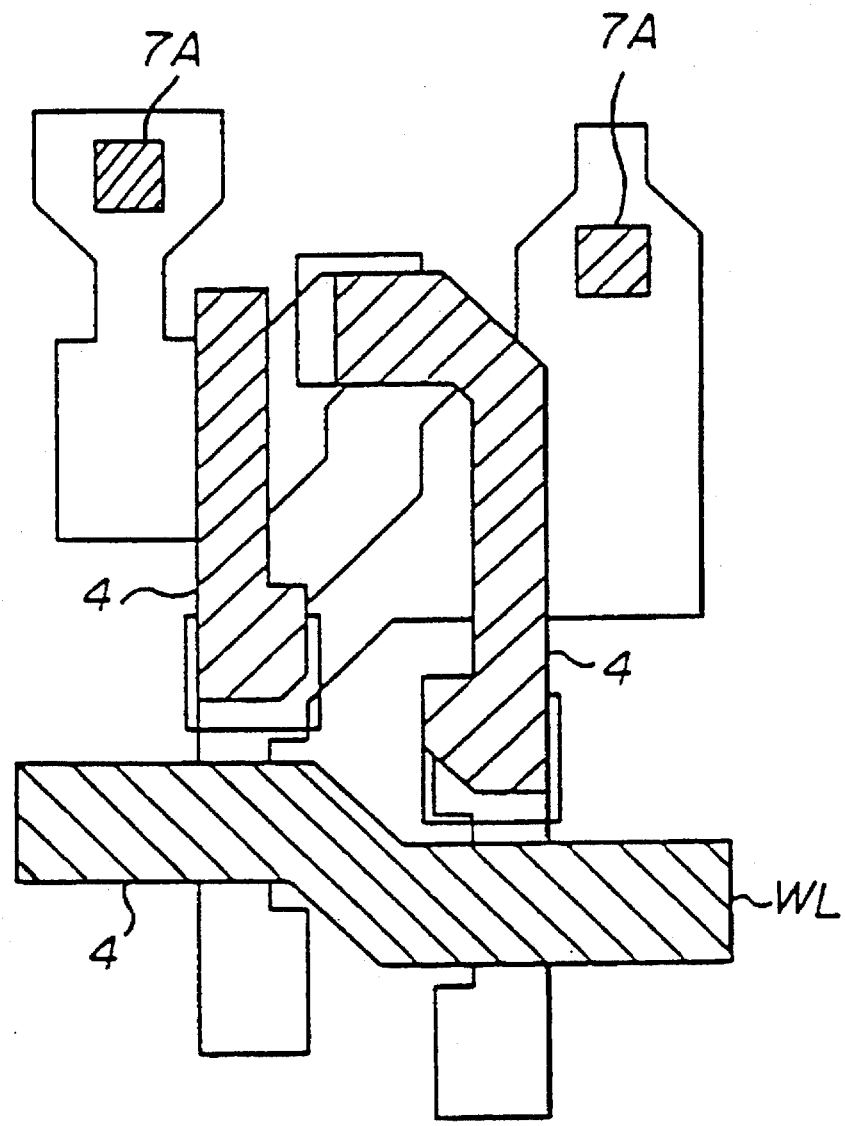
Figure 2C:
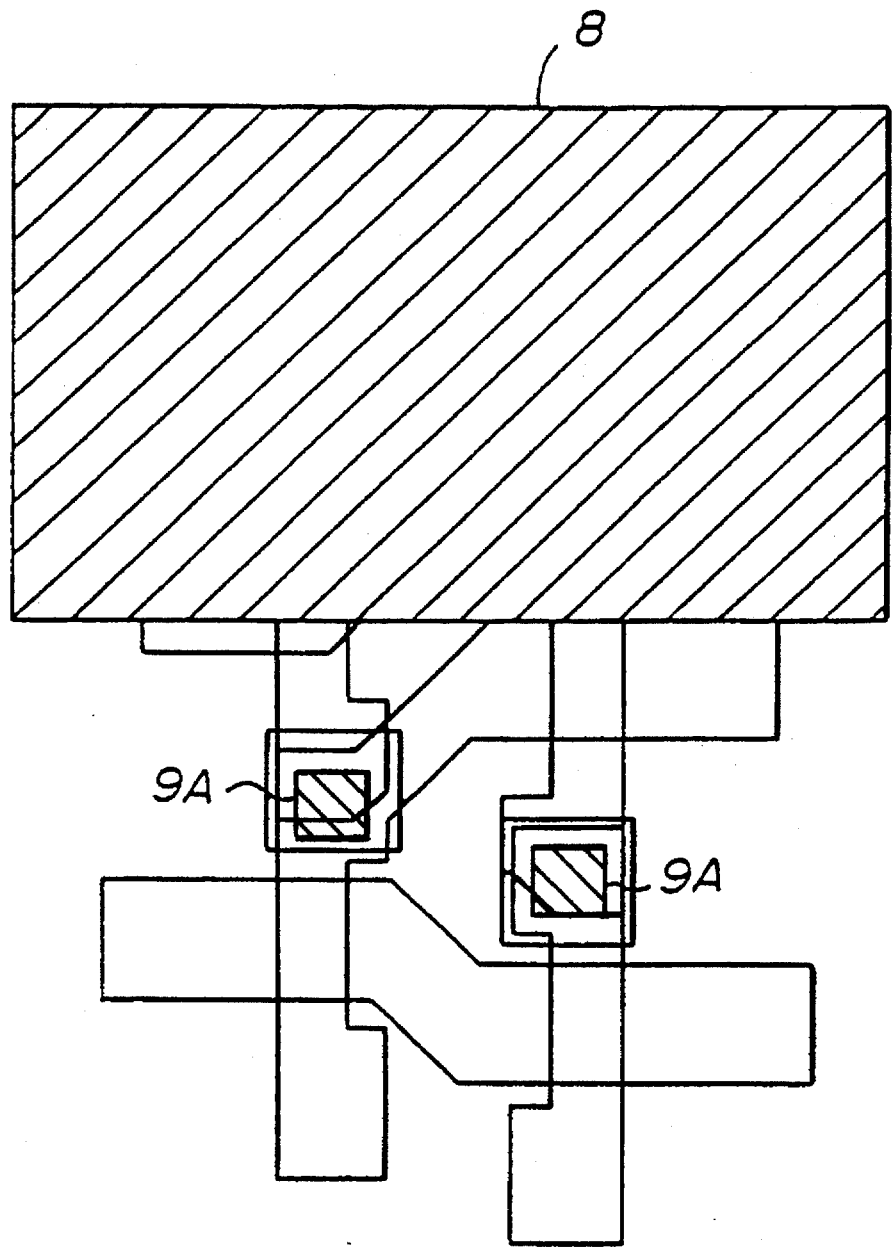
Figure 2D:
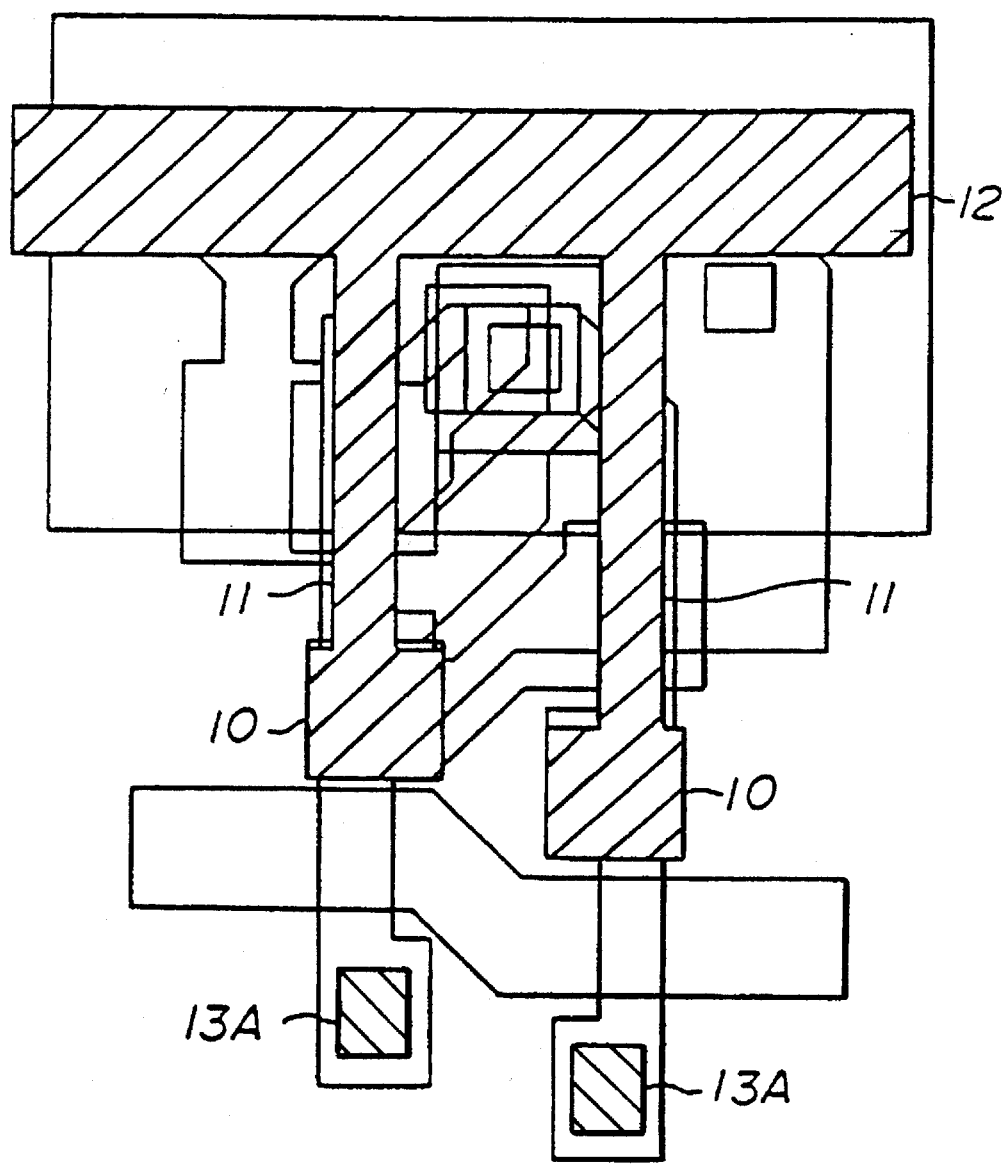
Figure 2E:
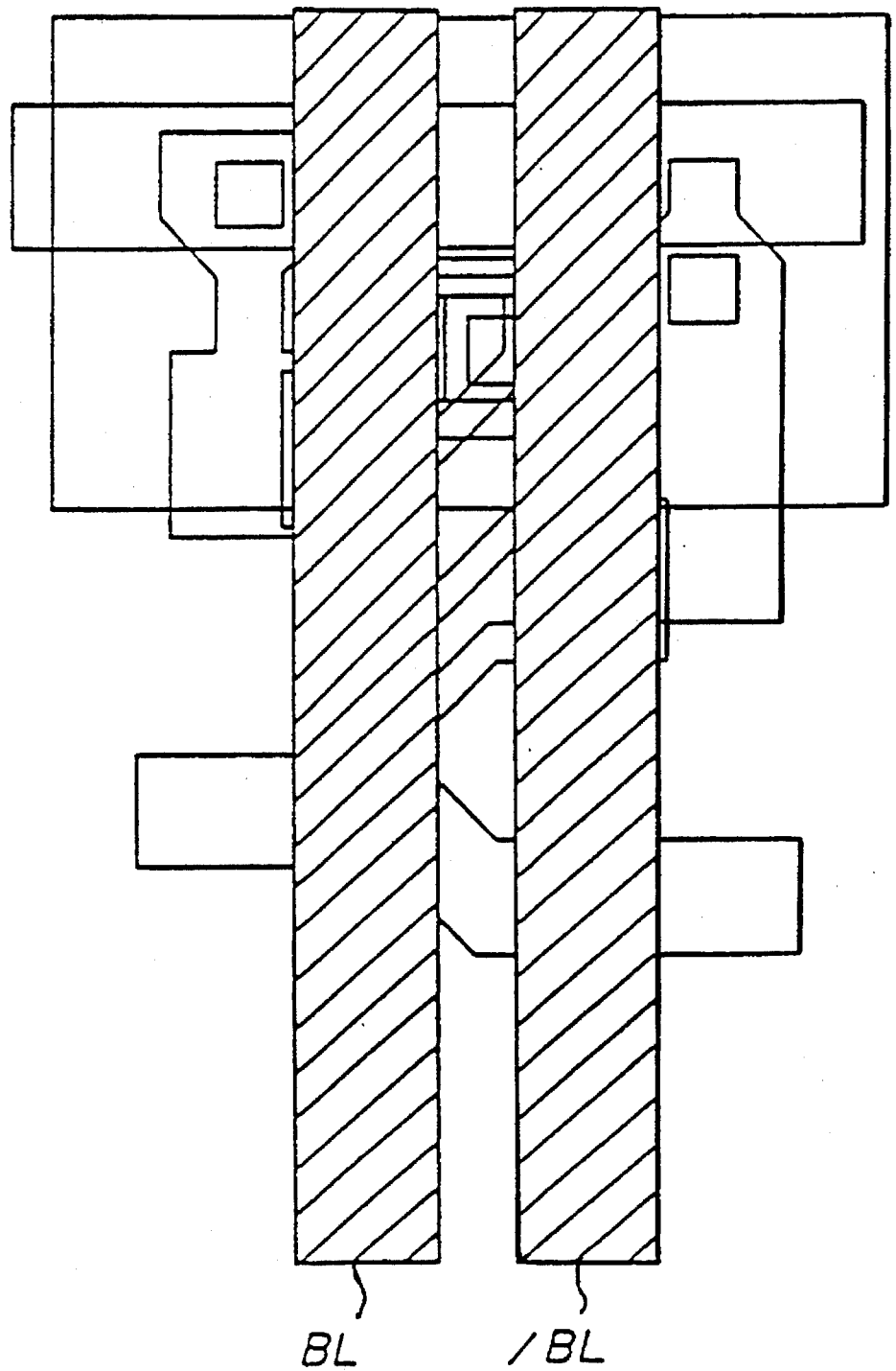

A resist process of the photolithography technique and a RIE using CHF$_3$/He as the etching gas are carried out to form a ground line contact hole. This ground line contact hole cannot be shown in FIG. 15C, but this ground line contact hole may be understood from FIG. 2B, for example.

Figure 15D:
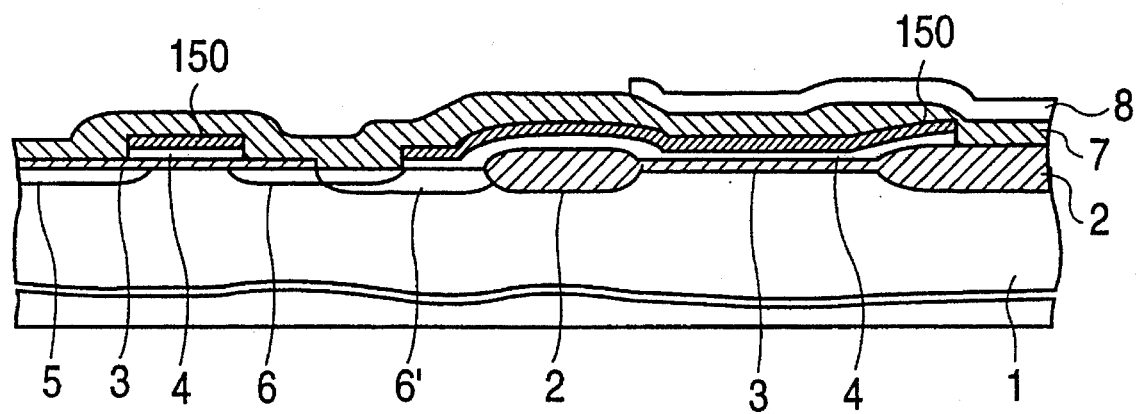

In FIG. 15D, a CVD is carried out to form a second polysilicon layer which has a thickness of 1500 Å, for example.

In addition, an ion implantation is carried out to inject P ions into the second polysilicon layer.

A resist process of the photolithography technique and a RIE using CCl$_4$/O$_2$ as the etching gas are carried out to pattern the second polysilicon layer and to form a ground line 8.

Figure 15E:
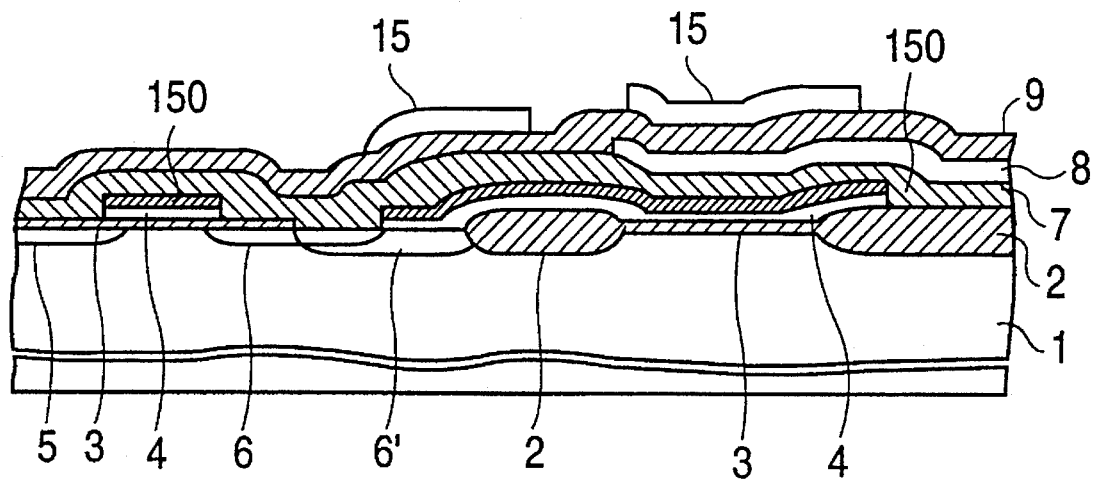

In FIG. 15E, a CVD is carried out to form an insulator layer 9 which is made of SiO$_2$ and has a thickness of 1000 Å, for example, on the entire top surface of the stacked structure shown in FIG. 15D.

A CVD is carried out to form a third polysilicon layer which has a thickness of 500 Å, for example.

An ion implantation is carried out to inject P ions with a dosage of $1\times10^{15}$ cm$^{-2}$ and an acceleration energy of 10 keV.

A resist process of the photolithography technique and a RIE using CCl$_4$/O$_2$ as the etching gas are carried out to pattern the third polysilicon layer and to form a gate electrode 15 of the TFT.

Figure 15F:
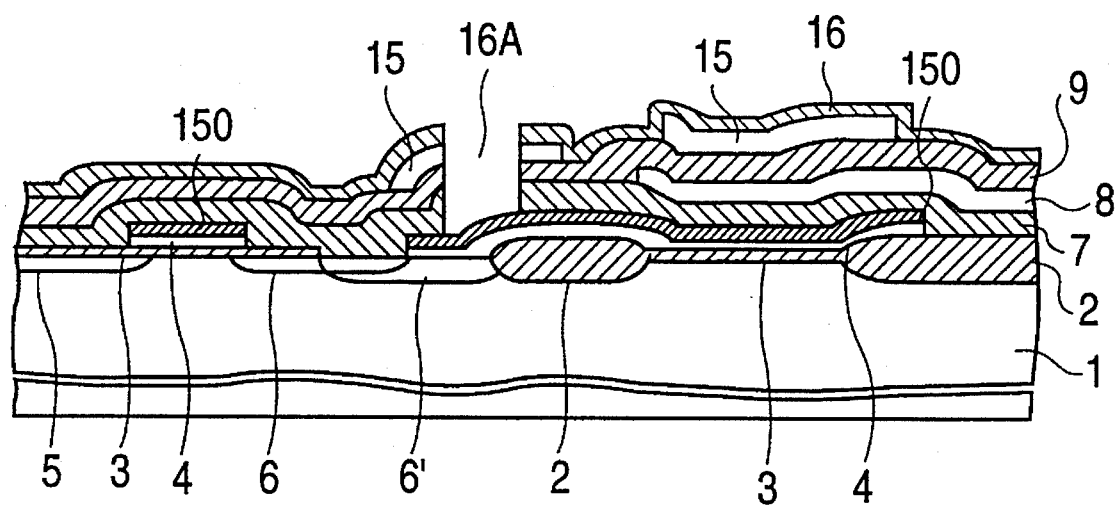

In FIG. 15F, a CVD is carried out to form a gate insulator layer 16 which is made of SiO$_2$ and has a thickness of 200 Å, for example, A resist process of the photolithography technique and RIEs using CHF$_3$/He and HBr/Ar as the etching gases for respectively etching SiO$_2$ and polysilicon are carried out, to selectively etch the gate insulator layer 16, the gate electrode 15 which is made of the third polysilicon layer, the insulator layer 9 and the insulator layer 7, and to form a contact hole 16A. This contact hole 16A extends from the surface of the gate insulator layer 16 and reaches the gate electrode 4 of the driver transistor. This process forms an essential part of this embodiment. Even if a sufficient over-etching is carried out so that no etching residue remains within the contact hole 16A after the etching, no adverse damage is made to the surface of the underlying WSi layer 150 which forms the surface of the gate electrode 4. Hence, no damage is made to the first polysilicon layer and the surface of the Si semiconductor substrate 1 by this over-etching.

Figure 15G:
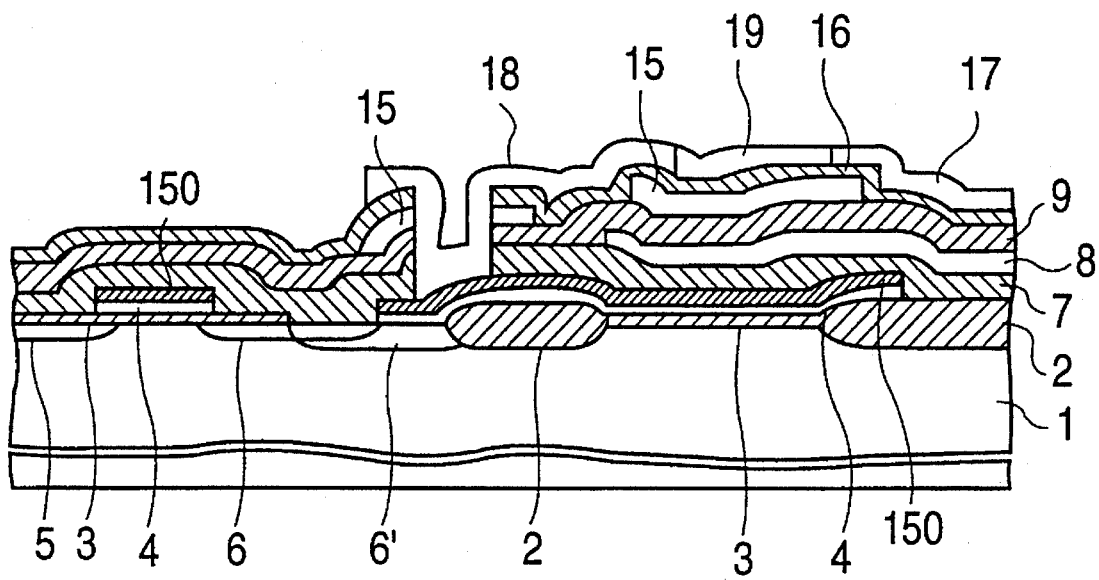

In FIG. 15G, a CVD is carried out to form a fourth polysilicon layer having a thickness of 200 Å, for example.

A resist process of the photolithography technique and an ion implantation are carried out to inject B ions with a dosage of $1\times10^{14}$ cm$^{-2}$ and an acceleration energy of 5 keV into parts where source and drain regions of the TFT are formed.

Figure 2F:
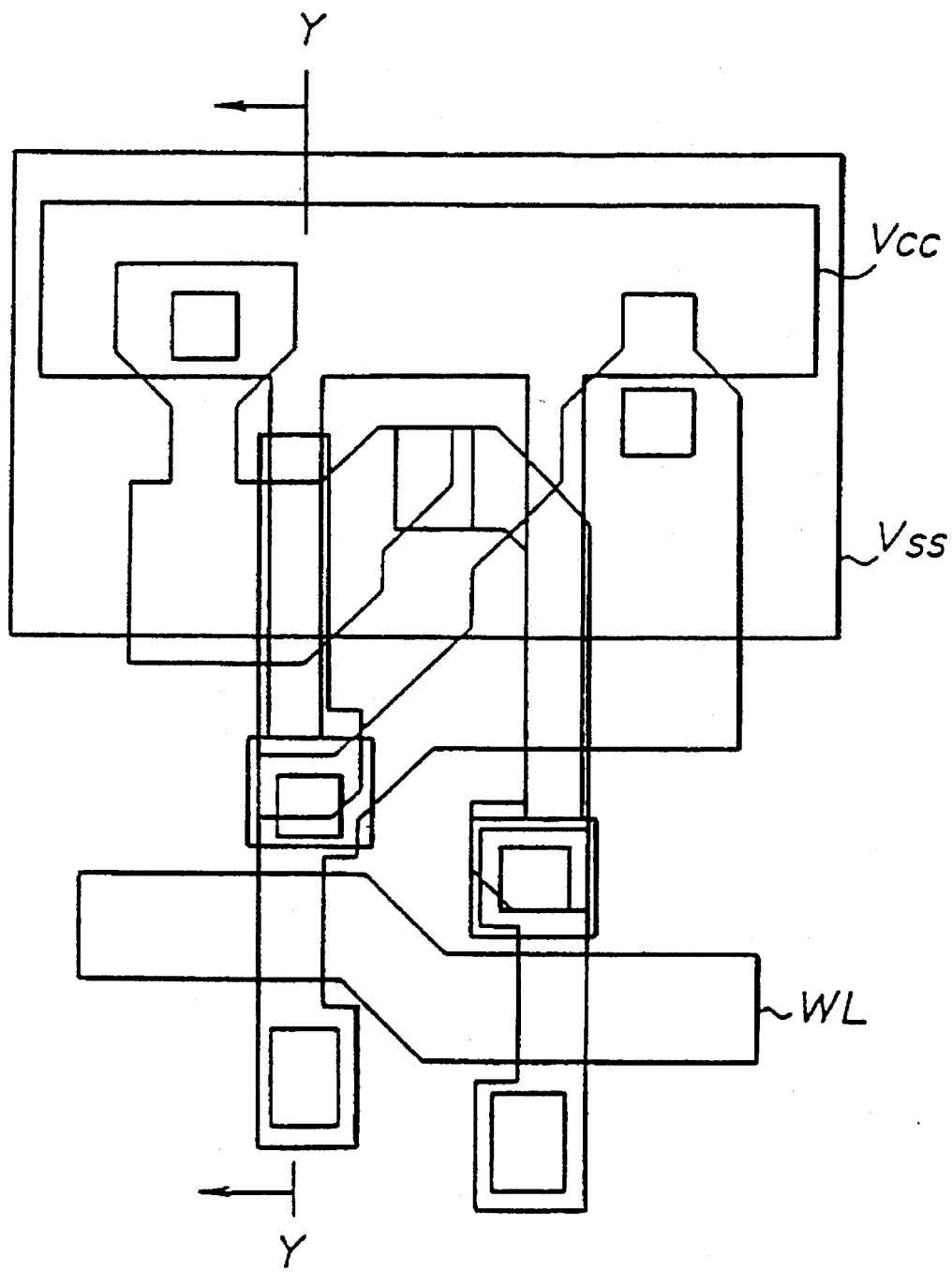
Figure 3:
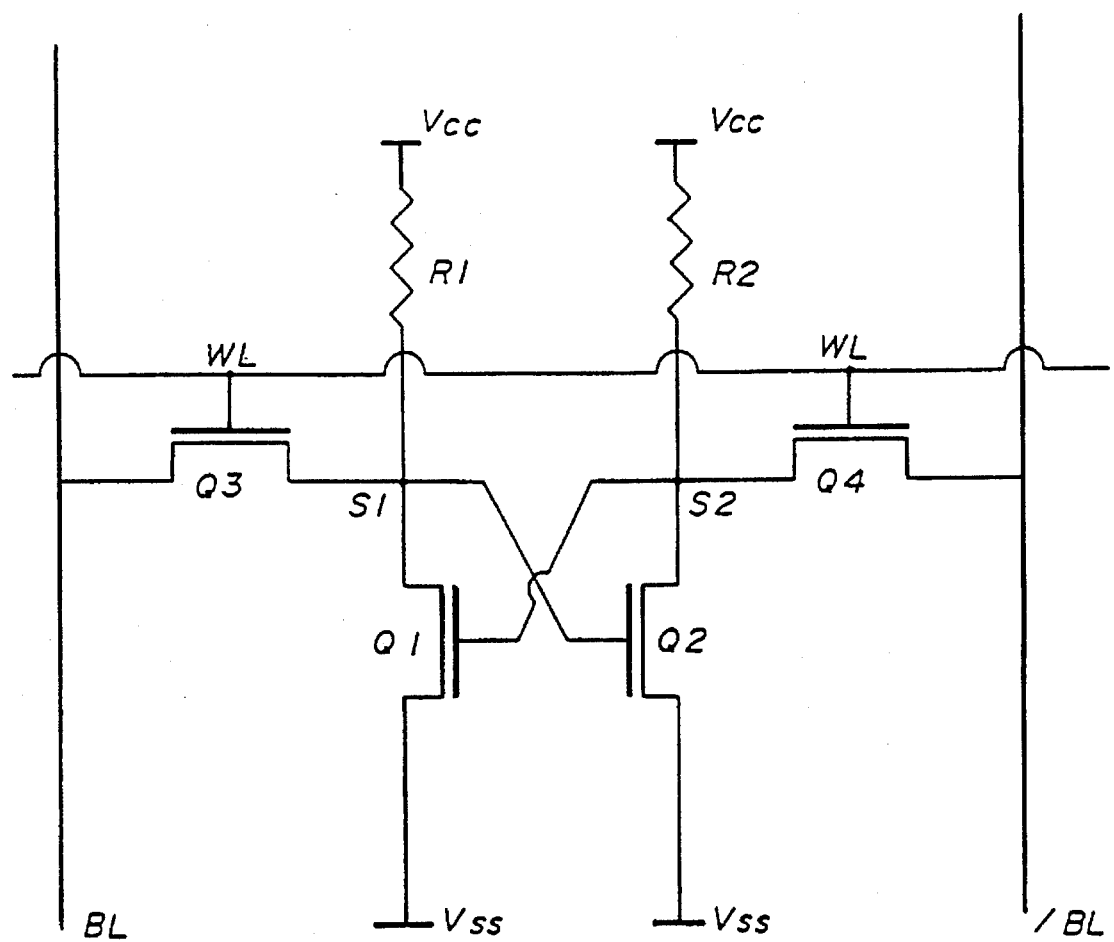
FIG. 3 shows an equivalent circuit diagram of the essential part of the high resistance load type SRAM described in conjunction with FIGS. 1A through 1J and 2A through 2F.

A resist process of the photolithography technique and a RIE using CCl$_4$/O$_2$ as the etching gas are carried out to pattern the fourth polysilicon layer and to form a source region 17, a drain region 18 and a channel region 19 of the TFT, a Vcc supply line and the like. The Vcc supply line cannot be shown in FIG. 15G, but the Vcc supply line may be understood from FIG. 2F or 5D.

Figure 15H:
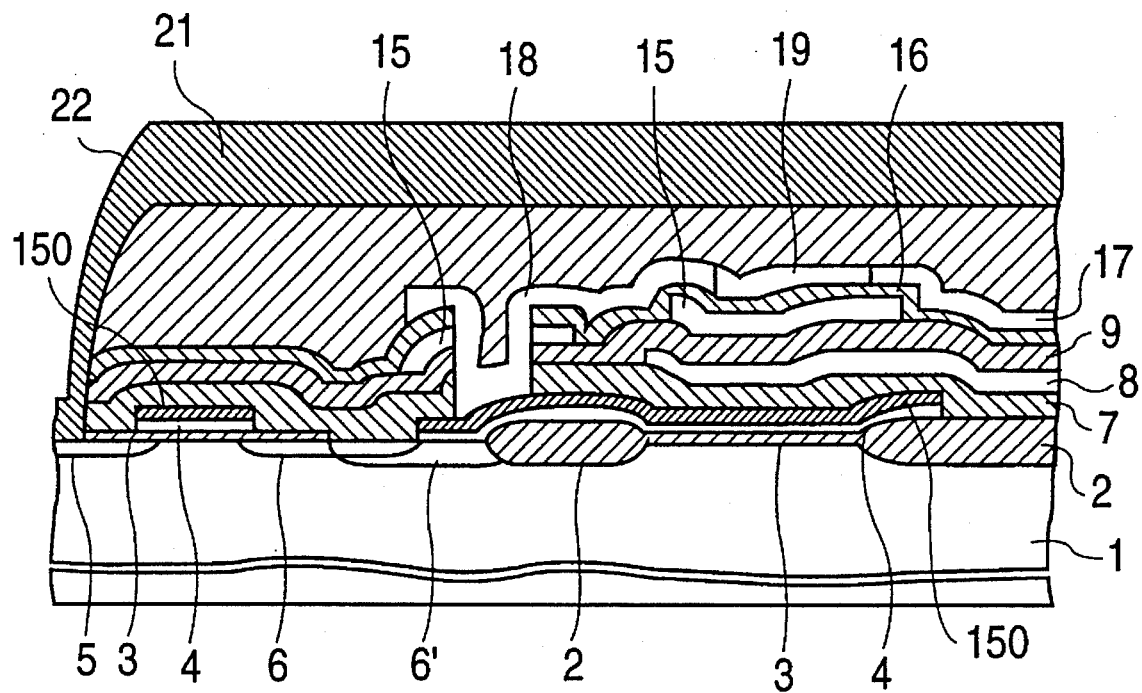

In FIG. 15H, a CVD is carried out to form an insulator layer which is made of SiO$_2$ and has a thickness of 1000 Å, for example, and an insulator layer which is made of PSG and has a thickness of 5000 Å. In FIG. 15H, these two insulator layers are shown as one insulator layer 21 in FIG. 15H, similarly as in the case of FIG. 4D.

Then, a thermal process is carried out to reflow and planarize the insulator layer 21.

A resist process of the photolithography technique and a RIE using CHF$_3$/He as the etching gas are carried out to selectively etch the insulator layer 21 and to form a bit line contact hole.

A sputtering is carried out thereafter to form an Al layer having a thickness of 1 μm, for example, and this Al layer is patterned using the normal photolithography technique so as to form a bit line 22.

According to this embodiment described with reference to FIGS. 15A through 15H in particular, only one mask process is required to achieve contact of the gate electrode of the driver transistor, the gate electrode of the TFT load and the drain of the TFT load. In addition, when forming the contact hole for achieving this contact, there is no possibility of the underlayer and the substrate from becoming damaged and the characteristic of the memory cell from deteriorating even when the over-etching is carried out to generate no etching residue within the contact hole. On the other hand, in the prior art shown in FIGS. 4 and 5, two mask processes are required to achieve the above described contact.

Next, a description will be given of a fifth embodiment of the semiconductor memory device according to the present invention and a fifth embodiment of the method of producing the semiconductor memory device according to the present invention, by referring to FIGS. 16A through 16D. FIGS. 16A through 16D are side views in cross section showing an essential part of the fifth embodiment of the semiconductor memory device according to the present invention at essential stages of the fifth embodiment of the method of producing the semiconductor memory device according to the present invention. In this embodiment, the present invention is applied to the double gate structure TFT load type SRAM.

In FIGS. 16A through 16D, those parts which are the same as those corresponding parts in FIGS. 15A through 15H are designated by the same reference numerals, and a description thereof will be omitted. In this embodiment of the method, the processes are the same as those of the fourth embodiment of the method up to the processes shown in FIGS. 15A through 15E, that is, until the gate electrode 15 of the TFT is formed from the third polysilicon layer. Hence, a description will only be given of the processes carried out thereafter. In the following description, the prior art processes descried with reference to FIGS. 7A through 7C will help the understanding of this embodiment.

Figure 16A:
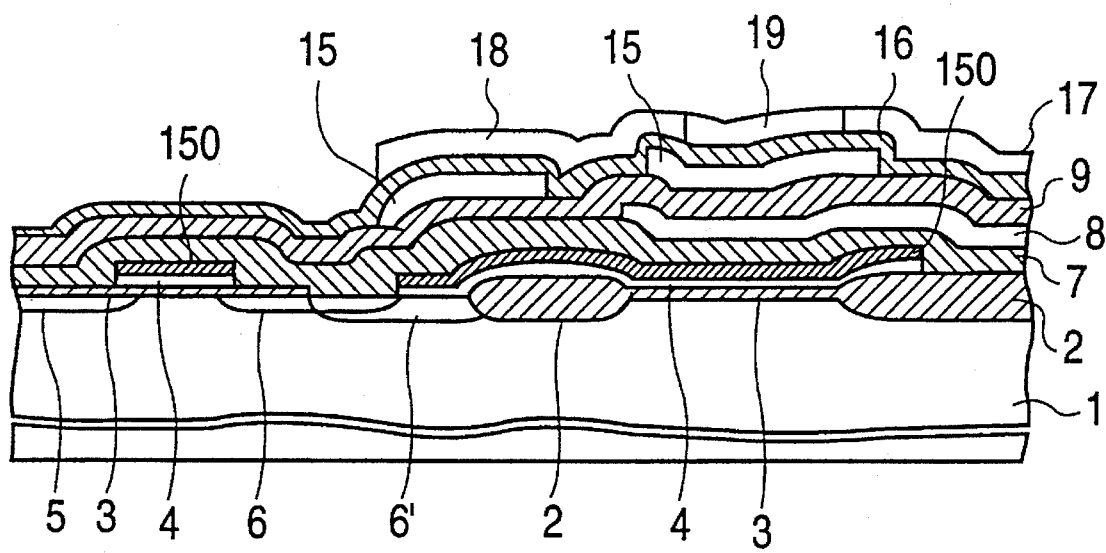
FIGS. 16A through 16D are side views in cross section showing an essential part of a fifth embodiment of the semiconductor memory device according to the present invention at essential stages of a fifth embodiment of the method of producing the semiconductor memory device according to the present invention.

In FIG. 16A, a double gate structure TFT load type SRAM includes a Si semiconductor substrate 1, a field insulator layer 2 formed on the Si semiconductor substrate 1, a gate insulator layer 3, a gate electrode 4 of the driver transistor which is made up of the first polysilicon layer and a WSi layer 150 (second conductor layer), an $n^+$-type source region 5, an $n^+$-type drain region 6, an $n^+$-type diffusion region 6', an insulator layer 7, a ground line 8 which is made up of the second polysilicon layer, a lower gate electrode 15 of the TFT, and a gate insulator layer 16 of the TFT.

A CVD is carried out to form a fourth polysilicon layer which has a thickness of 200 Å, for example.

A resist process of the photolithography technique and an ion implantation are carried out to inject B ions with a dosage of $1 \times 10^{14}$ cm$^{-2}$ and an acceleration energy of 5 keV into parts where source and drain regions of the TFT are formed.

A resist process of the photolithography technique and a RIE using $CCl_4/O_2$ as the etching gas are carried out to pattern the fourth polysilicon layer and to form a source region 17, a drain region 18 and a channel region 19 of the TFT and a Vcc supply line. The Vcc supply cannot be seen in FIG. 13A.

Figure 16B:
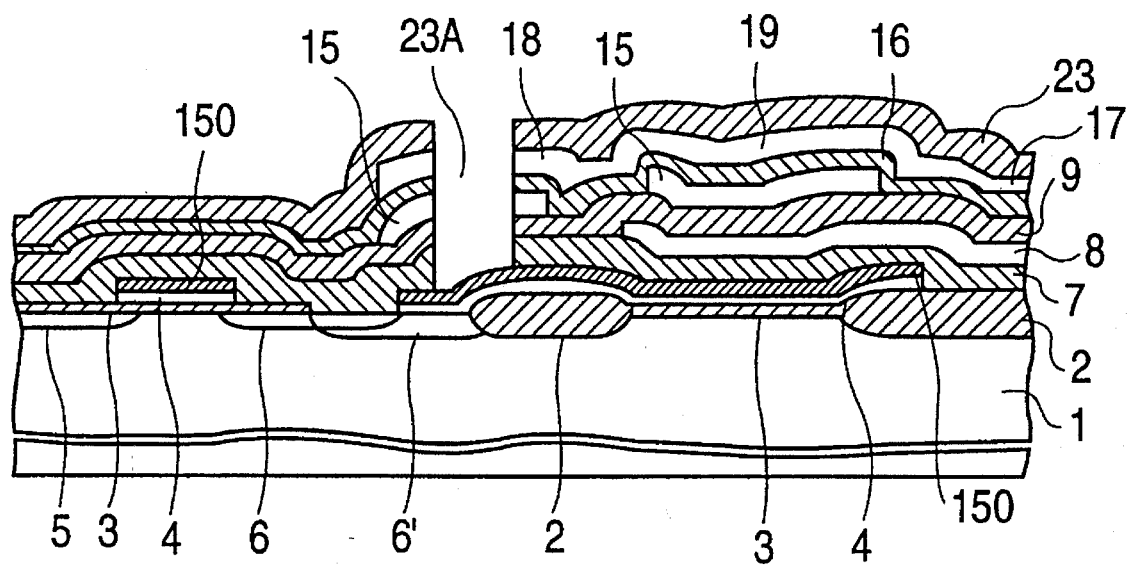

In FIG. 16B, a CVD is carried out to form an insulator layer 23 which is made of $SiO_2$ and has a thickness of 500 Å, for example.

A resist process of the photolithography technique and RIEs using $CHF_3/He$ and HBr/Ar as the etching gases for respectively etching $SiO_2$ and polysilicon are carried out to selectively etch the insulator layer 23, the drain region 18 of the TFT formed from the fourth polysilicon layer, the gate insulator layer 16, the gate electrode 15 which is formed from the third polysilicon layer, the insulator layer 9 and the insulator layer 7, and to form a contact hole 23A. This contact hole 23A extends from the surface of the insulator layer 23 and reaches the gate electrode 4 of the driver transistor. The gate electrode 4 is made up of the WSi layer 150 and the first polysilicon layer. This process forms an essential part of this embodiment.

Figure 16C:
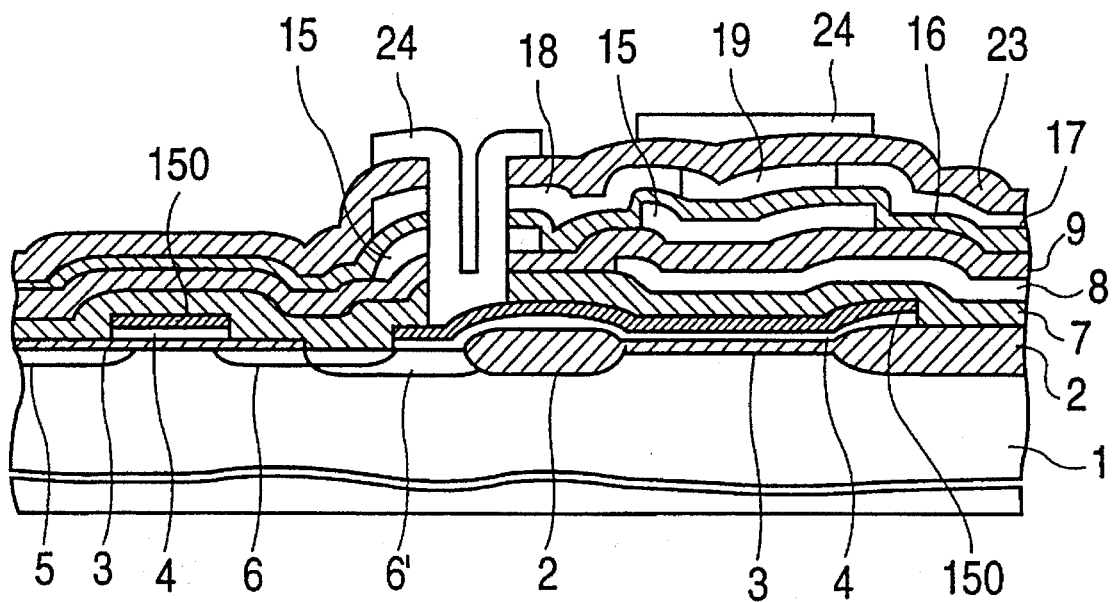

In FIG. 16C, a CVD is carried out to form a fifth polysilicon layer which has a thickness of 500 Å, for example.

Then, a thermal diffusion is carried out to diffuse P into the fifth polysilicon layer with an impurity concentration of $1 \times 10^{21}$ cm$^{-3}$ for example A resist process of the photolithography technique and a RIE using $CCl_4/O_2$ as the etching gas are carried out to pattern the fifth polysilicon layer and to form an upper gate electrode 24 of the TFT.

Figure 16D:
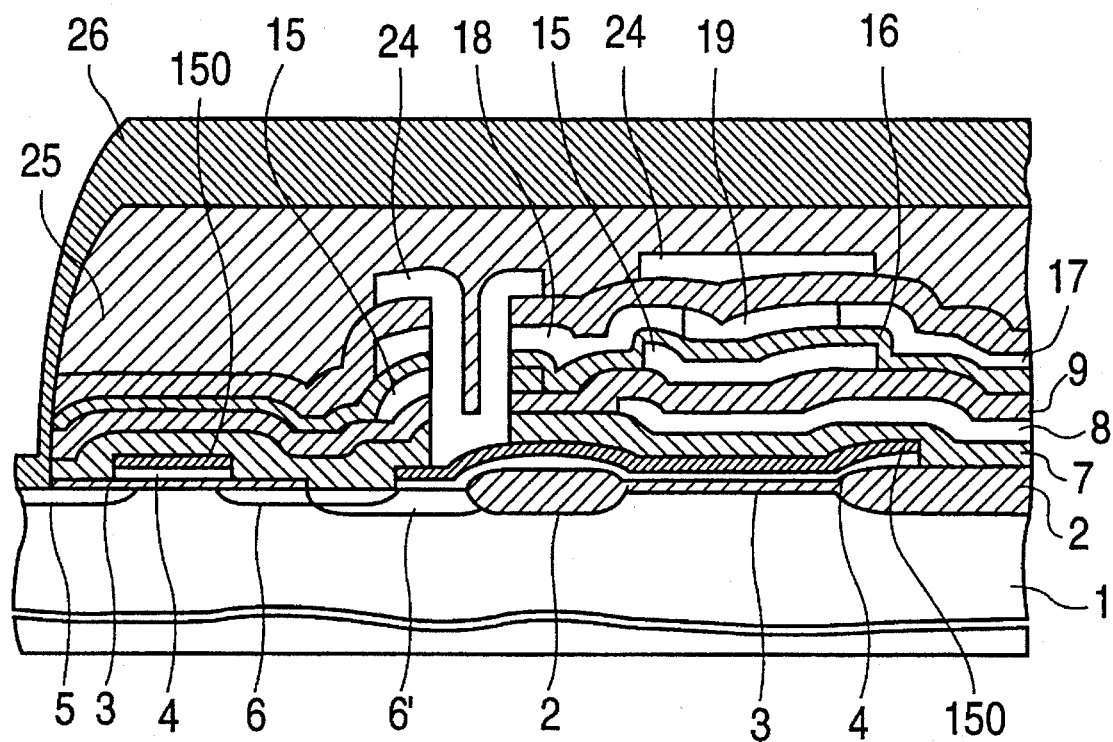

In FIG. 16D, a CVD is carried out to form an insulator layer which is made of $SiO_2$ and has a thickness of 1000 Å, for example, and an insulator layer which is made of PSG and has a thickness of 5000 Å, for example. In FIG. 16D, these two insulator layers are shown as one insulator layer 25.

Thereafter, a thermal process is carried out to reflow and planarize the insulator layer 25.

A resist process of the photolithography technique and a RIE using $CHF_3/He$ as the etching gas are carried out to selectively etch the insulator layer 25 and the like and to form a bit line contact hole.

Next, a sputtering is carried out to form an Al layer having a thickness of 1 μm, for example, and this Al layer is patterned using the normal photolithography technique so as to form a bit line 26.

In this embodiment, the concept shown in FIGS. 14A through 14F is applied to the double gate structure TFT load type SRAM. When forming the contact hole for achieving the necessary contact, there is no possibility of the underlayer and the substrate from becoming damaged and the characteristic of the memory cell from deteriorating even when the over-etching is carried out to generate no etching residue within the contact hole. Compared to the prior art method described with reference to FIGS. 7A through 7C, the number of mask processes which are required to achieve the above described contact in this embodiment is reduced by two.

From the fourth and fifth embodiments described above, it is apparent to those skilled in the art that the concept of the fourth embodiment may be applied to each of the first through third embodiments described above. In other words, the ideal shape of the contact hole can be guaranteed by providing the conductor layer which is made of the refractory metal or refractory metal silicide.

Further, the present invention is not limited to these embodiments, but various variations and modifications may be made without departing from the scope of the present invention.

What is claimed is:

1. A semiconductor memory device comprising:

a semiconductor substrate; and a memory cell formed on the semiconductor substrate and including two transfer transistors, two driver transistors and two thin film transistor loads, said thin film transistor loads including a first gate electrode, a first insulator layer formed on the first gate electrode, a semiconductor layer formed on the first insulator layer, a second insulator layer thicker than said first insulator layer formed on the semiconductor layer, and a shield electrode formed on the second insulator layer, said shield electrode shielding the thin film transistor loads and being out of direct electrical connection with said first gate electrode and said semiconductor substrate, wherein the thin film transistor loads further include a channel region formed in the semiconductor layer, and the shield electrode has a pattern identical to that of the semiconductor layer where the channel region is formed.

2. The semiconductor memory device as claimed in claim 1, wherein the shield electrode receives a positive power source voltage which corresponds to one of data values to be stored in the memory cell.

3. The semiconductor memory device as claimed in claim 1, wherein the driver transistors include a second gate electrode formed on the semiconductor substrate, a third insulator layer formed on the second gate electrode, and a contact hole which extends from a top surface of the third insulator layer and reaches a top surface of the second gate electrode, said first gate electrode of the thin film transistor loads making contact with the top surface of the second gate electrode within the contact hole, said shield electrode being out of direct electrical connection with said second gate electrode.

4. The semiconductor memory device as claimed in claim 3, wherein the thin film transistor loads further include a hole formed in the first insulator layer above the contact hole, and the semiconductor layer makes contact with the first gate electrode via the hole in the first insulator layer.

5. The semiconductor memory device as claimed in claim 3, wherein the second gate electrode of the driver transistors includes a first conductor layer formed on the semiconductor substrate, and a second conductor layer formed on the first conductor layer and having the top surface exposed within the contact hole, said second conductor layer being made of a material selected from a group consisting of refractory metals and refractory metal silicides.

6. A semiconductor memory device as set forth in claim 1 wherein said shield electrode shields said driver transistors.

7. A semiconductor memory device comprising:

a semiconductor substrate; and a memory cell formed on the semiconductor substrate and including two transfer transistors, two driver transistors and two thin film transistor loads, said thin film transistor loads including a first gate electrode, a first insulator layer formed on the first gate electrode, a semiconductor layer formed on the first insulator layer, a second insulator layer thicker than said first insulator layer formed on the semiconductor layer, and a shield electrode formed on the second insulator layer, said shield electrode shielding the thin film transistor loads and being out of direct electrical connection with said first gate electrode and said semiconductor substrate, wherein the driver transistors include a second gate electrode formed on the semiconductor substrate, and a third insulator layer formed on the second gate electrode, and the thin film transistor loads further include a contact hole which extends from a top surface of the first insulator layer and reaches a top surface of the second gate electrode, said semiconductor layer of the thin film transistor loads making contact with the top surface of the second gate electrode and with a side surface of the first gate electrode within the contact hole, said shield electrode being out of direct electrical connection with said second gate electrode.

8. The semiconductor memory device as claimed in claim 7, wherein the thin film transistor load includes a channel region formed in the semiconductor layer, and the shield electrode has a pattern identical to that of the semiconductor layer which forms the channel region.

9. The semiconductor memory device as claimed in claim 7, which further comprises:

a fourth insulator layer formed on the shield electrode; and a ground line formed on the fourth insulator layer above the shield electrode.

10. The semiconductor memory device as claimed in claim 7, wherein the second gate electrode of the driver transistor includes a first conductor layer formed on the semiconductor substrate, and a second conductor layer formed on the first conductor layer and having the top surface exposed within the contact hole, said second conductor layer being made of a material selected from a group consisting of refractory metals and refractory metal silicides.

* * * * *

UNITED STATES PATENT AND TRADEMARK OFFICE
CERTIFICATE OF CORRECTION

PATENT NO. : 5,594,267
DATED : January 14, 1997
INVENTOR(S) : Ema et al.

It is certified that error appears in the above-indentified patent and that said Letters Patent is hereby corrected as shown below:

Column 1, line 31, delete "SHAM" and substitute --SRAM--.

Column 13, line 16, after "certain", delete ".".

Column 19, line 67, after "example", insert --.--.

Signed and Sealed this

Thirteenth Day of May, 1997

*Attest:*

BRUCE LEHMAN

*Attesting Officer*  Commissioner of Patents and Trademarks